US011800787B2

(12) United States Patent
Koenen et al.

(10) Patent No.: US 11,800,787 B2
(45) Date of Patent: Oct. 24, 2023

(54) METAL COMPLEXES

(71) Applicant: UDC IRELAND LIMITED, Ballycoolin (IE)

(72) Inventors: Nils Koenen, Darmstadt (DE); Anna Hayer, Darmstadt (DE); Holger Heil, Frankfurt am Main (DE); Philipp Stoessel, Frankfurt am Main (DE)

(73) Assignee: UDC IRELAND LIMITED, Ballycoolin (IE)

( * ) Notice: Subject to any disclaimer, the term of this patent is extended or adjusted under 35 U.S.C. 154(b) by 786 days.

(21) Appl. No.: 15/321,857

(22) PCT Filed: Jun. 3, 2015

(86) PCT No.: PCT/EP2015/001126

§ 371 (c)(1),
(2) Date: Dec. 23, 2016

(87) PCT Pub. No.: WO2016/000803

PCT Pub. Date: Jan. 7, 2016

(65) Prior Publication Data

US 2017/0141329 A1 May 18, 2017

(30) Foreign Application Priority Data

Jun. 30, 2014 (EP) .................................... 14002238

(51) Int. Cl.

| | |
|---|---|
| *H10K 85/30* | (2023.01) |
| *C07F 15/00* | (2006.01) |
| *C09K 11/06* | (2006.01) |
| *H10K 50/11* | (2023.01) |
| *H10K 101/10* | (2023.01) |

(52) U.S. Cl.

CPC ....... *H10K 85/342* (2023.02); *C07F 15/0033* (2013.01); *C09K 11/06* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *C09K 2211/1088* (2013.01); *C09K 2211/185* (2013.01); *H10K 50/11* (2023.02); *H10K 2101/10* (2023.02)

(58) Field of Classification Search

CPC ............. C07F 15/0033; H01L 51/0085; C09K 11/06; C09K 2211/185; C09K 2211/1011; C09K 2211/1029; H10K 85/342

See application file for complete search history.

(56) References Cited

U.S. PATENT DOCUMENTS

2004/0086742 A1* 5/2004 Ma ........................ C07F 15/004 428/690
2005/0164030 A1* 7/2005 Knowles ............. H01L 51/0085 428/690
2009/0104472 A1* 4/2009 Je ........................ C07F 15/0033 428/690
2010/0102710 A1* 4/2010 Cho ........................ C09B 15/00 313/504
2012/0175561 A1 7/2012 Franz et al.
2012/0205585 A1* 8/2012 Okamura ............. C07D 217/04 252/301.35
2012/0235134 A1 9/2012 Nishiura et al.
2013/0065873 A1* 3/2013 Anemian ............ H01L 51/0085 546/10
2015/0014659 A1* 1/2015 Kim ....................... C09K 11/06 546/4
2016/0233443 A1 8/2016 Stoessel et al.

FOREIGN PATENT DOCUMENTS

| | | |
|---|---|---|
| CN | 102498121 A | 6/2012 |
| CN | 102648205 A | 8/2012 |
| JP | 2007522126 A | 8/2007 |
| JP | 2011219443 A | 11/2011 |
| JP | 2012167028 A | 9/2012 |
| JP | 2013504608 A | 2/2013 |
| JP | 6469701 B | 12/2016 |
| WO | WO-2004/045000 A2 | 5/2004 |
| WO | WO-2011/013843 A1 | 2/2011 |
| WO | WO-2011/059719 A2 | 5/2011 |
| WO | WO-2011/070990 A1 | 6/2011 |
| WO | WO-2012/023947 A1 | 2/2012 |

OTHER PUBLICATIONS

"Iridium tris[2-[3-(3- or 4-pyridyl)phenyl]pyridine] complexes, light-emitting materials comprising them, and organic electroluminescent devices using them", Database Caplus—Chemical Abstract Services, XP002742719 (Sep. 6, 2012).

Nakagawa et al., "Synthesis and Photochemical Properties of pH Responsive Tris-Cyclometalated Iridium(III) Complexes that Contain a Pyridine Ring on the 2-Phenylpyridine Ligand", Inorganic Chemistry, 2014, vol. 53, pp. 409-422.

Office Action for European Patent Application Serial No. 15726545.5, dated Feb. 21, 2018.

English Translation of Japanese Office Action dated Feb. 22, 2019 in Japanese Patent Application No. 2016-574428.

* cited by examiner

*Primary Examiner* — Sean M DeGuire

(74) *Attorney, Agent, or Firm* — Riverside Law LLP

(57) ABSTRACT

The invention relates to metal complexes and to electronic devices, in particular organic electroluminescence devices, containing said metal complexes.

18 Claims, No Drawings

METAL COMPLEXES

The present invention relates to metal complexes suitable for use as emitters in organic electroluminescent devices.

Emitting materials used in organic electroluminescent devices (OLEDs) are increasingly organometallic complexes which exhibit phosphorescence rather than fluorescence (M. A. Baldo et al., *Appl. Phys. Left.* 1999, 75, 4-6). For quantum-mechanical reasons, up to four times the energy efficiency and power efficiency is possible using organometallic compounds as phosphorescent emitters. In general terms, there is still a need for improvement in OLEDs which exhibit triplet emission, especially with regard to efficiency, operating voltage and lifetime. This is especially true of OLEDs which emit in the shorter-wave range, i.e. green and especially blue.

According to the prior art, triplet emitters used in phosphorescent OLEDs are iridium complexes in particular. Iridium complexes used are especially bis- and tris-ortho-metalated complexes having aromatic ligands, wherein the ligands bind to the metal via a negatively charged carbon atom and an uncharged nitrogen atom. Examples of such complexes are green-emitting tris(phenylpyridyl)iridium (III) and derivatives thereof (for example according to US 2002/0034656 or WO 2010/027583). The literature discloses a multitude of related ligands and iridium complexes, for example red-emitting complexes with 1- or 3-phenylisoquinoline ligands (for example according to EP 1348711 or WO 2011/028473) or with 2-phenylquinolines (for example according to WO 2002/064700 or WO 2006/095943). Even though good results are already achieved with such metal complexes, further improvements are still desirable here. This is especially true in relation to the solubility of the complexes, the quantum efficiency, and the color coordinates of red-emitting complexes. Particularly complexes having ligands based on 1-phenylisoquinoline are frequently too deep red, and so further improvements with regard to the color locus are desirable here.

The problem addressed by the present invention is therefore that of providing novel metal complexes suitable as emitters for use in OLEDs. A particular problem addressed is that of providing emitters which exhibit improved properties in relation to color coordinates and/or color purity.

It has been found that, surprisingly, particular iridium complexes described in detail below, in which the ligand is substituted by a six-membered heteroaryl group in the para position to the iridium, solve this problem and are of very good suitability for use in an organic electroluminescent device. The present invention therefore provides these metal complexes and organic electroluminescent devices comprising these complexes.

The invention thus provides a compound of formula (1)

$$Ir(L)_n(L')_m \quad \text{formula (1)}$$

containing a substructure $M(L)_n$ of the formula (2):

Formula (2)

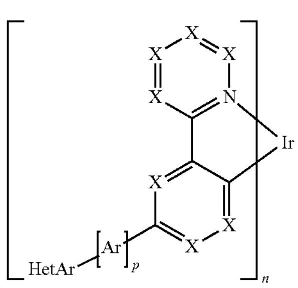

where the symbols and indices used are as follows:

HetAr is a group of the following formula (HetAr):

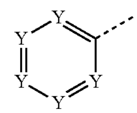

(HetAr)

where the dotted bond indicates the bond of this group to the ligand or to Ar;

Y is the same or different at each instance and is $CR^2$ or N, with the proviso that at least one and at most three Y groups are N and that not more than two nitrogen atoms are bonded directly to one another;

X at each instance is $CR^1$ or N, with the proviso that not more than two X groups per cycle are N or two X groups bonded directly to one another are a group of the following formula (3) or two adjacent X groups on the two different cycles are a group of the following formula (4):

Formula (3)

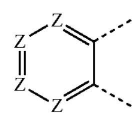

Formula (4)

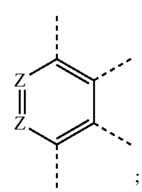

;

where the dotted bonds indicate the linkage of this group in the ligand;

with the proviso that the substructure of the formula (2) contains at least one group of the formula (3) or (4);

Z at each instance is $CR^1$ or N, with the proviso that not more than two Z groups are N;

Ar is a para-phenylene group which may be substituted by one or more $R^1$ radicals;

$R^1$, $R^2$ is the same or different at each instance and is H, D, F, Cl, Br, I, $N(R^3)_2$, CN, $NO_2$, OH, COOH, $C(=O)N(R^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which may be substituted by one or more $R^3$ radicals, where one or more nonadjacent $CH_2$ groups may be replaced by $R^3C=CR^3$, C≡C, $Si(R^3)_2$, C=O, $NR^3$, O, S or $CONR^3$ and where one or more hydrogen atoms may be replaced by D, F, Cl, Br, I or CN, or an aromatic or heteroaromatic ring system which has 5 to 60 aromatic ring atoms and may be substituted in each case by one or more $R^3$ radicals, or an aryloxy or heteroaryloxy group which has 5 to 40 aromatic ring atoms and may be substituted by one or more $R^3$ radicals, or an aralkyl or heteroaralkyl group which has 5 to 40 aromatic ring atoms and may be substituted by one or more $R^3$ radicals, or a diarylamino group, diheteroarylamino group or arylheteroarylamino group which has 10 to 40 aromatic ring atoms and may be substituted by one or more $R^3$ radicals; at the same time, two adjacent $R^1$ radicals or two adjacent $R^2$ radicals together may also form a mono- or polycyclic, aliphatic, aromatic or heteroaromatic ring system;

$R^3$ is the same or different at each instance and is H, D, F or an aliphatic, aromatic and/or heteroaromatic group having 1 to 20 carbon atoms, in which one or more hydrogen atoms may also be replaced by F; at the same time, two or more $R^3$ substituents together may also form a mono- or polycyclic aliphatic ring system;

L' is the same or different at each instance and is a bidentate, monoanionic ligand;

n is 1, 2 or 3;

m is (3−n);

p is 0 or 1.

What is essential to the invention is the combination of a substructure of the formula (3) or (4), i.e. a fused-on aromatic or heteroaromatic six-membered ring, and a (HetAr) group, i.e. a six-membered heteroaryl substituent, para to the iridium.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. One heteroaryl group preferably has a maximum of 3 heteroatoms, of which not more than one is selected from O and S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 60 carbon atoms in the ring system. A heteroaromatic ring system in the context of this invention contains 1 to 60 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for two or more aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$- to $C_{40}$-alkyl group in which individual hydrogen atoms or $CH_2$ groups may also be replaced by the abovementioned groups are understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{40}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-60 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The compounds of the formula (1) are uncharged, i.e. electrically neutral, compounds, since the negative charge of the ligands L and L' compensates for the charge of the complexed iridium(III).

As described above, the compound of the invention contains at least one group of the formula (3) or (4). Preferred embodiments of the substructure of the formula (2) are thus the structures of the following formulae (5) to (9):

Formula (5)

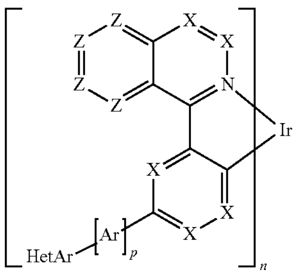

Formula (6)

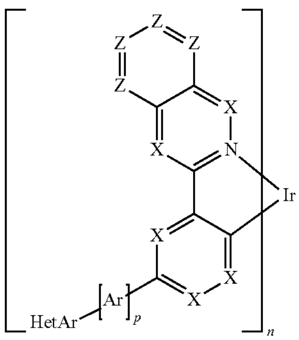

Formula (7)

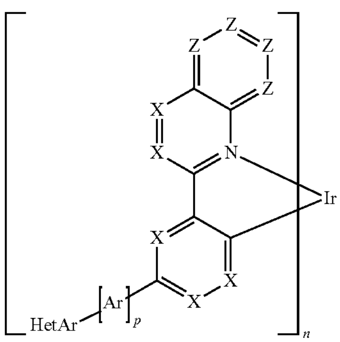

Formula (8)

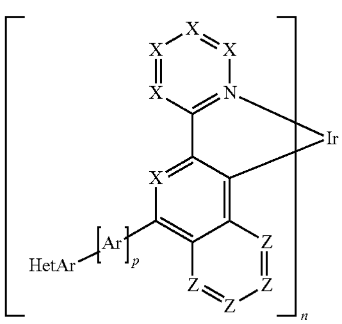

-continued

Formula (9)

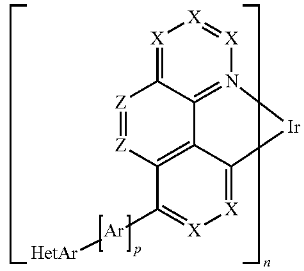

where the symbols and indices used have the definitions given above. The structures of the formulae (5) to (8) each contain a structure of the formula (3), and the structure of the formula (9) contains a structure of the formula (4).

In a preferred embodiment of the invention, not more than one X group per cycle is N. More preferably, none of the X groups is N.

In a further preferred embodiment of the invention, not more than one Z group is N. More preferably, none of the Z groups is N.

More preferably, all X groups and all Z groups are the same or different at each instance and are $CR^1$.

In a further preferred embodiment of the invention, Ar is an unsubstituted para-phenylene group. More preferably, p=0, and the Ar group is absent, i.e. the HetAr group is bonded directly to the ligand.

Preferred embodiments of the substructures of the formulae (5) to (9) are thus the substructures of the following formulae (5a) to (9a):

Formula (5a)

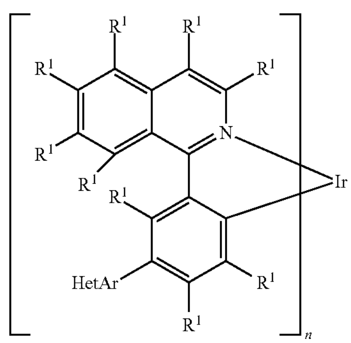

Formula (6a)

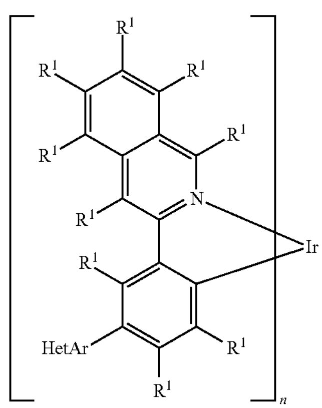

-continued

Formula (7a)

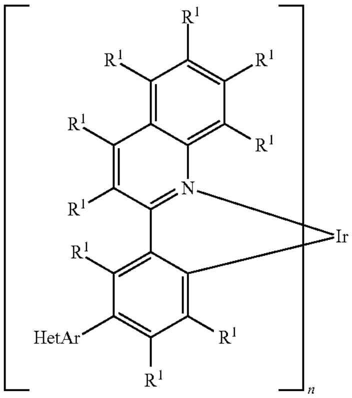

Formula (8a)

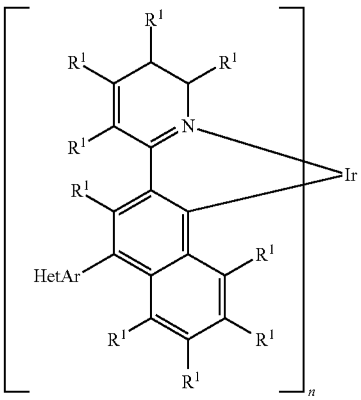

Formula (9a)

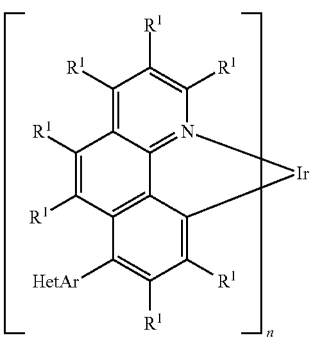

where the symbols and indices used have the definitions given above.

It is preferable for the compounds containing a substructure of the formula (7), (7a), (8) and (8a) when n=2 and L' is a non-ortho-metalated ligand, especially the diketonate, for example acetylacetonate, as described in detail hereinafter.

For the compounds containing a substructure of the formulae (5), (6), (9), (5a), (6a) and (9a), it is preferable when n=3 and, correspondingly, L' is absent. In addition, it is preferable for these compounds when n=2 and L' is an ortho-metalated ligand as described in detail hereinafter.

As described above, it is essential to the invention that the compound of the invention has, para to the iridium atom, a heteroaromatic HetAr group bonded to the ligand either directly or via an Ar group. It is preferable when at least two Y groups in the HetAr group are N.

Preferred embodiments of the (HetAr) group are the groups of the following formulae (HetAr-1) to (HetAr-7):

(HetAr-1)

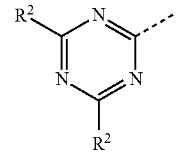

(HetAr-2)

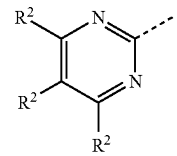

(HetAr-3)

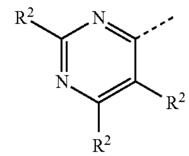

(HetAr-4)

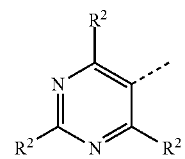

(HetAr-5)

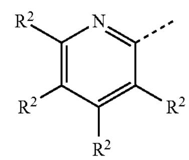

(HetAr-6)

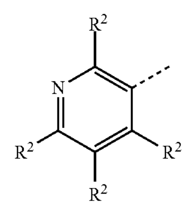

(HetAr-7)

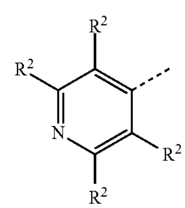

where the symbols used have the definitions given above.

Preferred $R^2$ radicals in the (HetAr) group or in the preferred (HetAr-1) to (HetAr-7) groups are the same or different at each instance and are selected from the group consisting of H, D, a straight-chain alkyl or alkoxy group having 1 to 6 carbon atoms or a branched or cyclic alkyl or alkoxy group having 3 to 10 carbon atoms, each of which may be substituted by one or more $R^3$ radicals, or an aromatic or heteroaromatic ring system which has 5 to 24 aromatic ring atoms and may be substituted in each case by one or more $R^3$ radicals, or an aryloxy or heteroaryloxy group which has 5 to 24 aromatic ring atoms and may be substituted by one or more $R^3$ radicals, or a diarylamino group, diheteroarylamino group or arylheteroarylamino group which has 10 to 30 aromatic ring atoms and may be substituted by one or more $R^3$ radicals.

Particularly preferred $R^2$ radicals in the (HetAr) group or in the preferred (HetAr-1) to (HetAr-7) groups are the same or different at each instance and are selected from the group consisting of H, D or an aromatic or heteroaromatic ring system which has 5 to 40 aromatic ring atoms, preferably 6 to 24 aromatic ring atoms, and may be substituted in each case by one or more $R^3$ radicals. Aromatic and heteroaromatic ring systems here are preferably selected from phenyl, biphenyl, especially ortho-, meta- or para-biphenyl, terphenyl, especially ortho-, meta- or para-terphenyl or branched terphenyl, quaterphenyl, especially ortho-, meta- or para-quaterphenyl or branched quaterphenyl, fluorenyl, especially 1-, 2-, 3- or 4-fluorene, spirobifluorenyl, especially 1-, 2-, 3- or 4-spirobifluorene, dibenzofuranyl, especially 1-, 2-, 3- or 4-dibenzofuran, or carbazolyl, especially 1-, 2-, 3- or 4-carbazole, where these groups may each be substituted by one or more $R^3$ radicals.

Particularly preferred embodiments of the (HetAr-1) to (HetAr-7) groups are the groups of the following formulae (HetAr-1a) to (HetAr-7a):

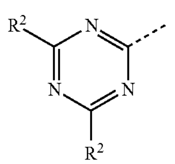

(HetAr-1a)

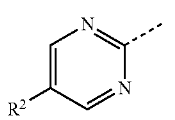

(HetAr-2a)

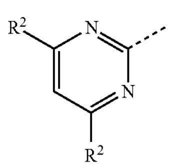

(HetAr-2b)

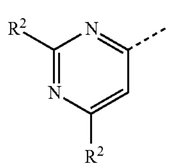

(HetAr-3a)

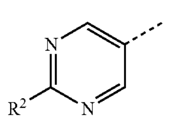

(HetAr-4a)

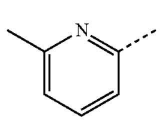

(HetAr-5a)

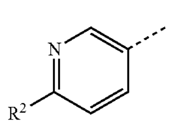

(HetAr-6b)

-continued

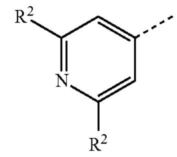

(HetAr-7a)

where $R^2$ is the same or different at each instance and is an aromatic or heteroaromatic ring system which has 6 to 24 aromatic ring atoms and may be substituted in each case by one or more $R^3$ radicals, preferably selected from phenyl, biphenyl, especially ortho-, meta- or para-biphenyl, terphenyl, especially ortho-, meta- or para-terphenyl or branched terphenyl, quaterphenyl, especially ortho-, meta- or para-quaterphenyl or branched quaterphenyl, fluorenyl, especially 1-, 2-, 3- or 4-fluorene, spirobifluorenyl, especially 1-, 2-, 3- or 4-spirobifluorene, dibenzofuranyl, especially 1-, 2-, 3- or 4-dibenzofuran, or carbazolyl, especially 1-, 2-, 3- or 4-carbazole, where these groups may each be substituted by one or more $R^3$ radicals.

Very particular preference is given to the (HetAr-1a) and (HetAr-2b) groups.

When $R^1$ radicals are bonded within the substructure of the formula (2), these $R^1$ radicals are the same or different at each instance and are preferably selected from the group consisting of H, D, F, $N(R^3)_2$, CN, $Si(R^3)_3$, $B(OR^3)_2$, $C(=O)R^3$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^3$ radicals, where one or more hydrogen atoms may be replaced by D or F, or an aromatic or heteroaromatic ring system which has 5 to 30 aromatic ring atoms and may be substituted in each case by one or more $R^3$ radicals; at the same time, two adjacent $R^1$ radicals together may also form a mono- or polycyclic, aliphatic or aromatic ring system. More preferably, these $R^1$ radicals are the same or different at each instance and are selected from the group consisting of H, D, F, $N(R^3)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^3$ radicals; at the same time, two adjacent $R^1$ radicals together may also form a mono- or polycyclic, aliphatic or aromatic ring system.

When two or more $R^1$ radicals in the ligand L together form a ring system, which leads to a fused-on ring system, it is further preferable when this ring formation leads to a fused-on aliphatic ring structure having no acidic benzylic protons, especially a five-membered, six-membered or seven-membered ring structure or a bicyclic structure. Such ring formation is described in detail, for example, in WO 2014/023377 and the as yet unpublished applications EP 13004411.8, EP 14000345.0 and EP 14000417.7, and the person skilled in the art will be able to apply this teaching to the present compounds of the invention as well without exercising inventive skill.

There follows a description of preferred ligands L' as occur in formula (1).

The ligands L' are preferably monoanionic bidentate ligands which bind to Ir via one nitrogen atom and one carbon atom or via two oxygen atoms or via two nitrogen atoms or via one nitrogen atom and one oxygen atom.

Preferred ligands L' are selected from 1,3-diketonates derived from 1,3-diketones, for example acetylacetone, benzoylacetone, 1,5-diphenylacetylacetone, dibenzoylmethane, bis(1,1,1-trifluoroacetyl)methane, 3-ketonates derived from 3-keto esters, for example ethyl acetoacetate, carboxylates derived from aminocarboxylic acids, for example pyridine-2-carboxylic acid, quinoline-2-carboxylic acid, glycine, N,N-dimethylglycine, alanine, N,N-dimethylaminoalanine, or salicyliminates derived from salicylimines, for example methylsalicylimine, ethylsalicylimine, phenylsalicylimine.

Preference is further given to bidentate monoanionic ligands L' having, together with the iridium, a cyclometalated five-membered ring or six-membered ring having at least one metal-carbon bond, especially a cyclometalated five-membered ring. These are especially ligands as generally used in the field of phosphorescent metal complexes for organic electroluminescent devices, i.e. ligands of the phenylpyridine, naphthylpyridine, phenylquinoline, phenylisoquinoline type, etc., each of which may be substituted by one or more $R^1$ radicals. The person skilled in the art in the field of phosphorescent electroluminescent devices is aware of a multitude of such ligands, and will be able without exercising inventive skill to select further ligands of this kind as ligand L' for compounds of formula (1). It is generally the case that a particularly suitable combination for the purpose is that of two groups as shown by the formulae (10) to (34) which follow, where one group preferably binds via an uncharged nitrogen atom or a carbene carbon atom and the other group preferably via a negatively charged carbon atom or a negatively charged nitrogen atom. The ligand L' can then be formed from the groups of the formulae (10) to (34) by virtue of these groups each binding to one another at the position indicated by #. The positions at which the groups coordinate to the metal are indicated by *.

Formula (10)

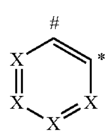

Formula (11)

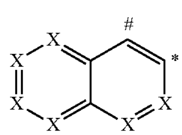

Formula (12)

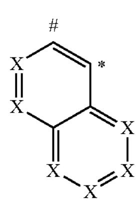

Formula (13)

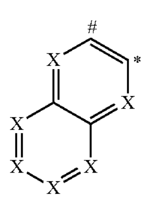

-continued

Formula (14)

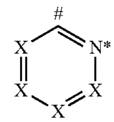

Formula (15)

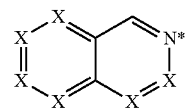

Formula (16)

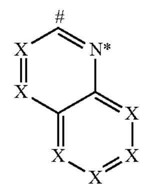

Formula (17)

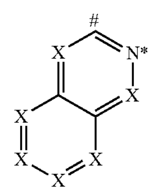

Formula (18)

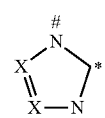

Formula (19)

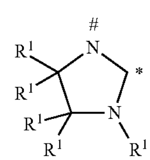

Formula (20)

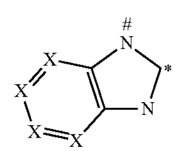

Formula (21)

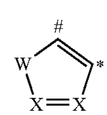

Formula (22)

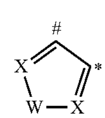

Formula (23)

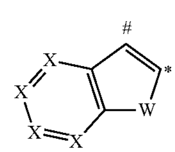

-continued

Formula (24)

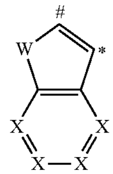

Formula (25)

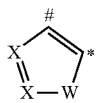

Formula (26)

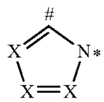

Formula (27)

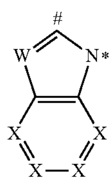

Formula (28)

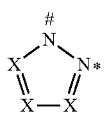

Formula (29)

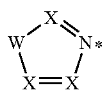

Formula (30)

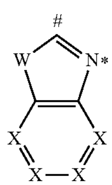

Formula (31)

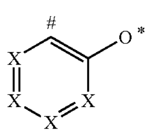

Formula (32)

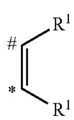

Formula (33)

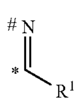

Formula (34)

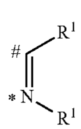

In these formulae, W is the same or different at each instance and is $NR^1$, O or S, and X is the same or different at each instance and is $CR^1$ or N, where not more than two X groups per cycle are N, and $R^1$ has the same definition as described above. Preferably, not more than one symbol X in each group is N. Especially preferably, all symbols X are CR.

When two $R^1$ radicals in the ligand L' bonded to two different cycles of the abovementioned formulae (10) to (34) together form an aromatic ring system, this may result, for example, in ligands which constitute a single larger heteroaryl group overall, for example benzo[h]quinoline, etc. Preferred ligands L' which arise through ring formation between two R radicals in the different cycles are the structures of the formulae (35) to (39) shown below:

Formula (35)

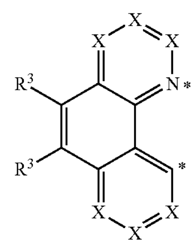

Formula (36)

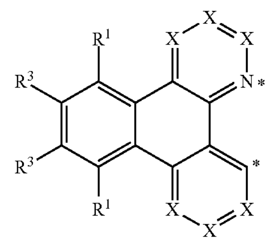

Formula (37)

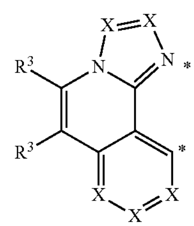

Formula (38)

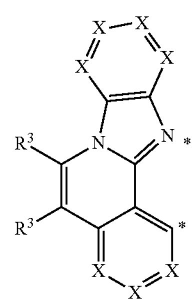

Formula (39)

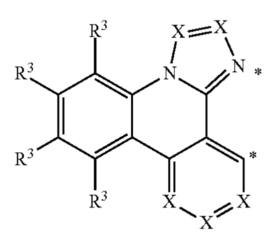

where the symbols used have the definitions given above.

Preferred $R^1$ radicals in the structures of L' shown above are the same or different at each instance and are selected from the group consisting of H, D, F, $N(R^3)_2$, CN, $B(OR^3)_2$, C(═O)$R^3$, a straight-chain alkyl group having 1 to 10 carbon atoms or an alkenyl or alkynyl group having 2 to 10 carbon atoms or a branched or cyclic alkyl group having 3 to 10 carbon atoms, each of which may be substituted by one or more $R^3$ radicals, where one or more hydrogen atoms may be replaced by D or F, or an aromatic or heteroaromatic ring system which has 5 to 14 aromatic ring atoms and may be substituted in each case by one or more $R^3$ radicals; at the same time, two or more adjacent $R^1$ radicals together may also form a mono- or polycyclic, aliphatic, aromatic and/or benzofused ring system. Particularly preferred $R^1$ radicals are the same or different at each instance and are selected from the group consisting of H, D, F, CN, a straight-chain alkyl group having 1 to 5 carbon atoms, especially methyl, or a branched or cyclic alkyl group having 3 to 5 carbon atoms, especially isopropyl or tert-butyl, where one or more hydrogen atoms may be replaced by D or F, or an aromatic or heteroaromatic ring system which has 5 to 12 aromatic ring atoms and may be substituted in each case by one or more $R^3$ radicals; at the same time, two or more $R^1$ radicals together may also form a mono- or polycyclic, aliphatic, aromatic and/or benzofused ring system.

When two or more $R^1$ radicals in the ligand L' together form a ring system, which leads to a fused-on ring system, it is further preferable when this ring formation leads to a fused-on aliphatic ring structure having no acidic benzylic protons, especially a five-membered, six-membered or seven-membered ring structure or a bicyclic structure. Such ring formation is described in detail, for example, in WO 2014/023377 and the as yet unpublished applications EP 14000345.0 and EP 14000417.7, and the person skilled in the art will be able to apply this teaching to the present compounds of the invention as well without exercising inventive skill.

The complexes of the invention may be facial or pseudofacial, or they may be meridional or pseudomeridional.

The ligands L and/or L' may also be chiral depending on the structure. This is the case especially when they contain substituents, for example alkyl, alkoxy, dialkylamino or aralkyl groups, having one or more stereocenters. Since the base structure of the complex may also be a chiral structure, the formation of diastereomers and multiple pairs of enantiomers is possible. In that case, the complexes of the invention include both the mixtures of the different diastereomers or the corresponding racemates and the individual isolated diastereomers or enantiomers.

The abovementioned preferred embodiments can be combined with one another as desired. In a particularly preferred embodiment of the invention, the abovementioned preferred embodiments apply simultaneously.

Examples of suitable compounds of formula (1) are the structures detailed in the table which follows.

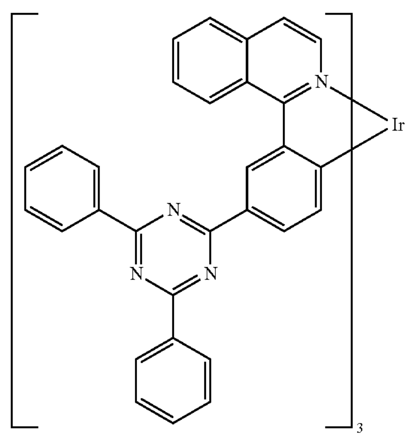

1

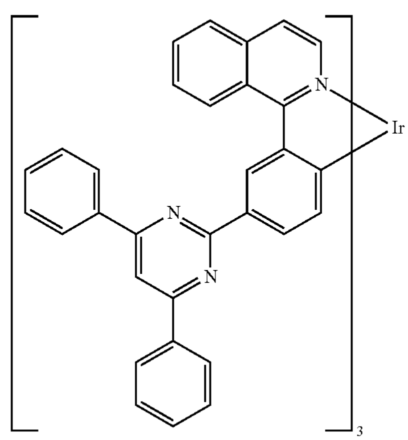

2

-continued
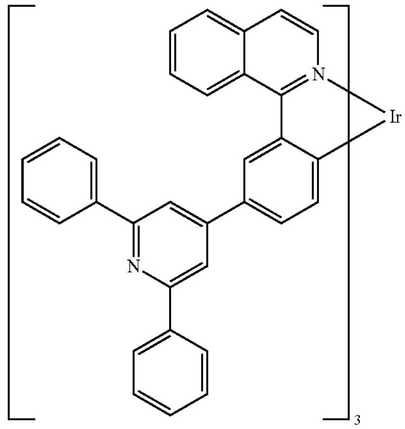
3
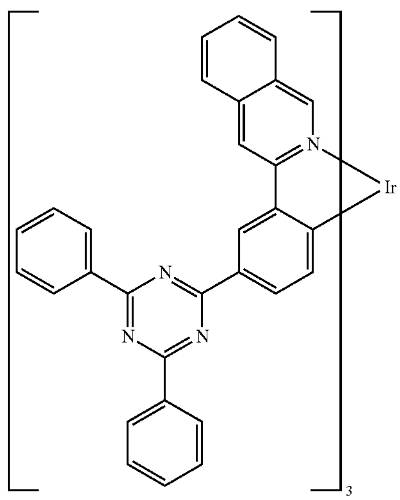
4
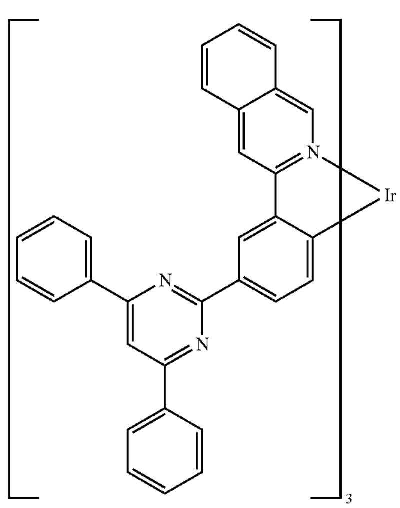
5

-continued
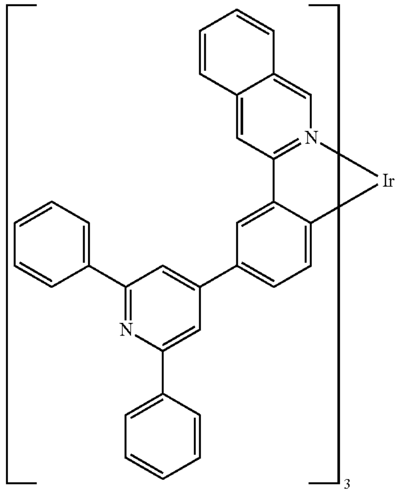
6
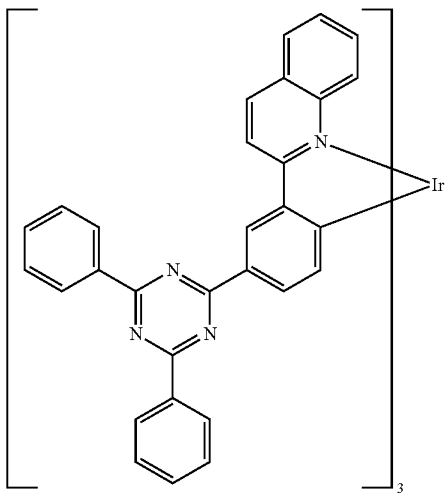
7
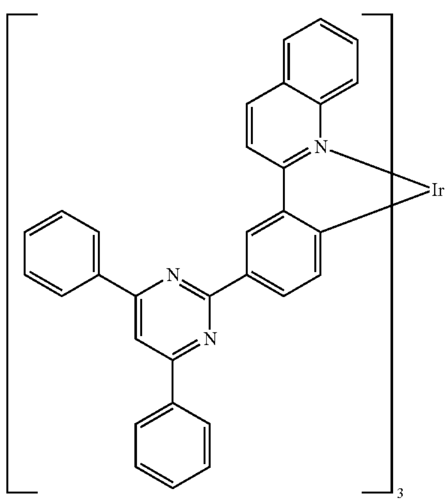
8

-continued
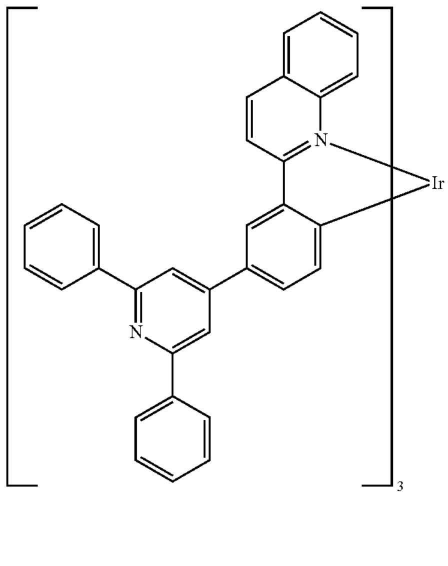
9
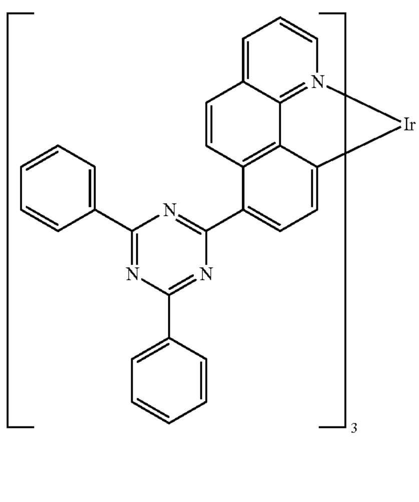
10
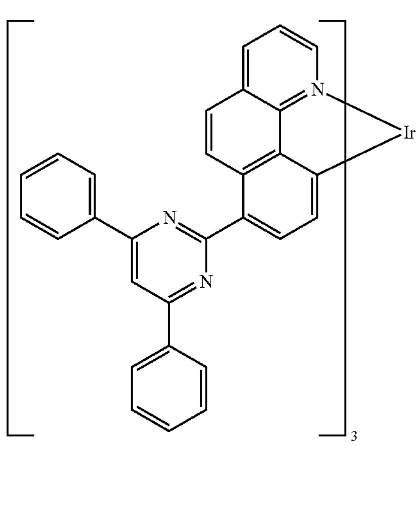
11

-continued
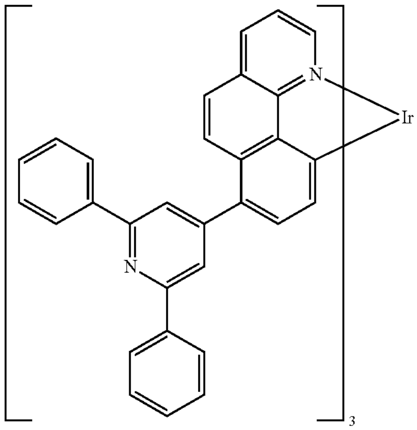
12
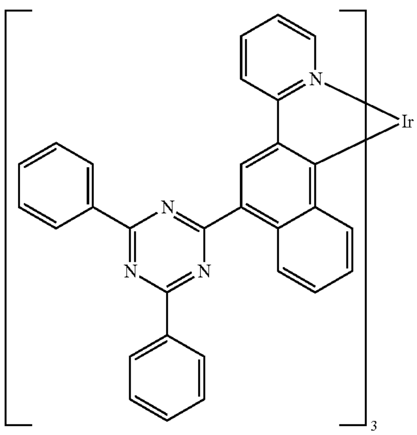
13
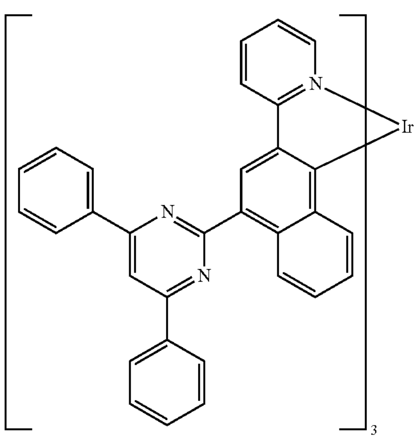
14

-continued
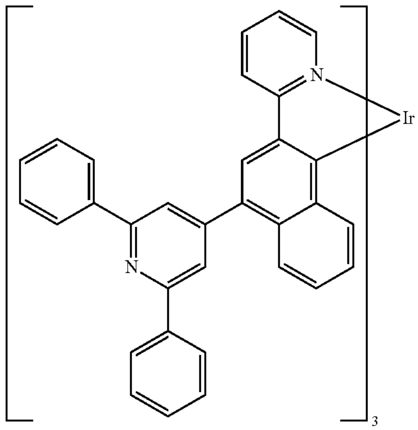
15
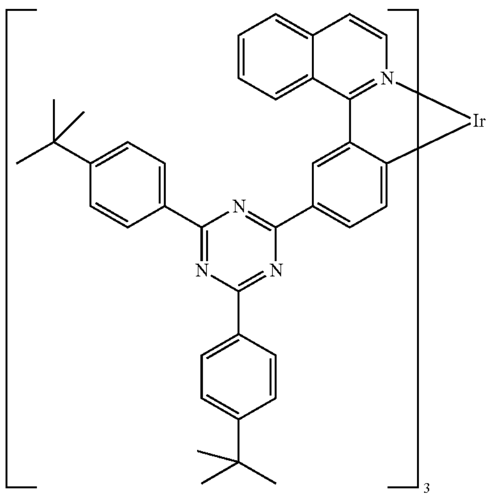
16
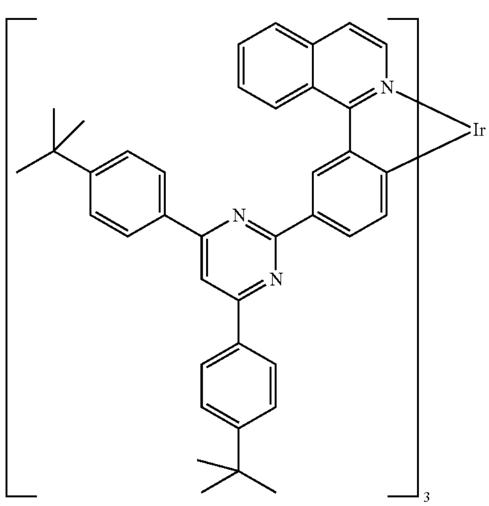
17

-continued
18
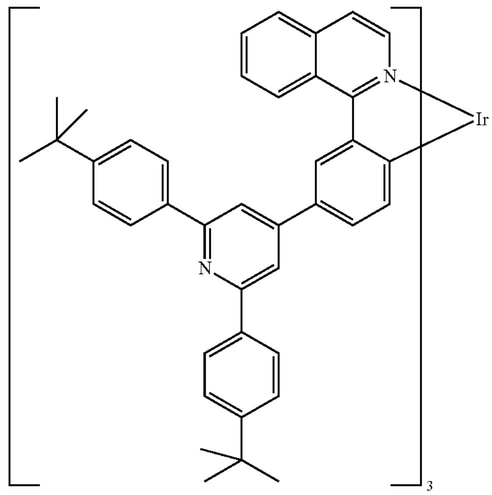
19
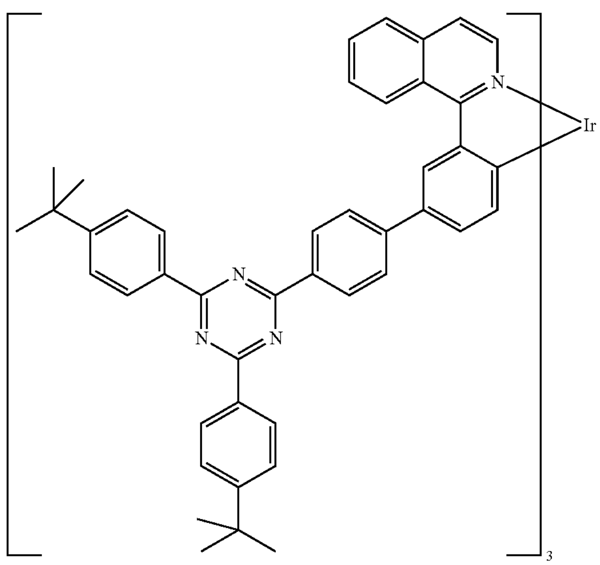
20
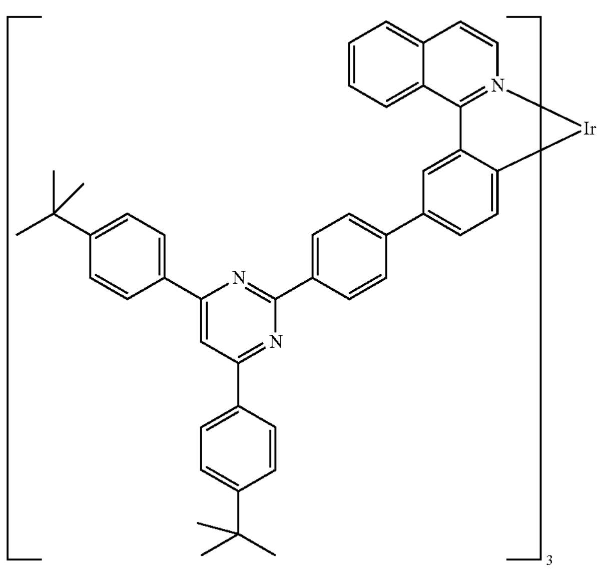

-continued
21
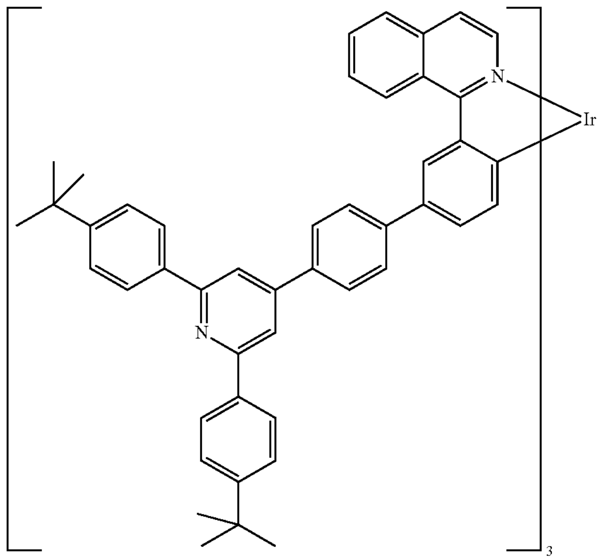
22
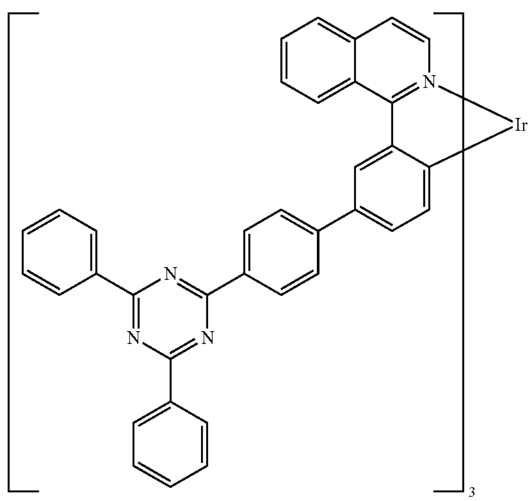
23
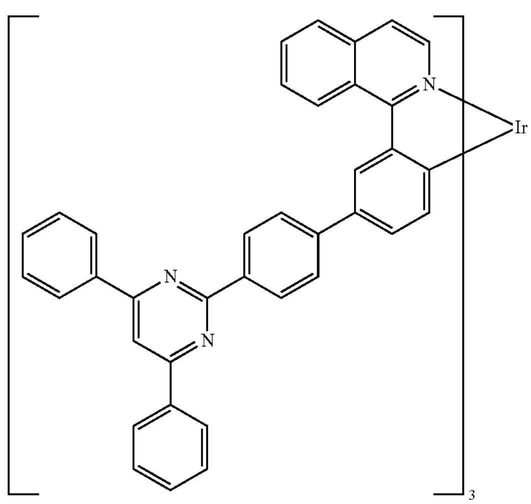

-continued
24
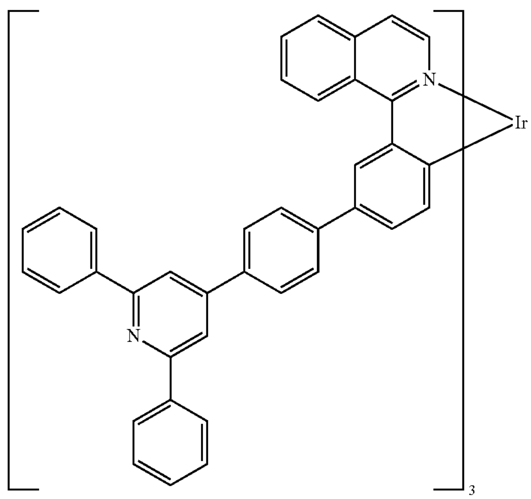
25
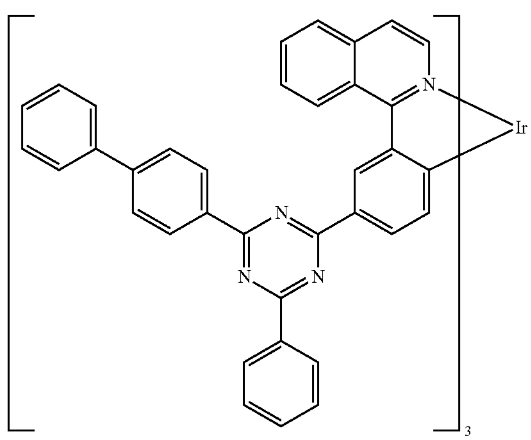
26
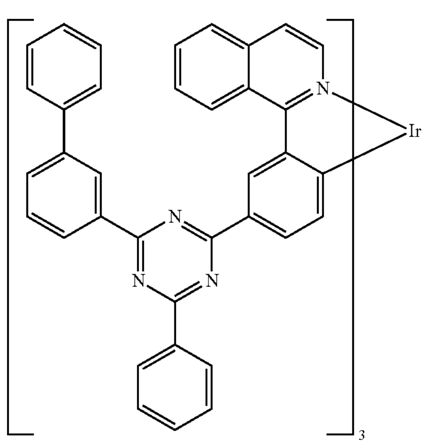

-continued
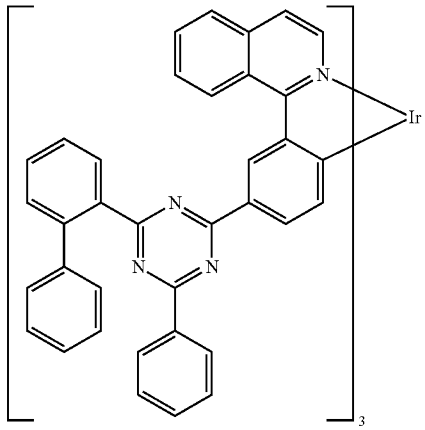
27
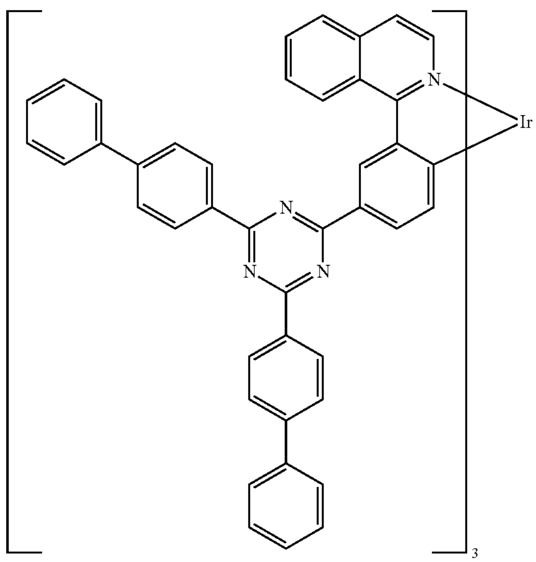
28
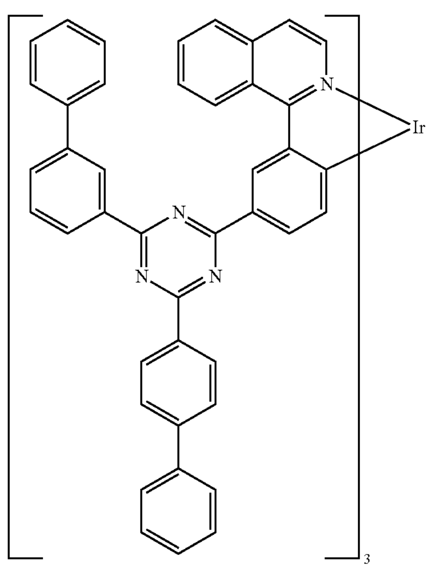
29

-continued
30
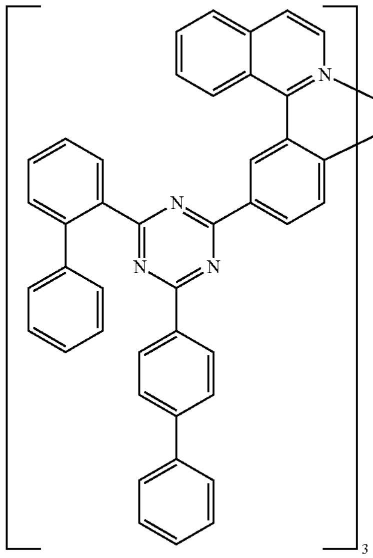
31
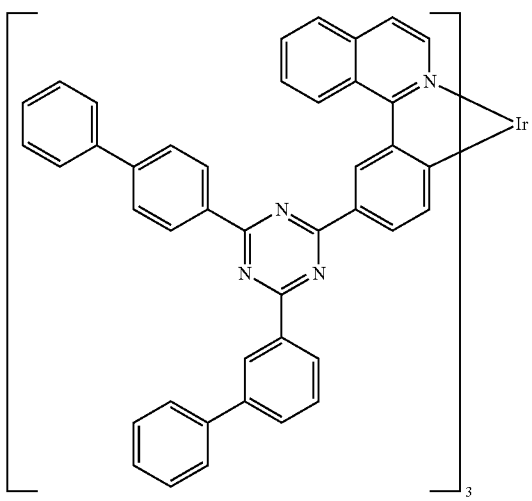
32
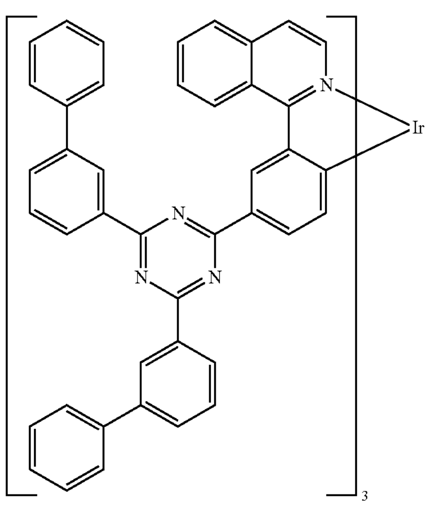

-continued
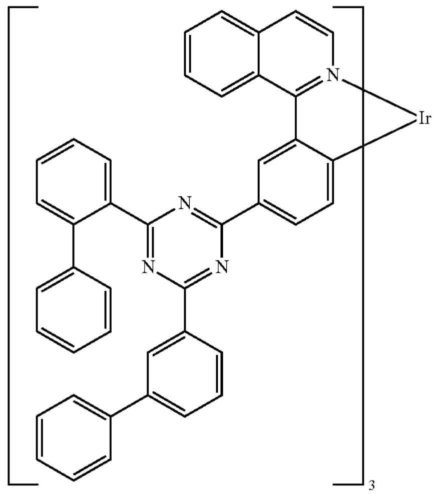
33
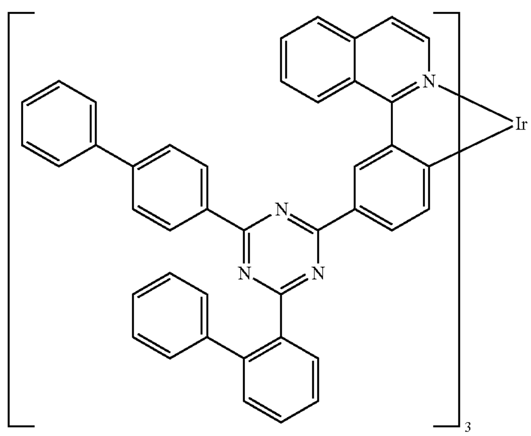
34
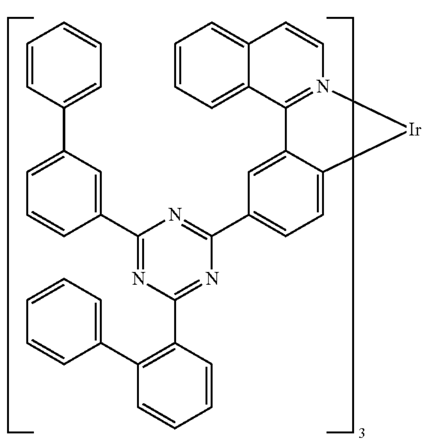
35

-continued
36
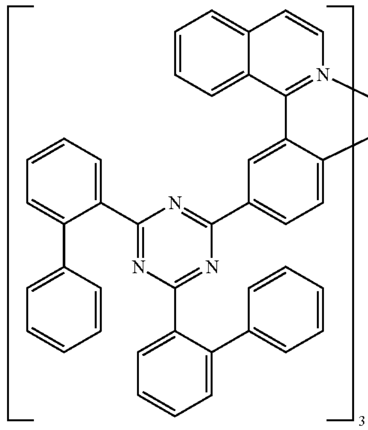
37
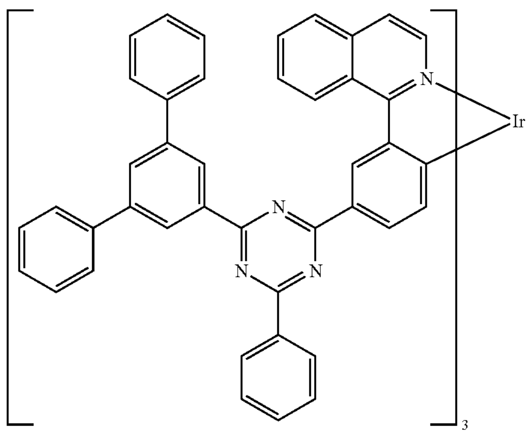
38
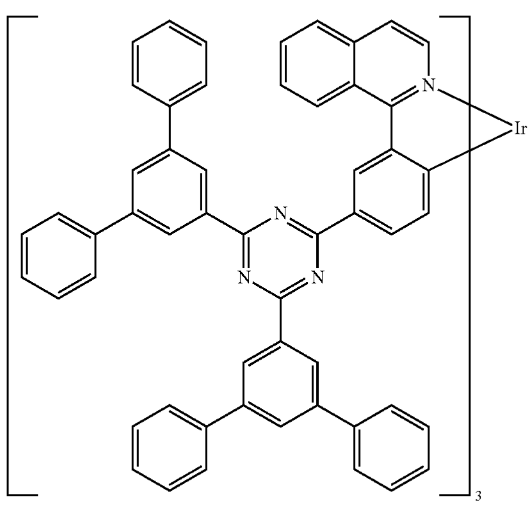

-continued
39
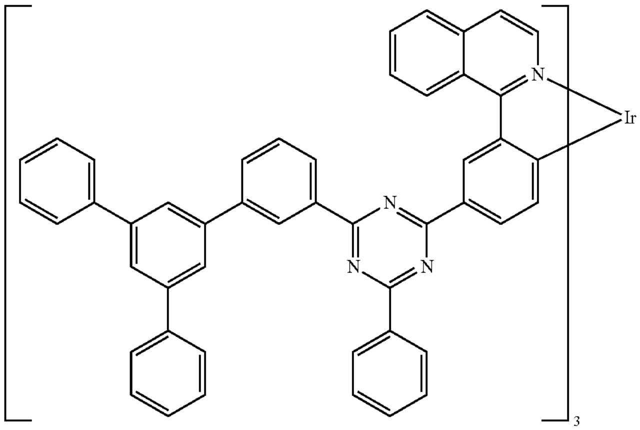
40
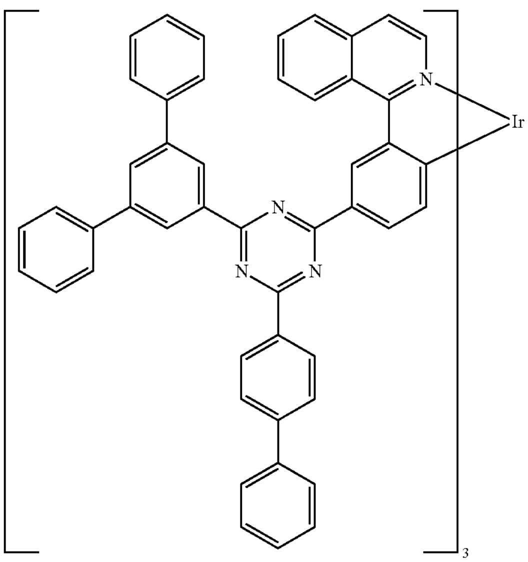
41
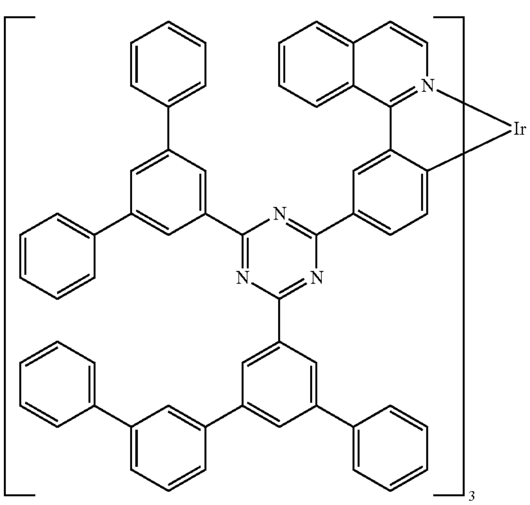

-continued
42
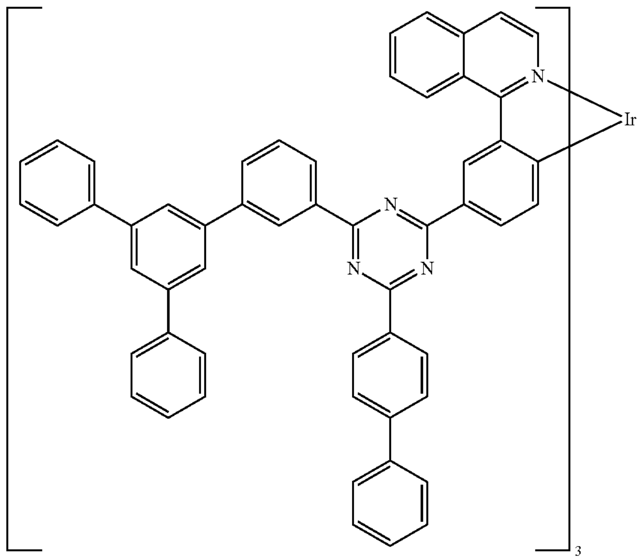
43
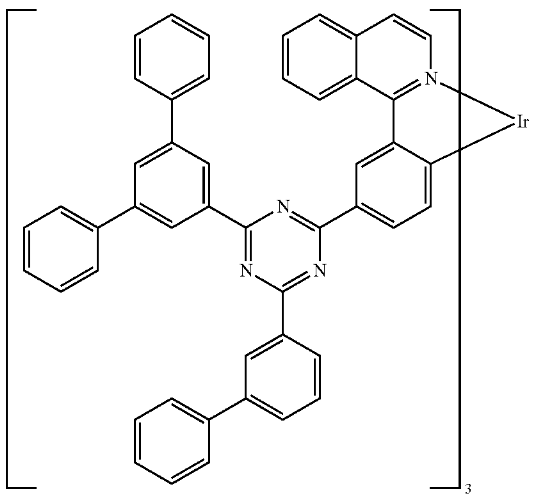
44
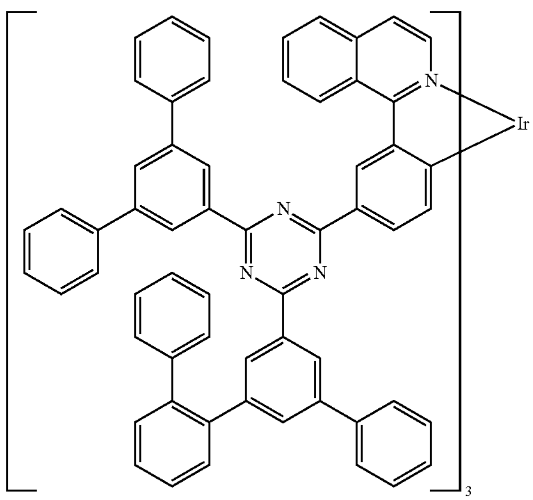

-continued
45
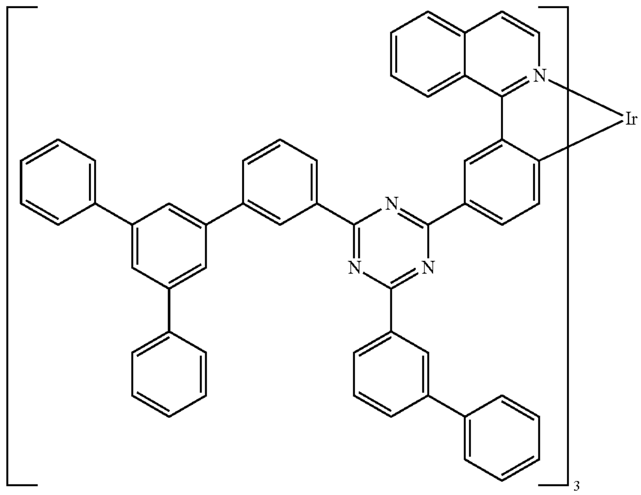
46
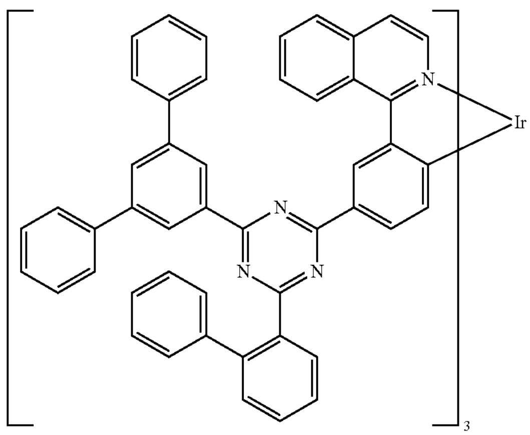
47
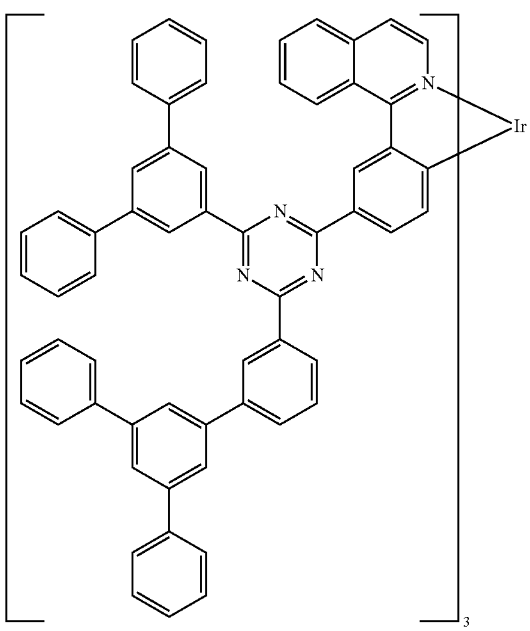

-continued
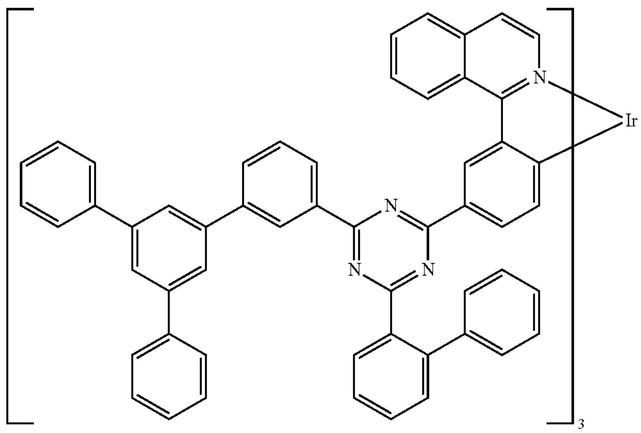
48
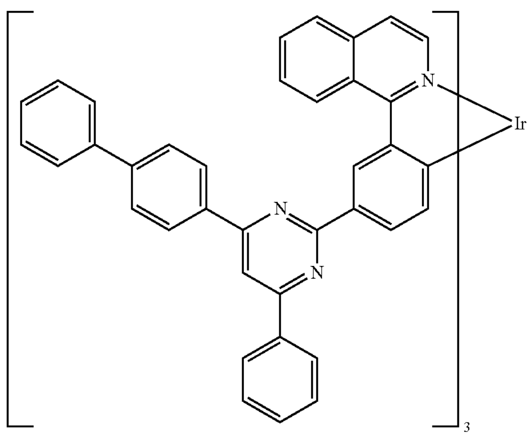
49
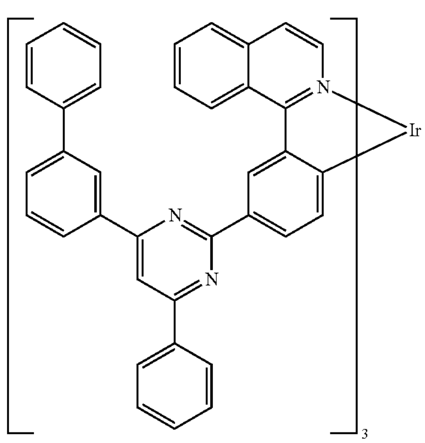
50

-continued
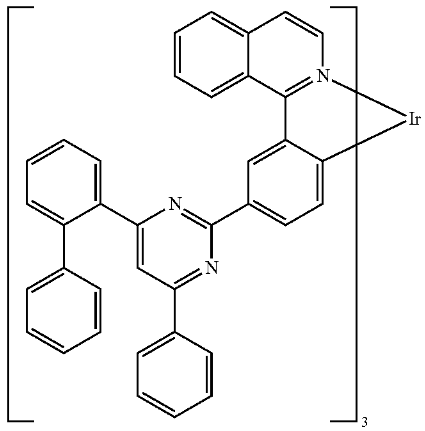
51
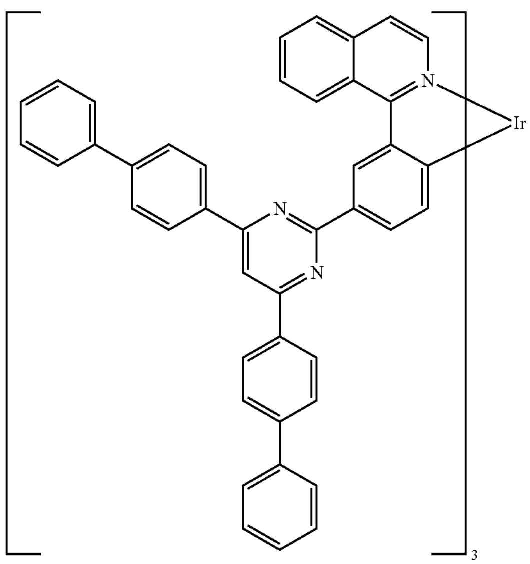
52
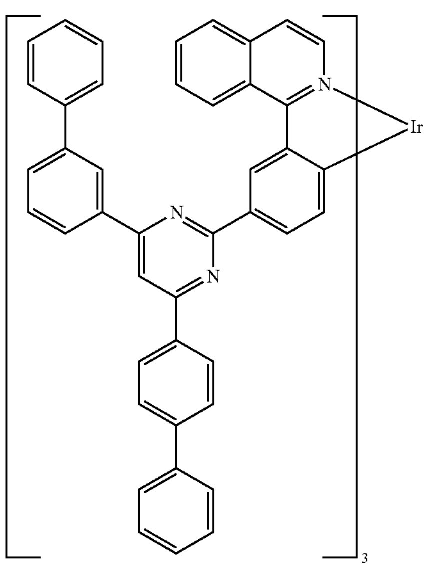
53

-continued
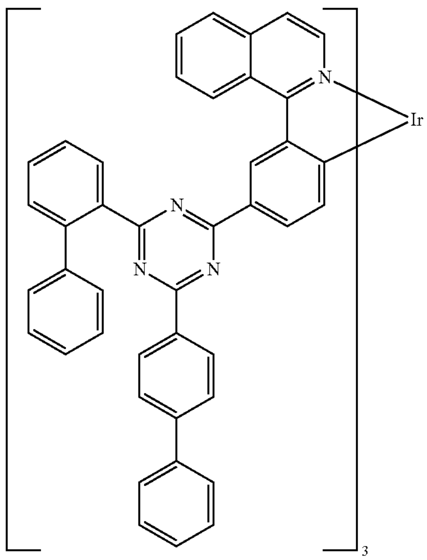
54
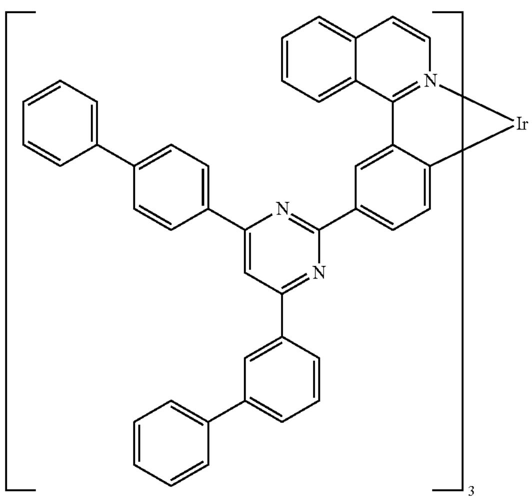
55
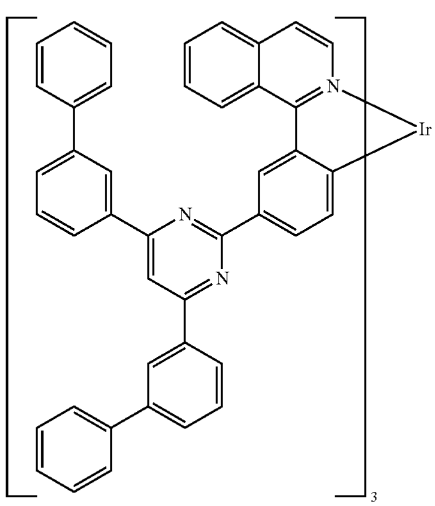
56

-continued
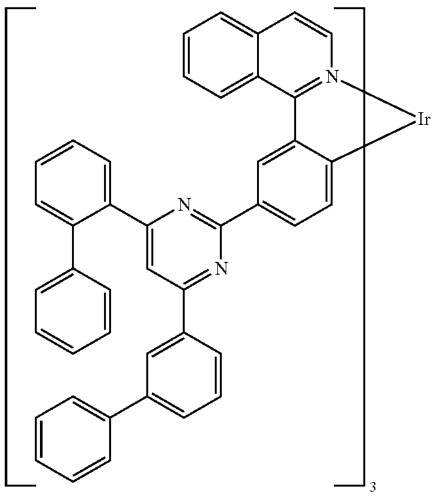
57
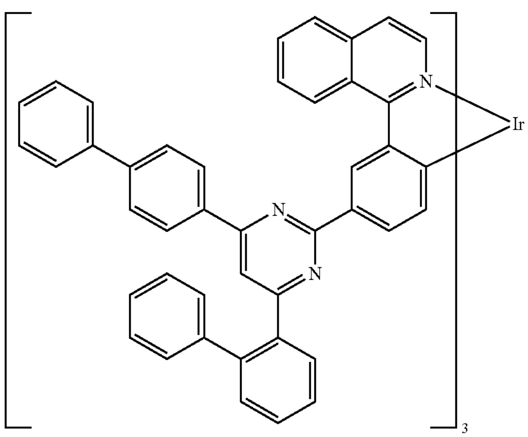
58
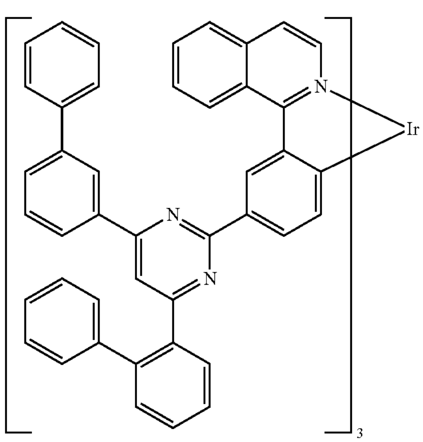
59

-continued
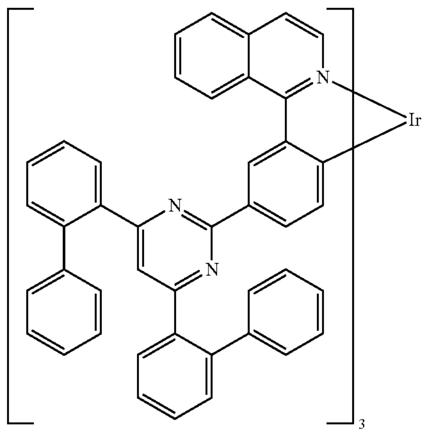
60
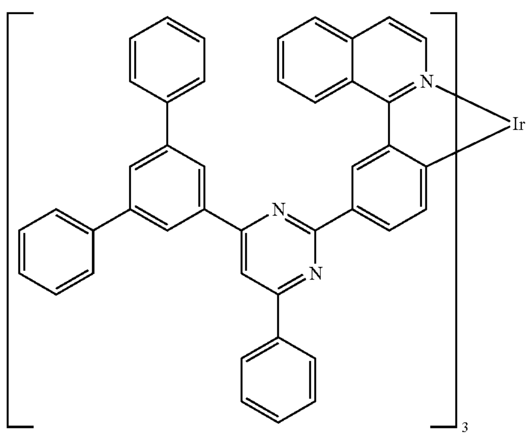
61
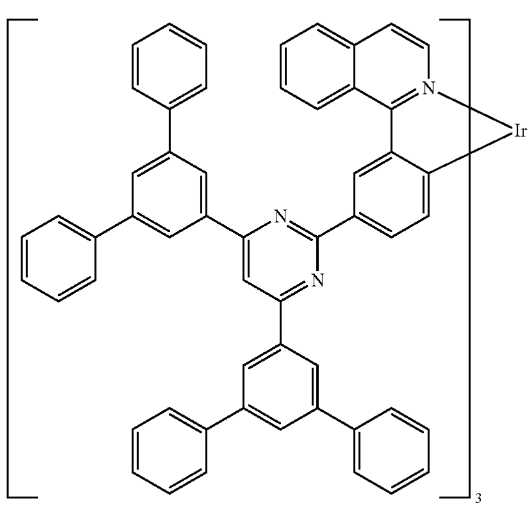
62

-continued
63
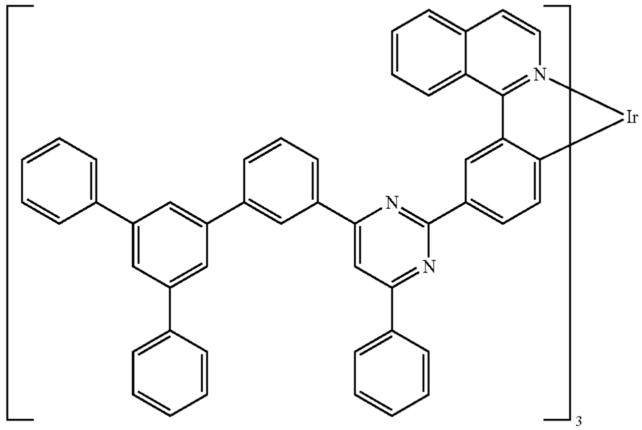
64
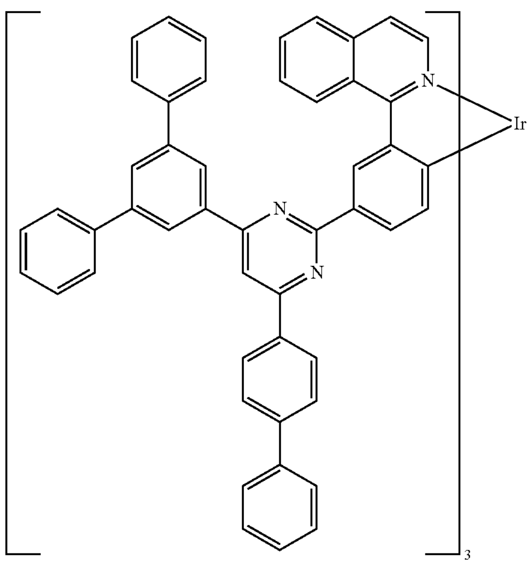
65
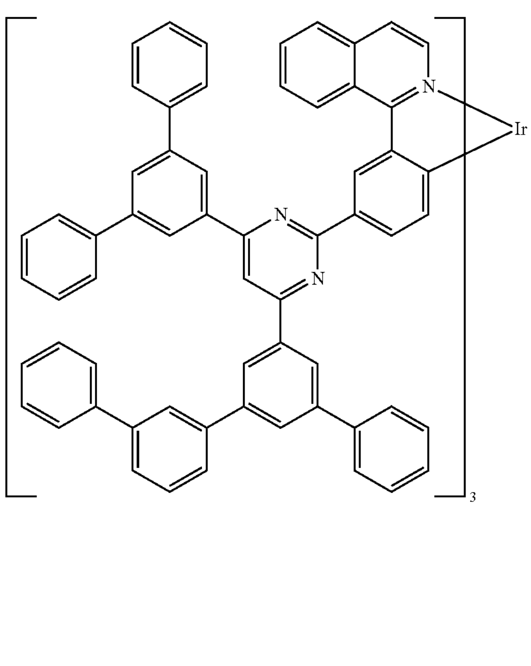

-continued
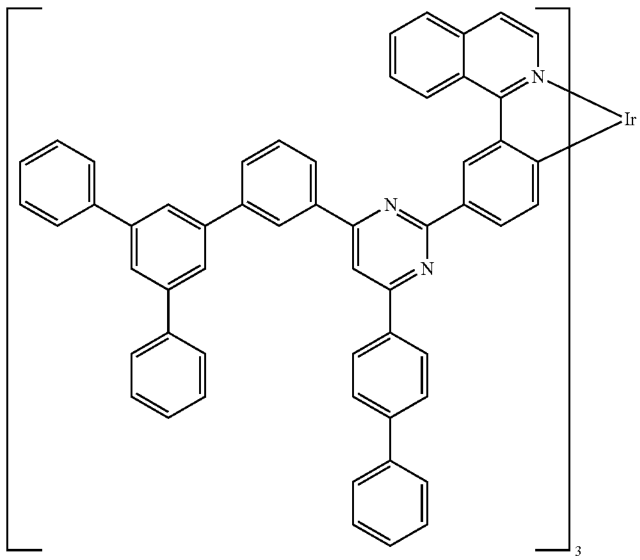
66
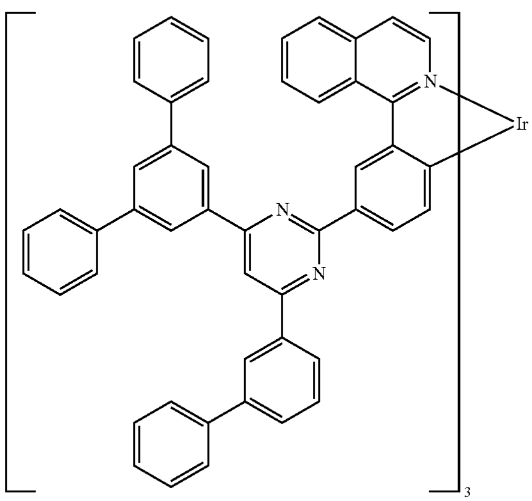
67
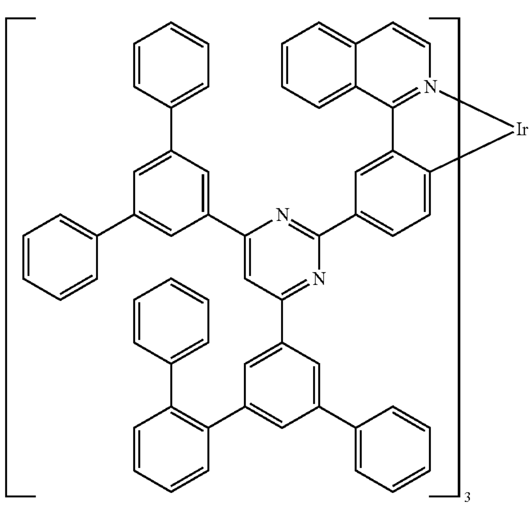
68

-continued
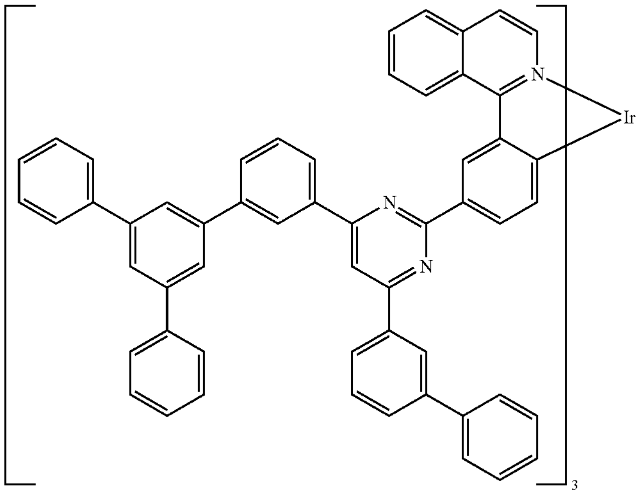
69
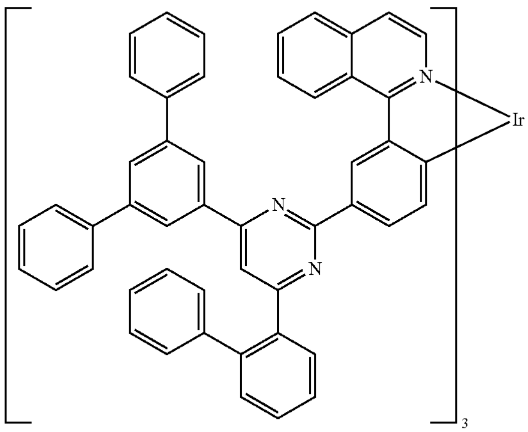
70
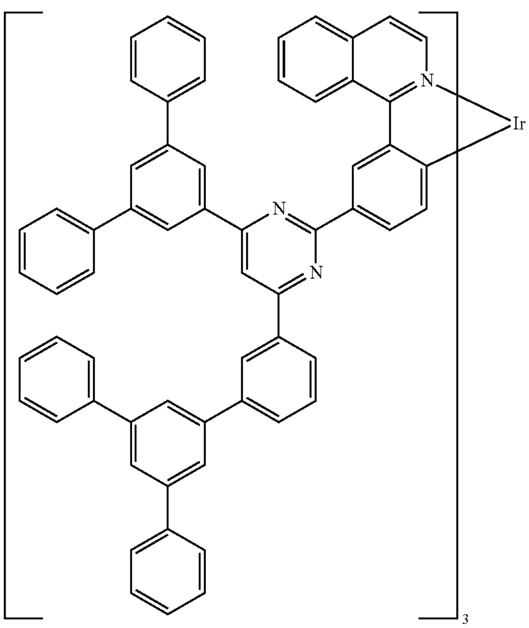
71

-continued
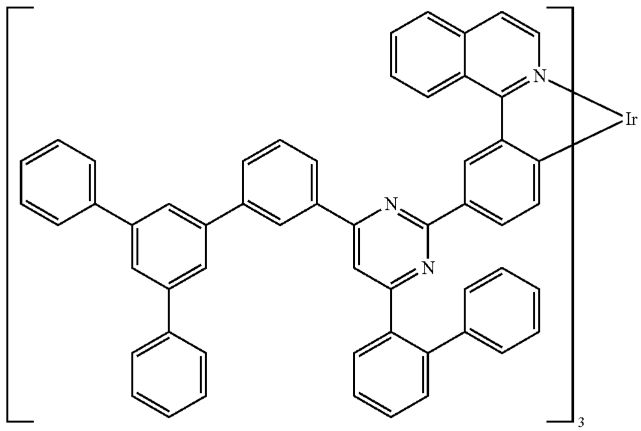
72
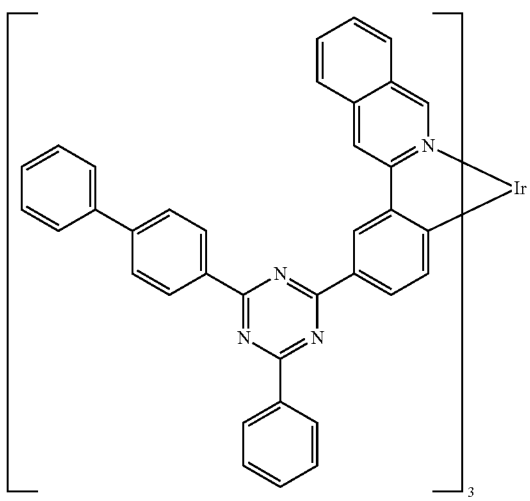
73
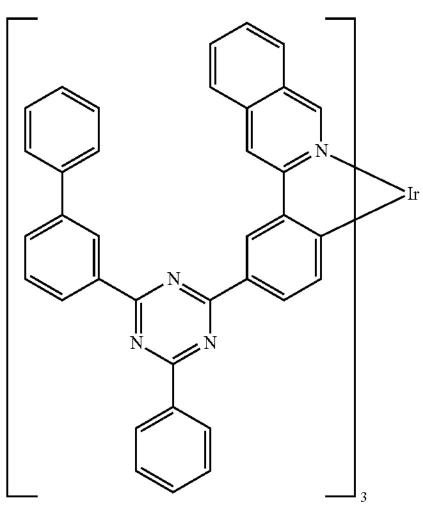
74

-continued
75
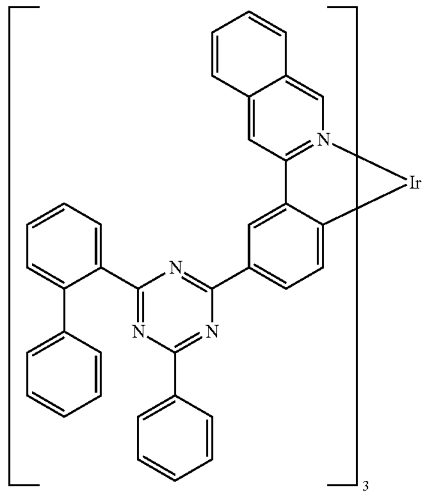
76
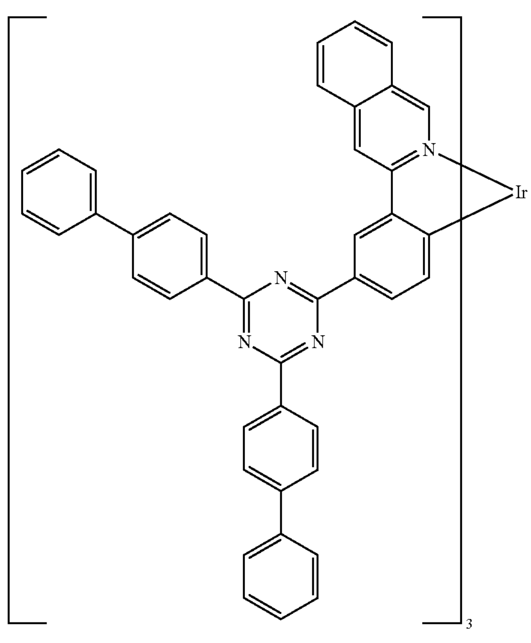

-continued
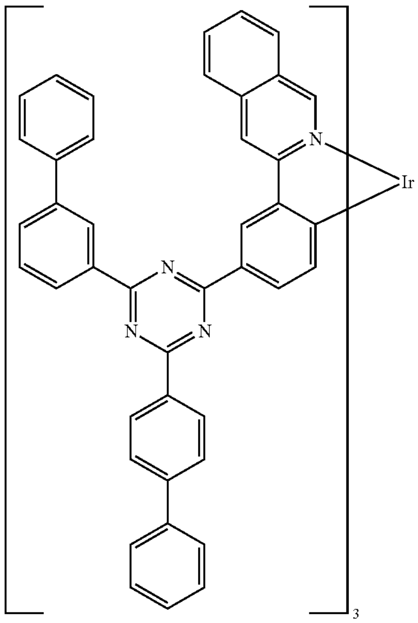
77
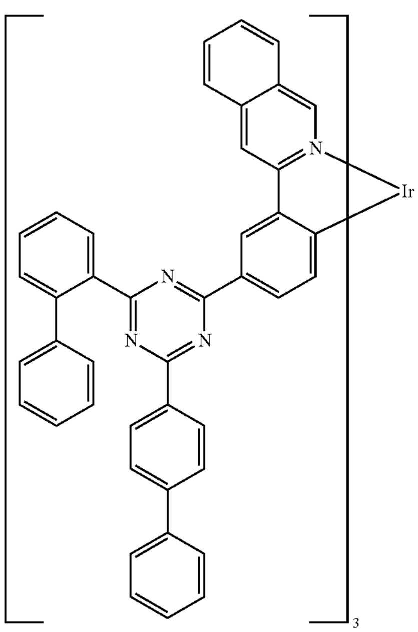
78

-continued
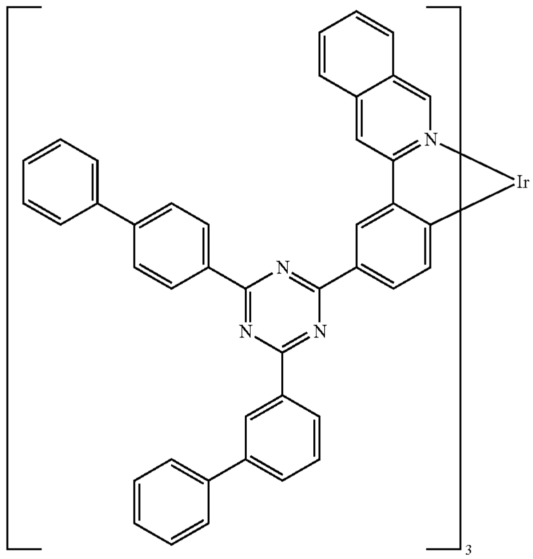
79
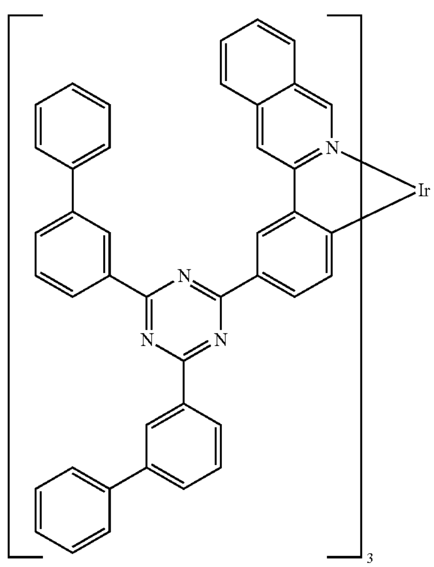
80

-continued
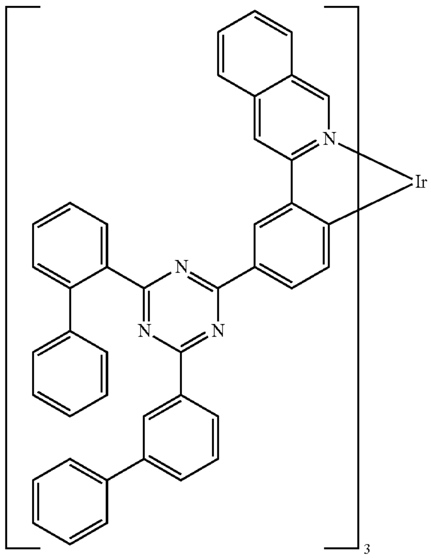
81
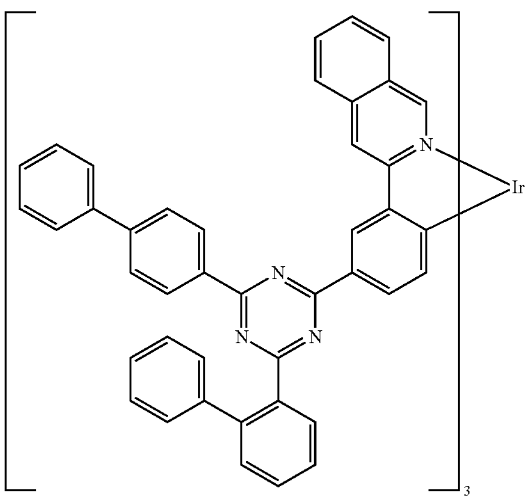
82
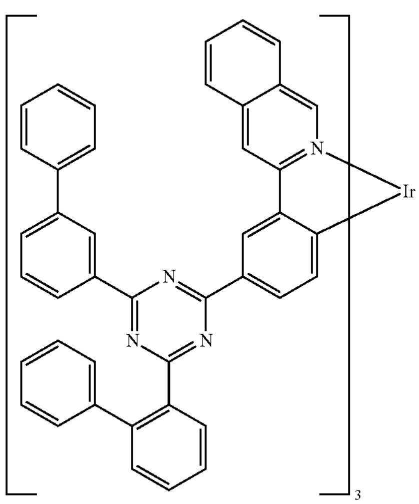
83

-continued
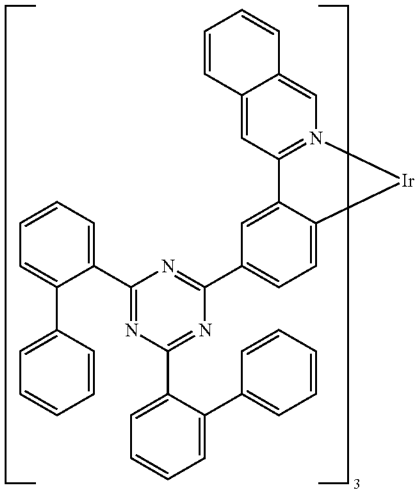
84
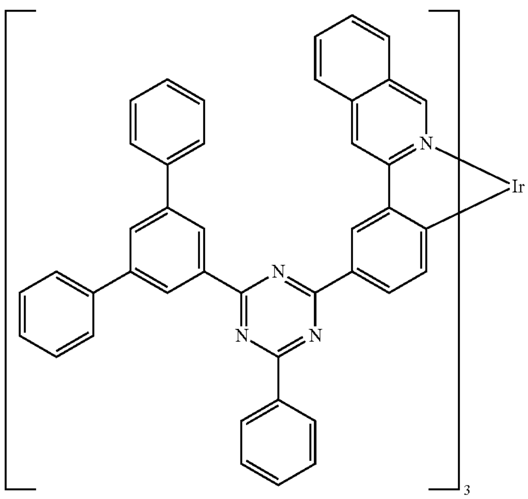
85
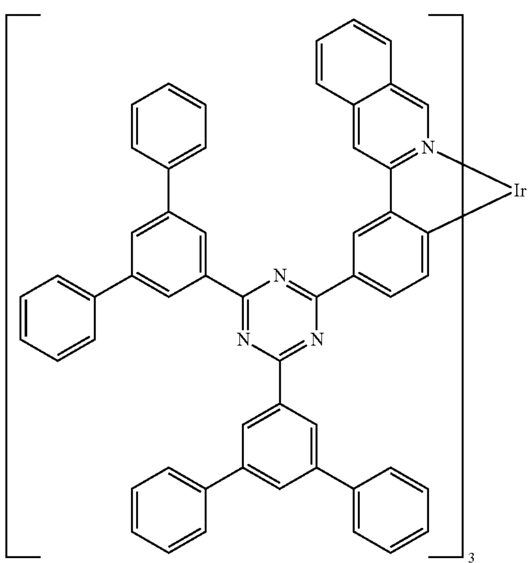
86

-continued
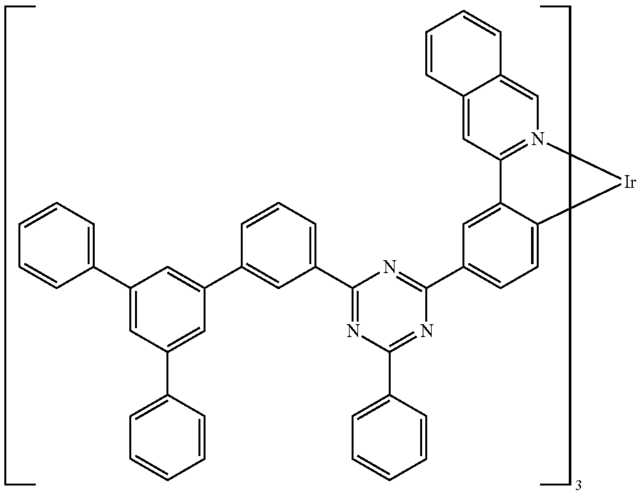
87
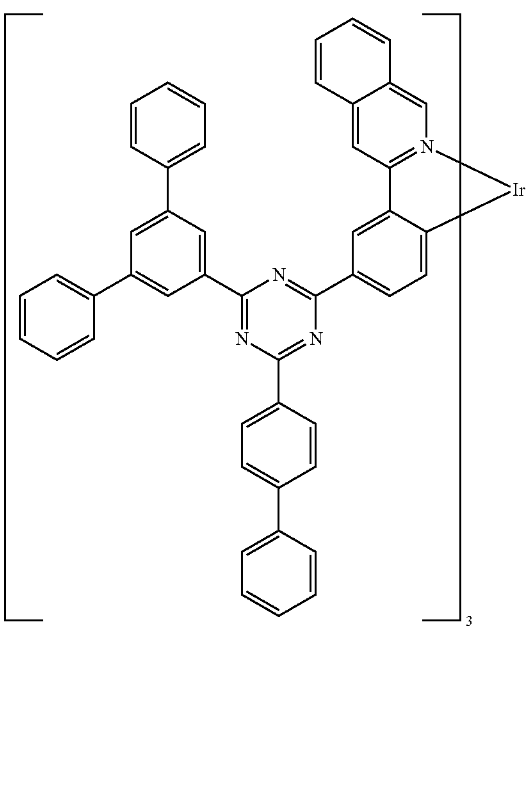
88

-continued
89
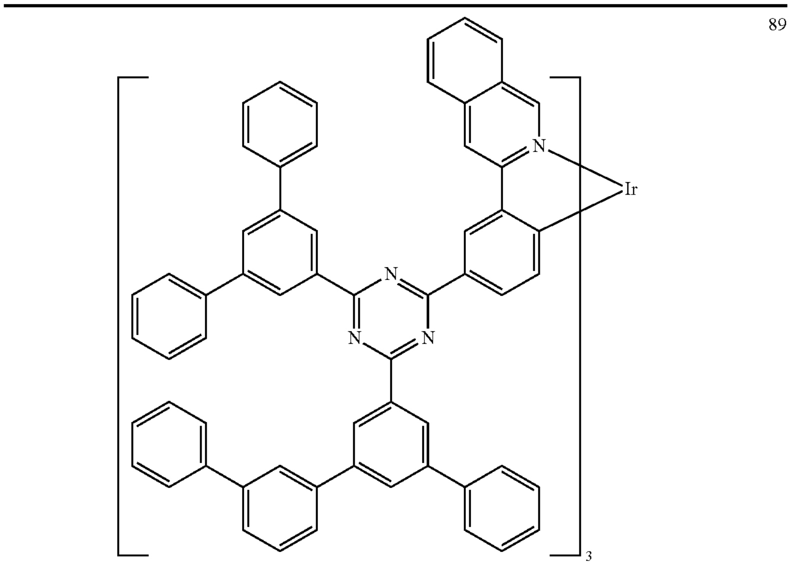
90
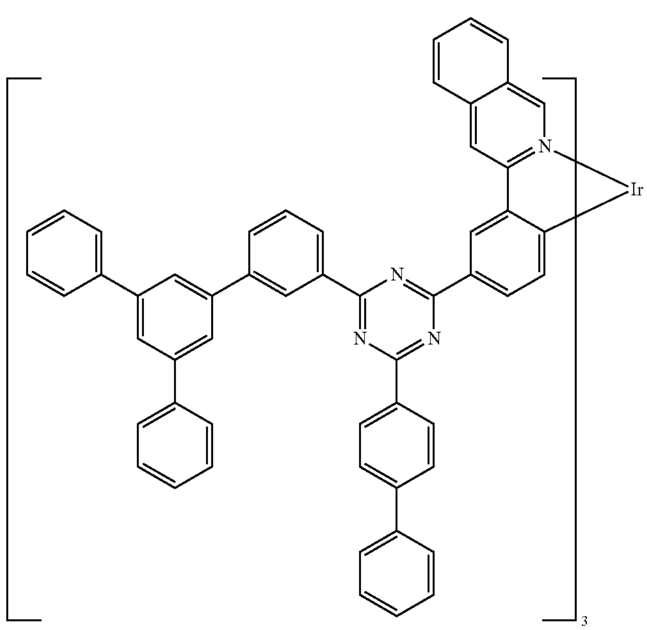

-continued
91
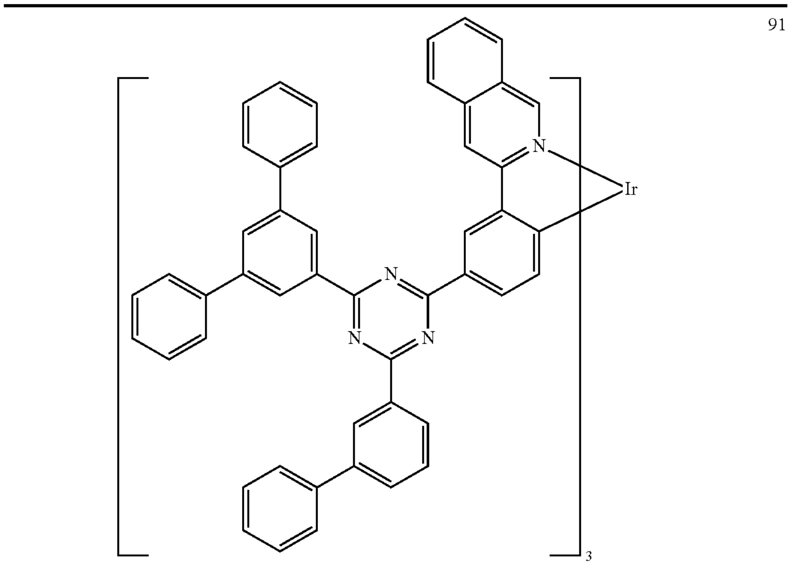
92
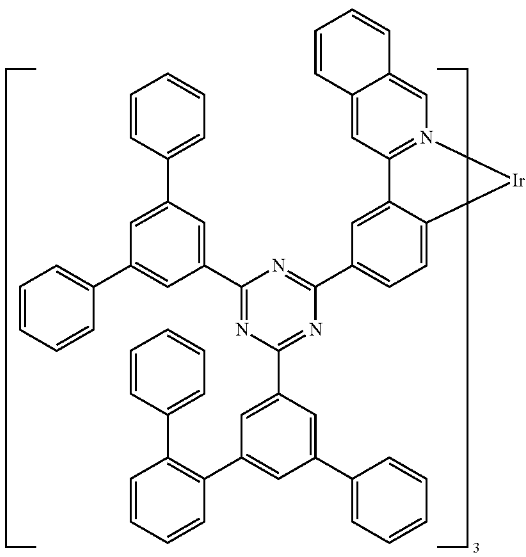
93
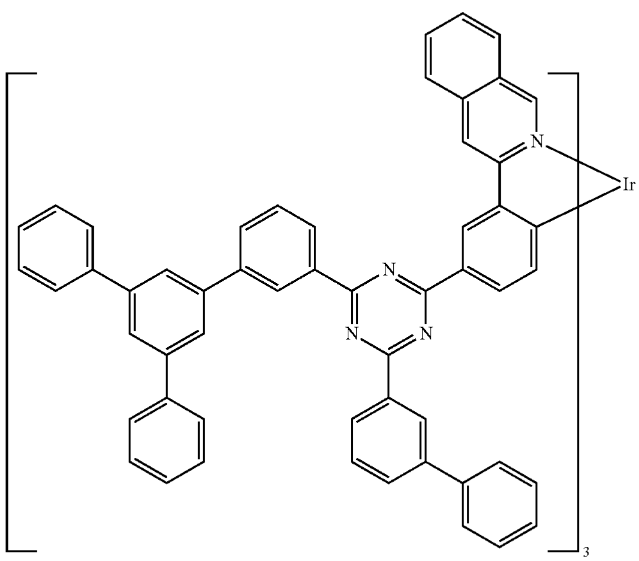

-continued
94
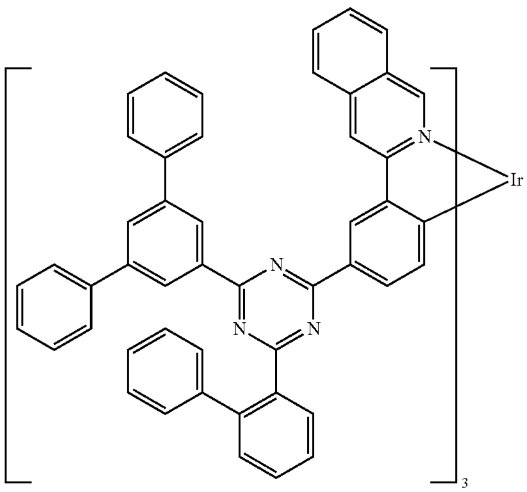
95
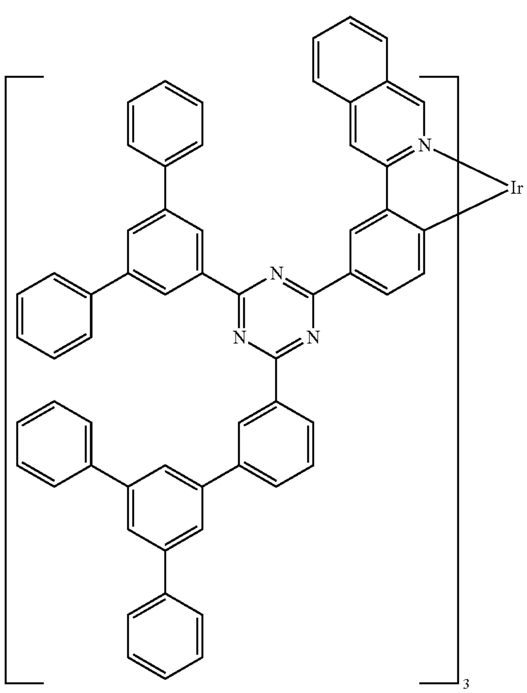

-continued
96
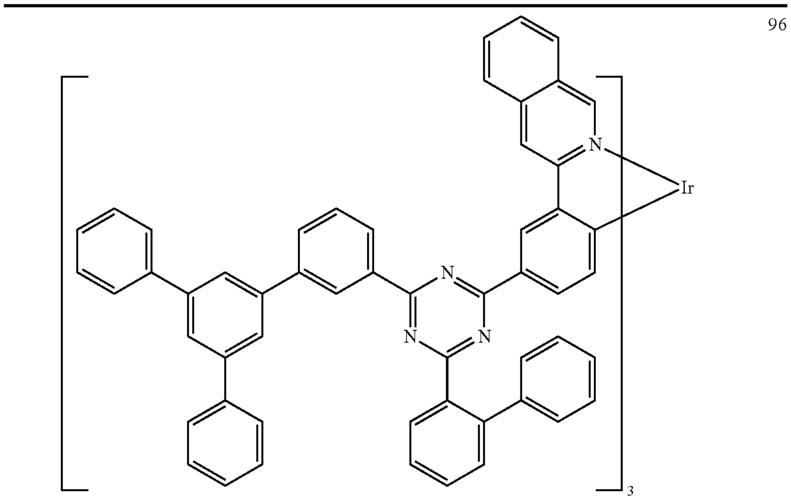
97
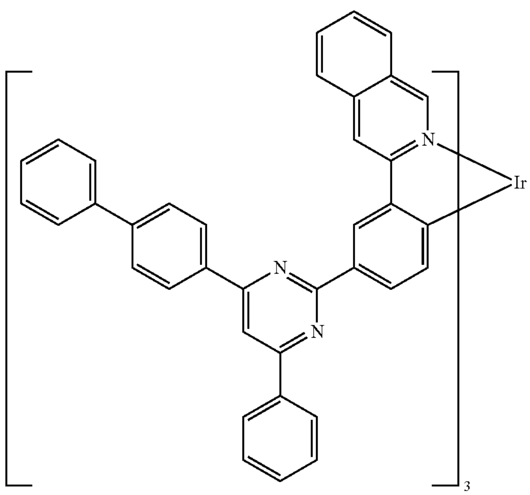
98
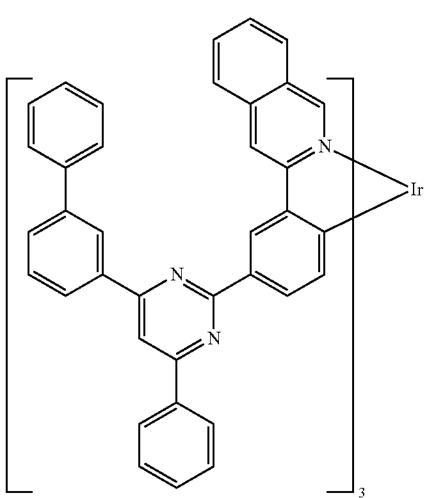

-continued
99
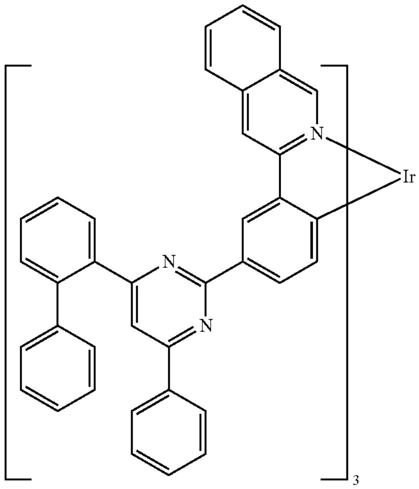
100
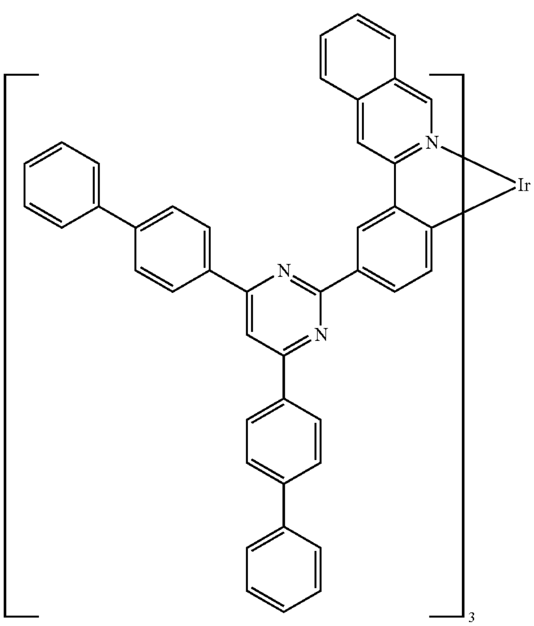

-continued
101
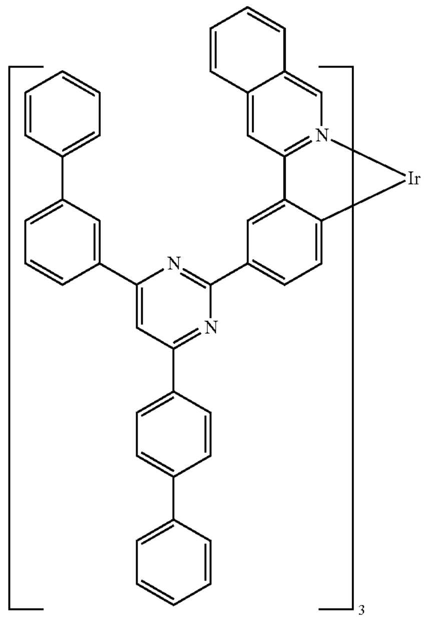
102
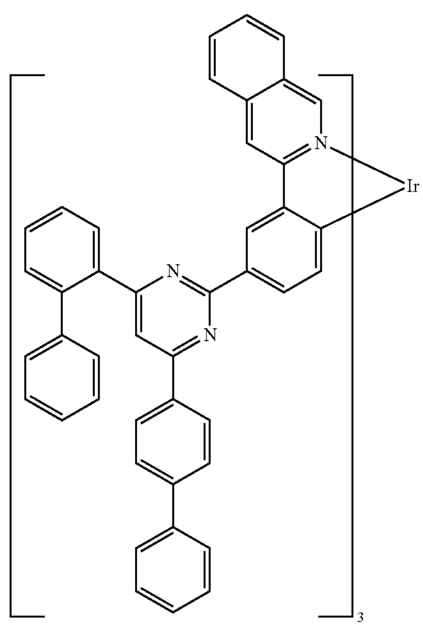

-continued
103
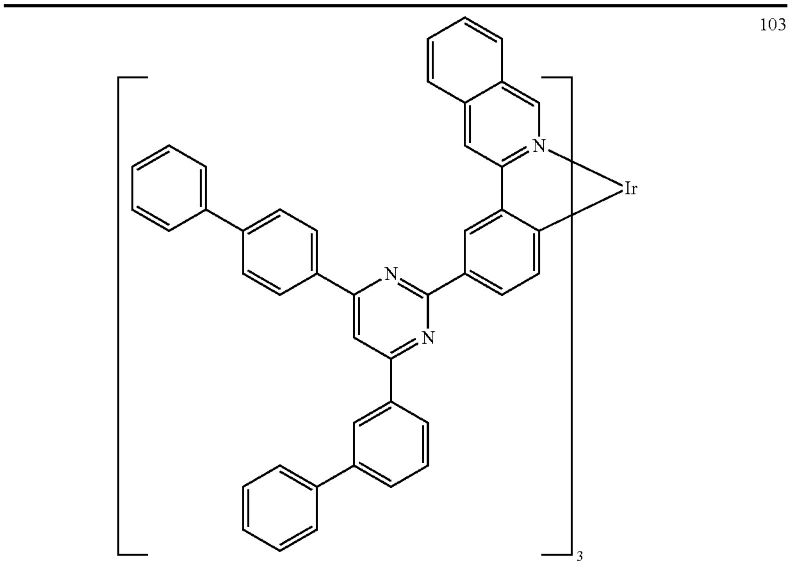
104
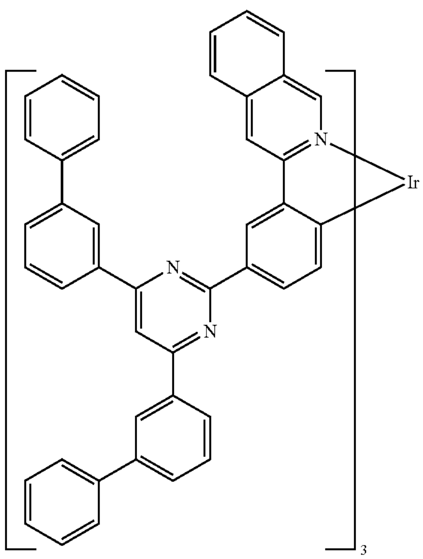
105
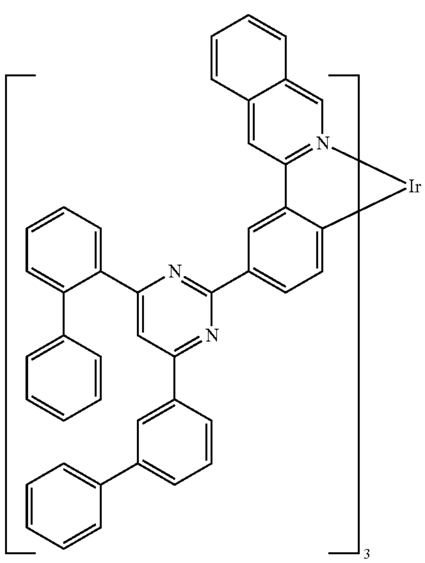

-continued
106
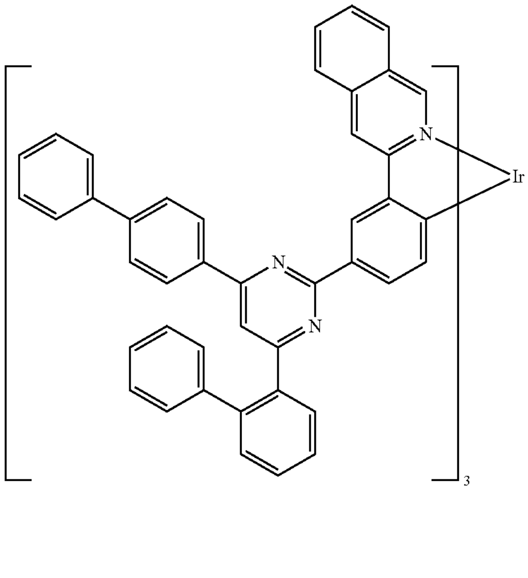
107
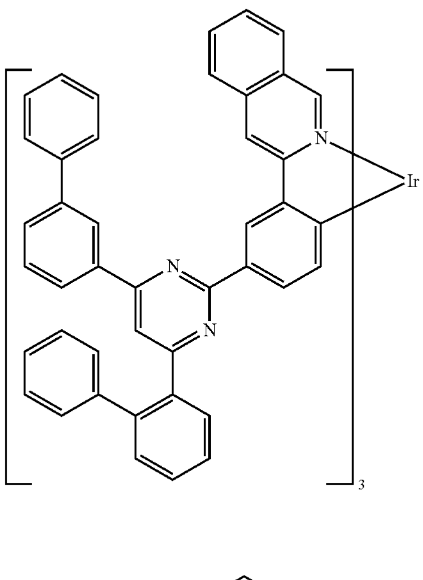
108
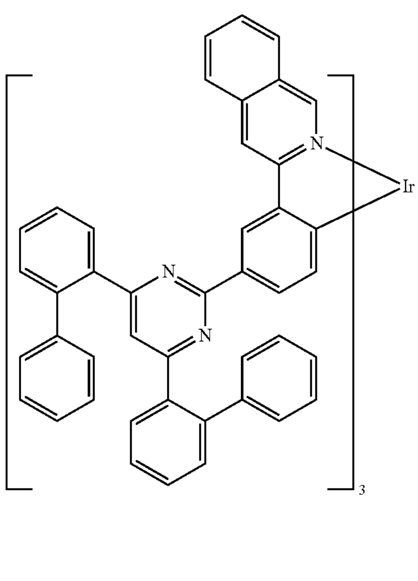

-continued
109
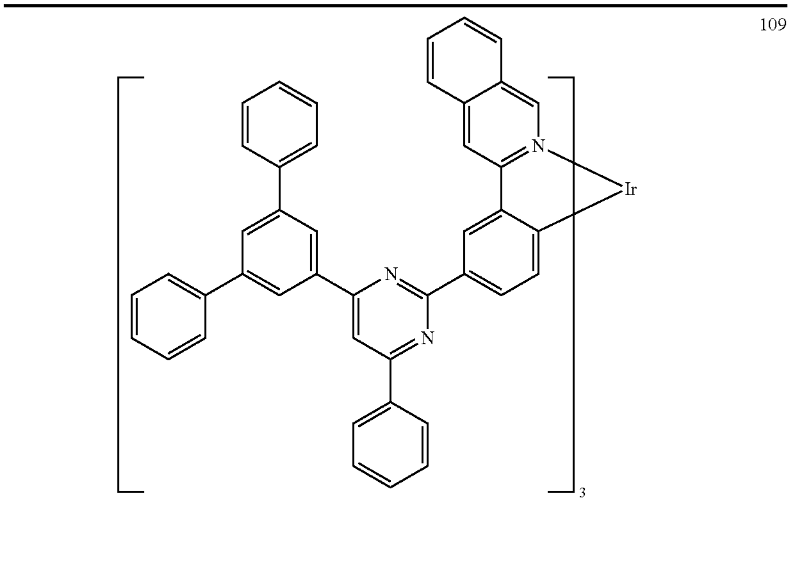
110
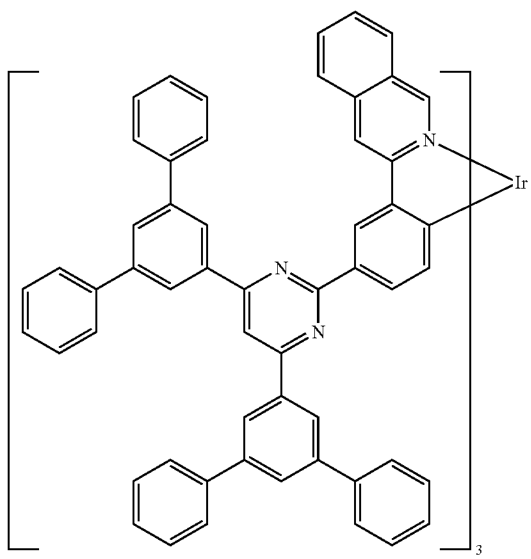
111
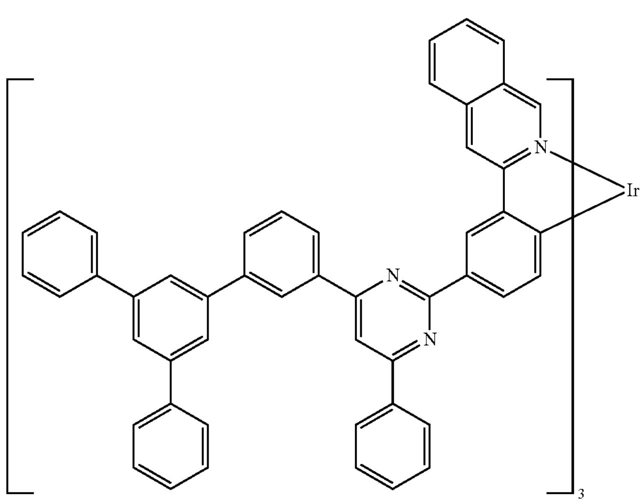

-continued
112
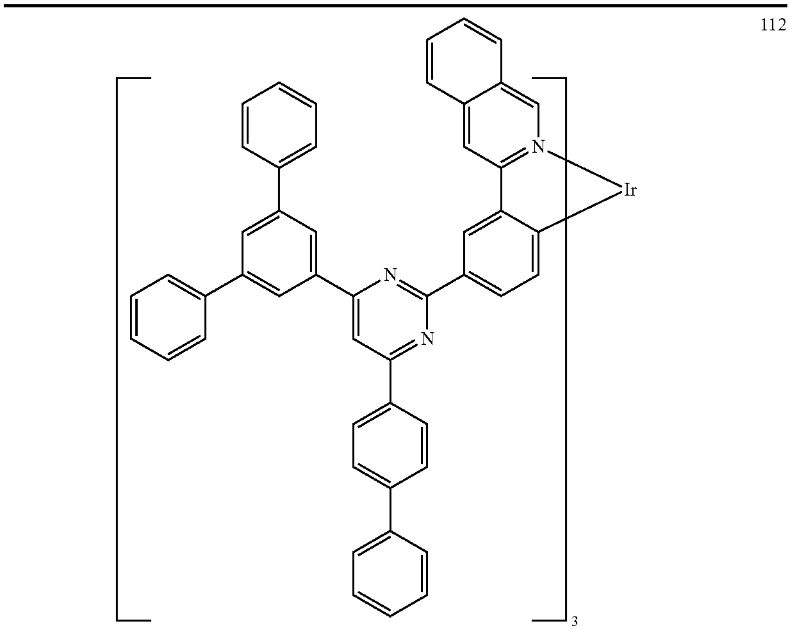
113
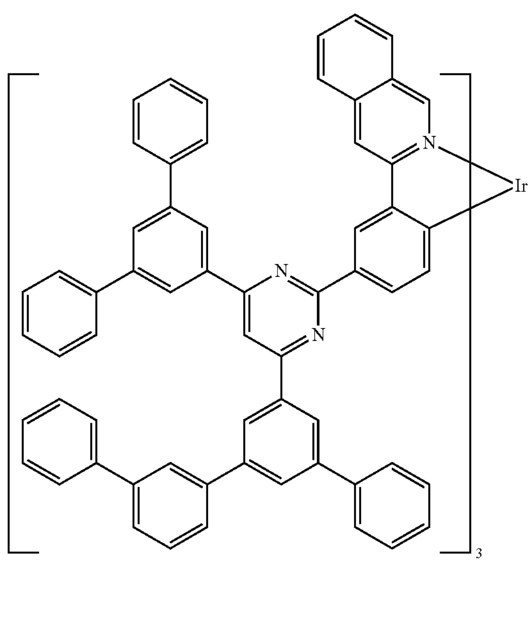

-continued
114
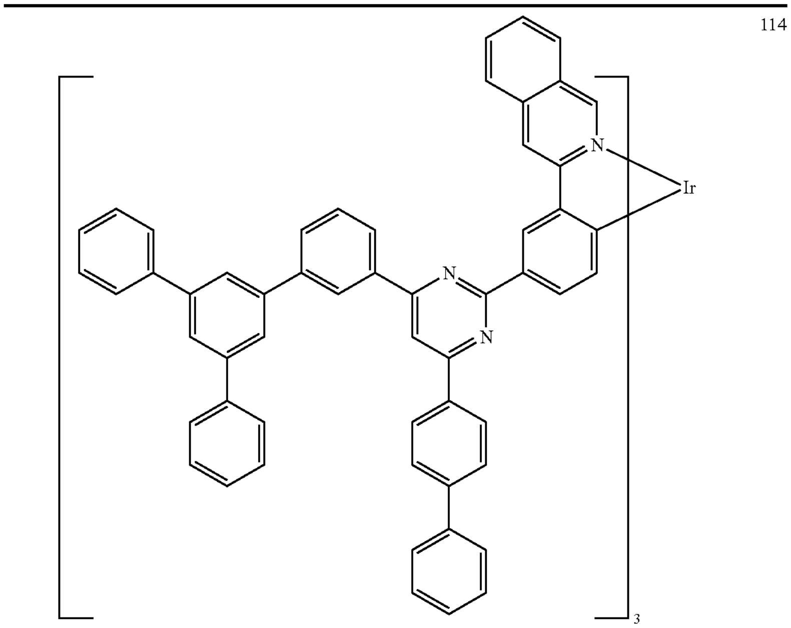
115
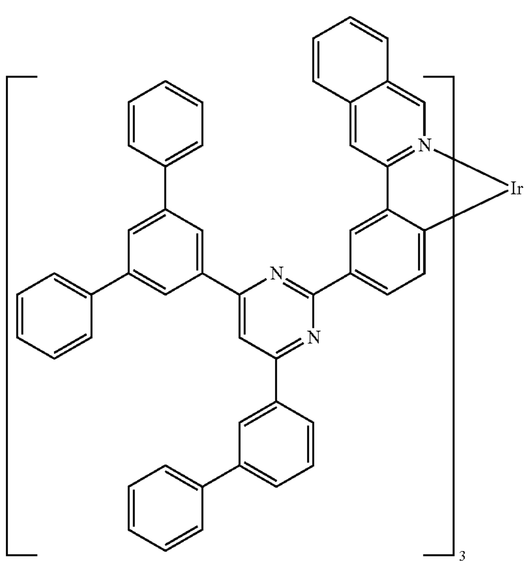

-continued
116
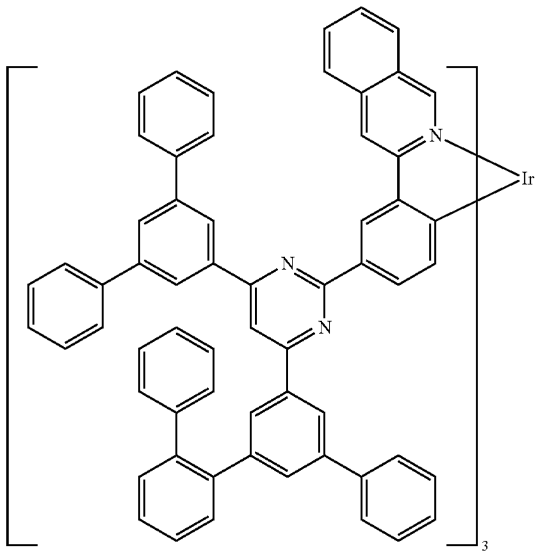
117
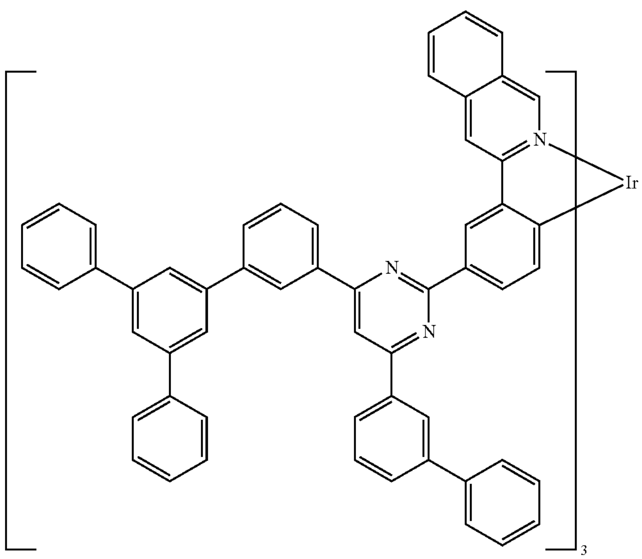
118
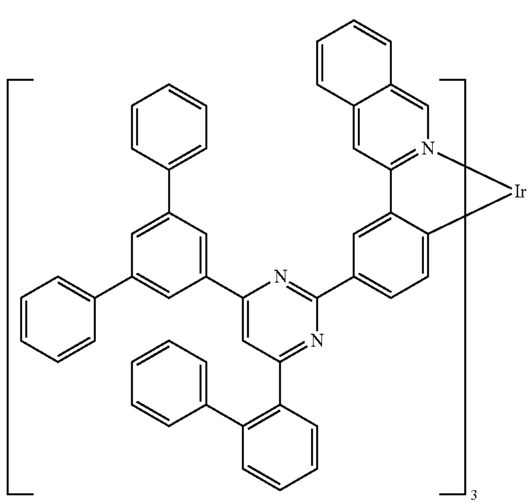

-continued
119
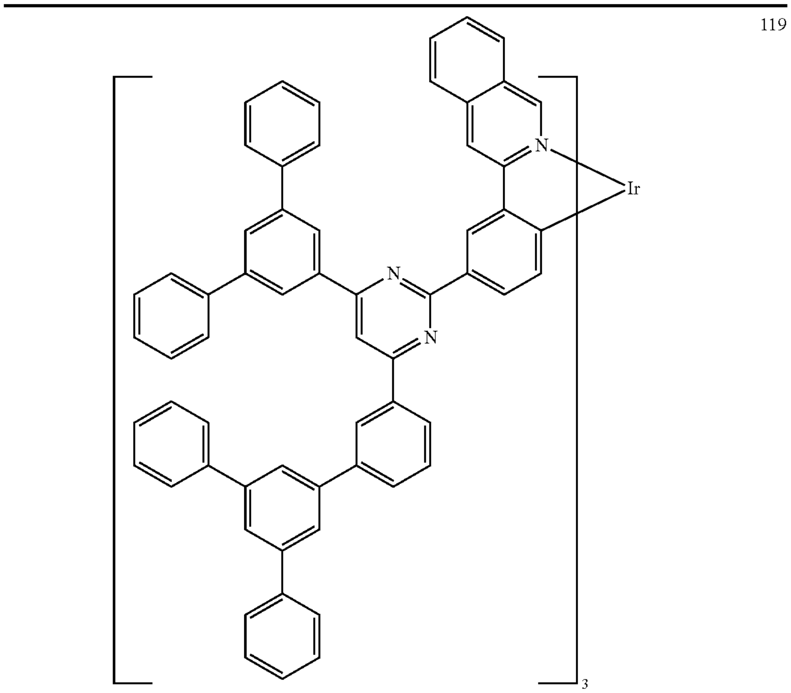
120
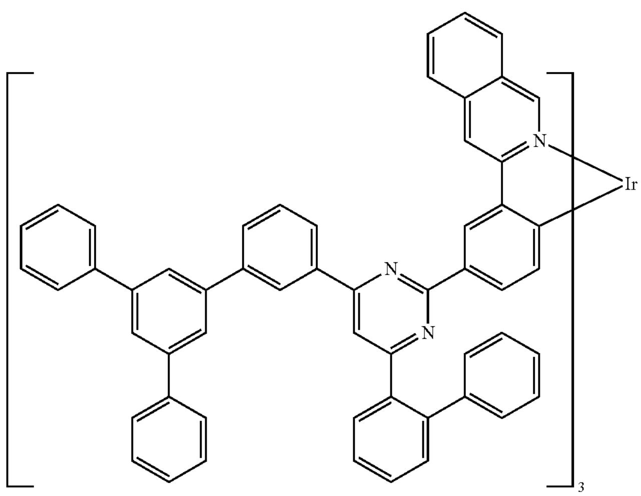
121
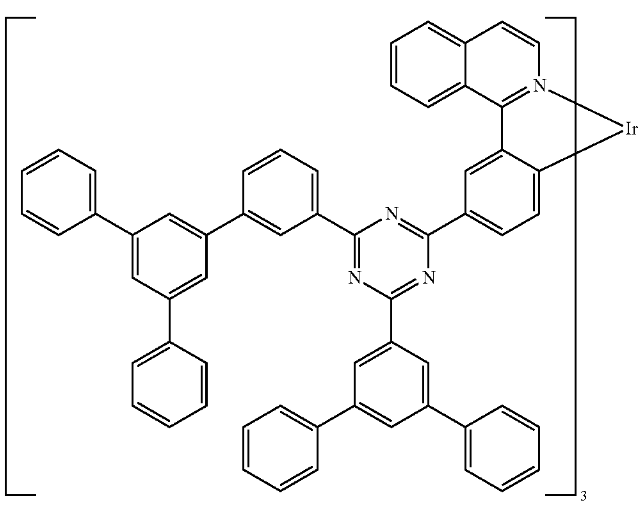

-continued
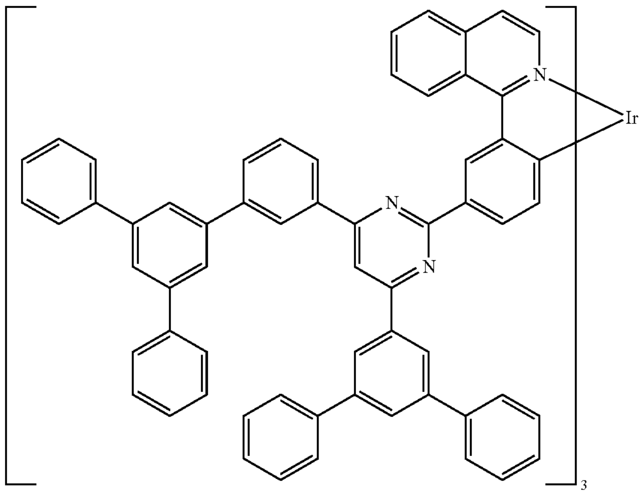
122
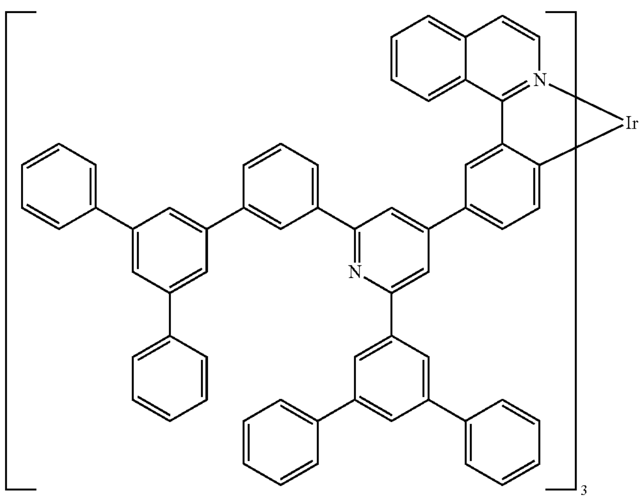
123
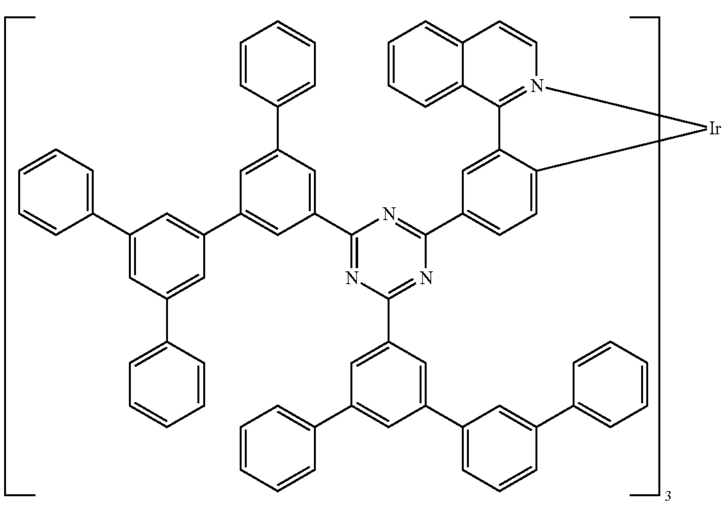
124

-continued
125
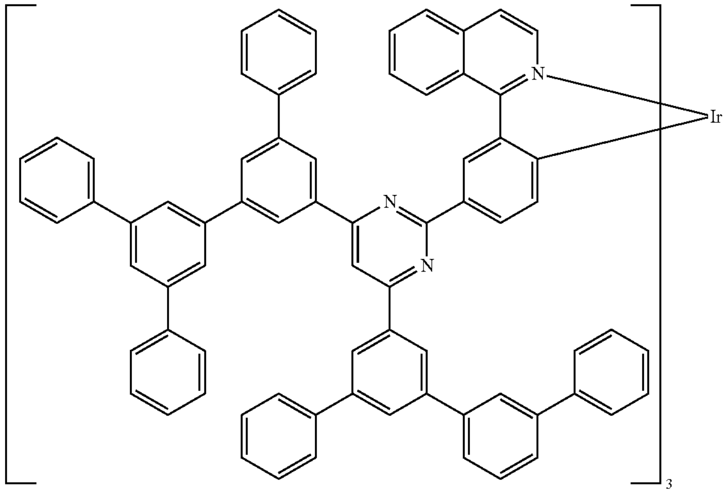
126
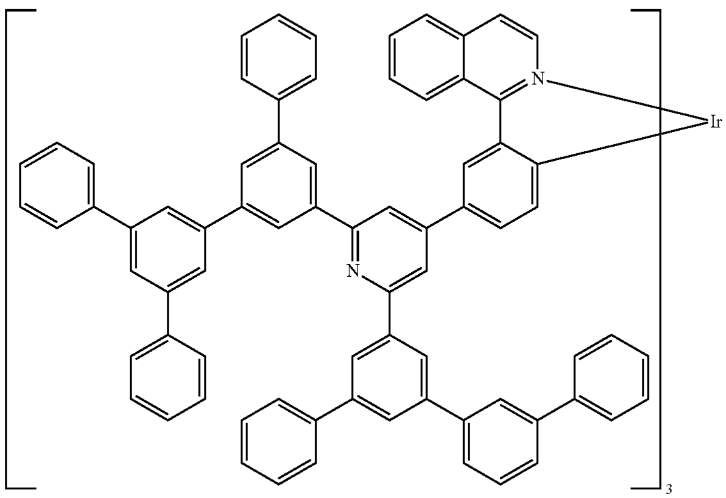
127
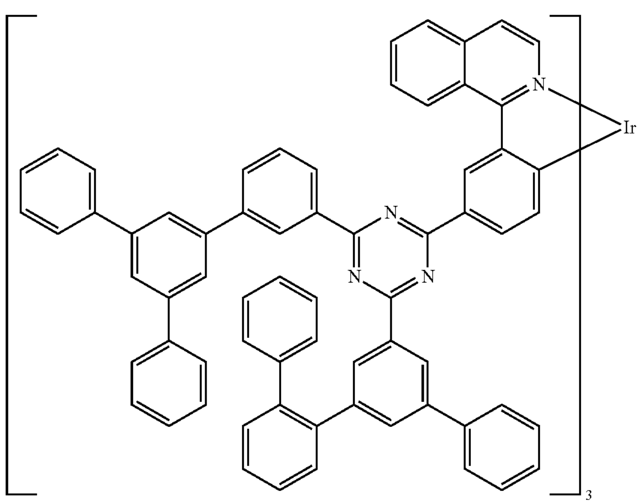

-continued
128
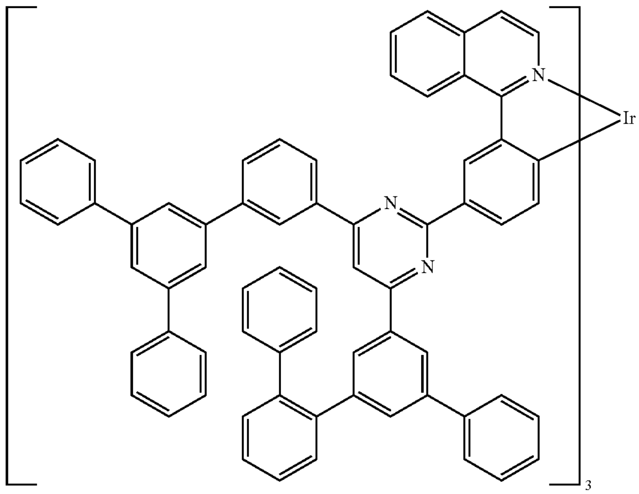
129
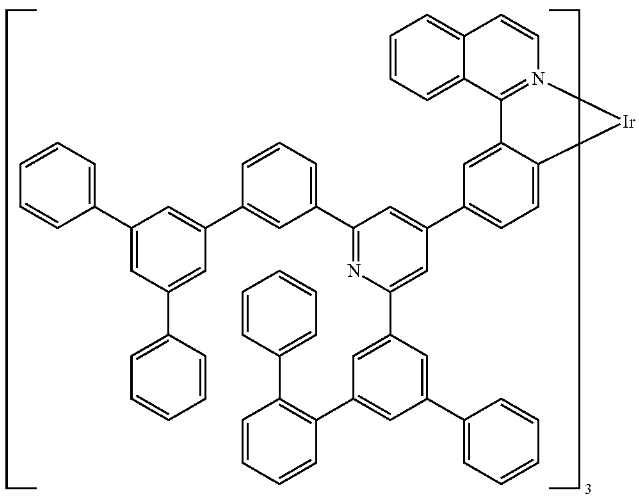
130
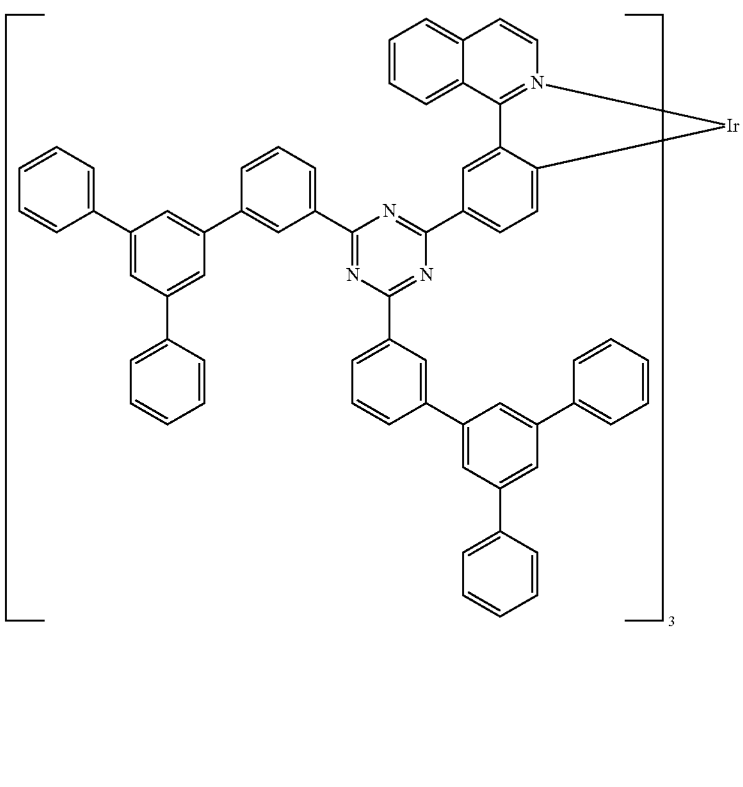

-continued
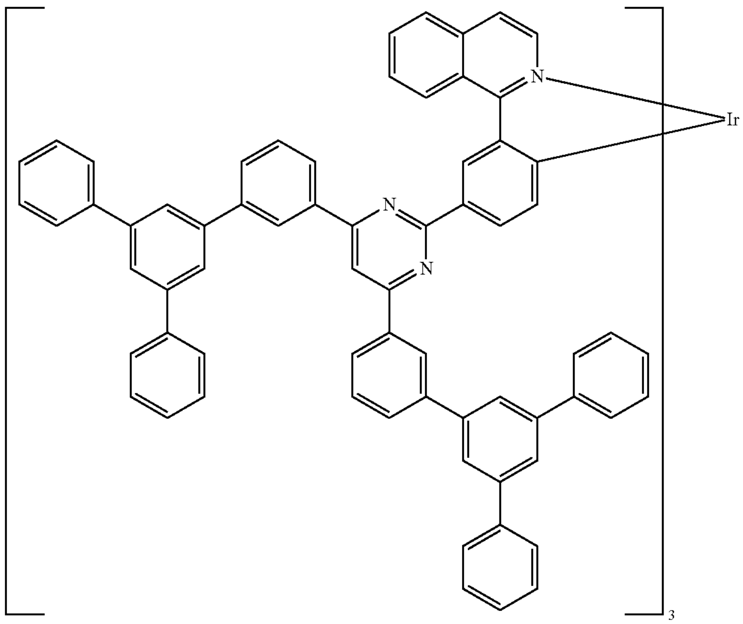
131
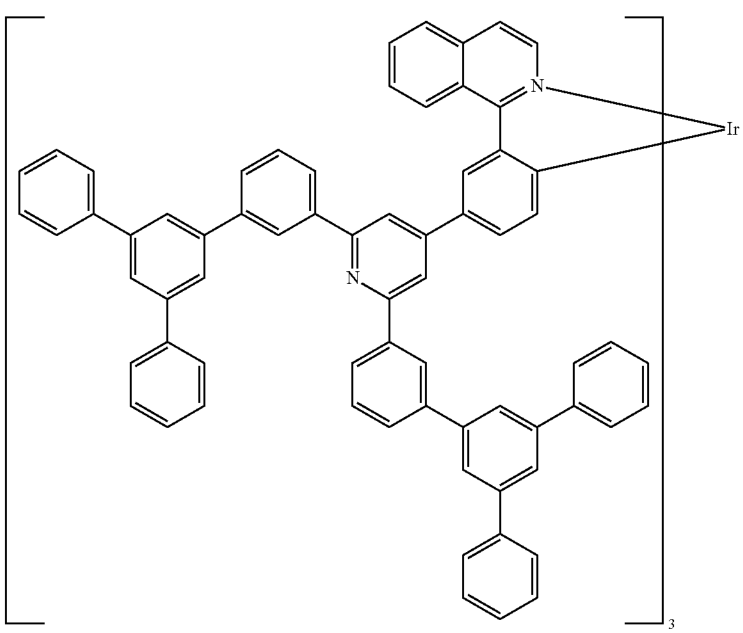
132

-continued
133
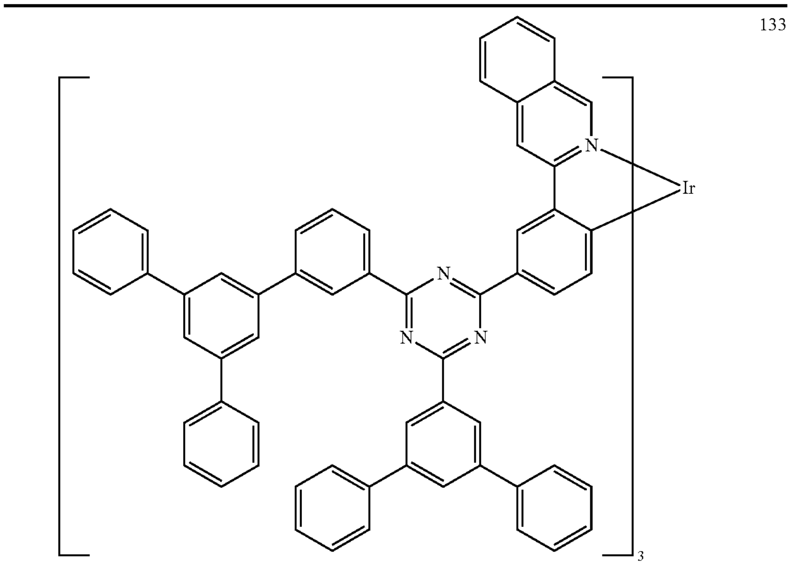
134
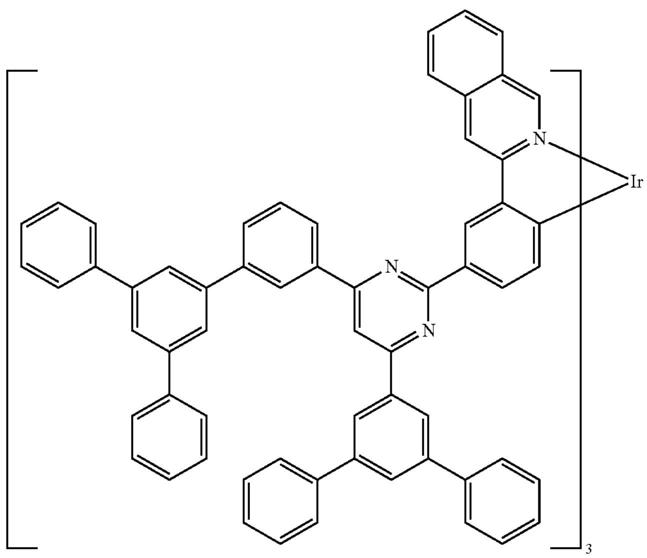
135
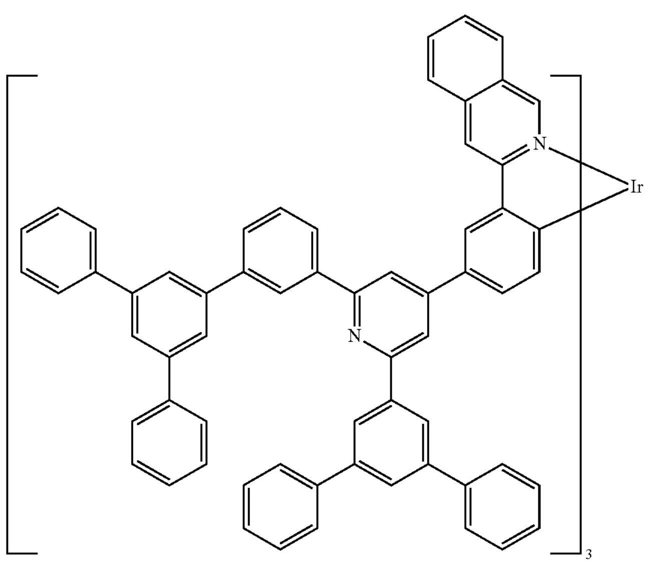

-continued
136
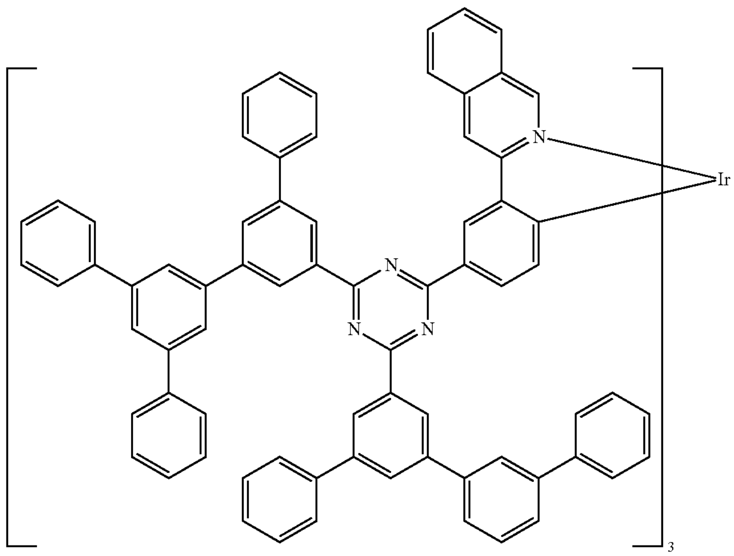
137
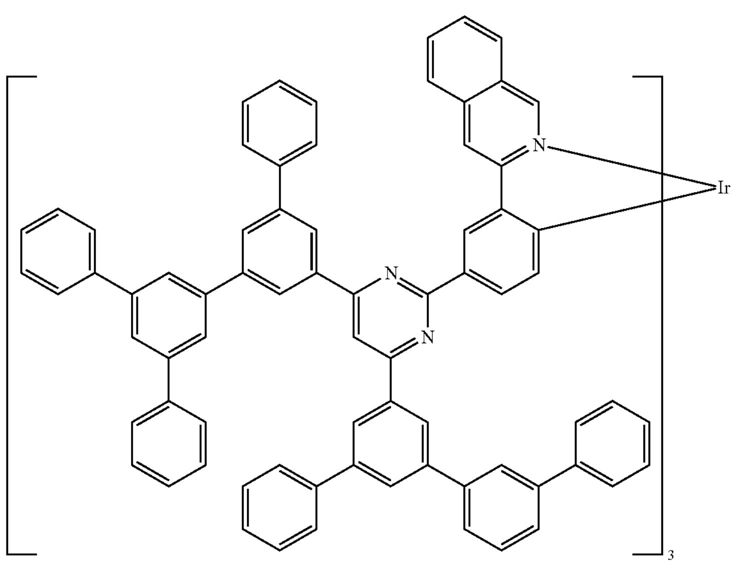

-continued
138
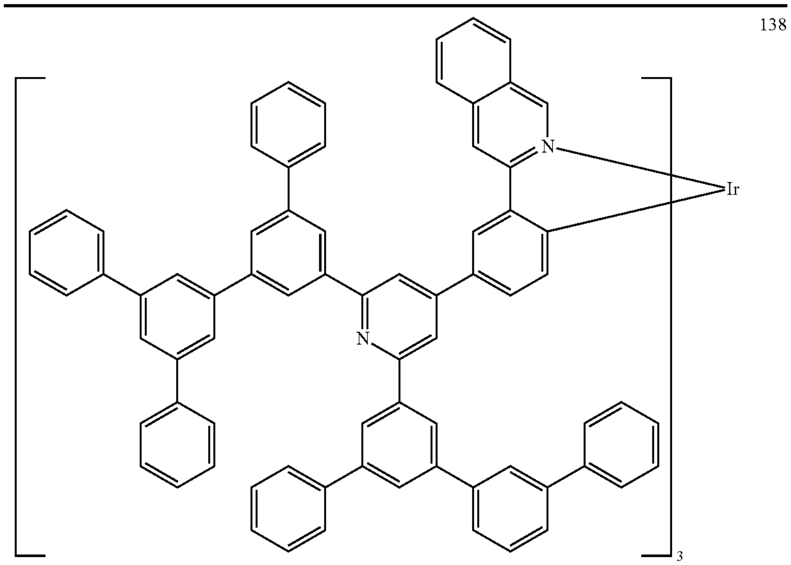
139
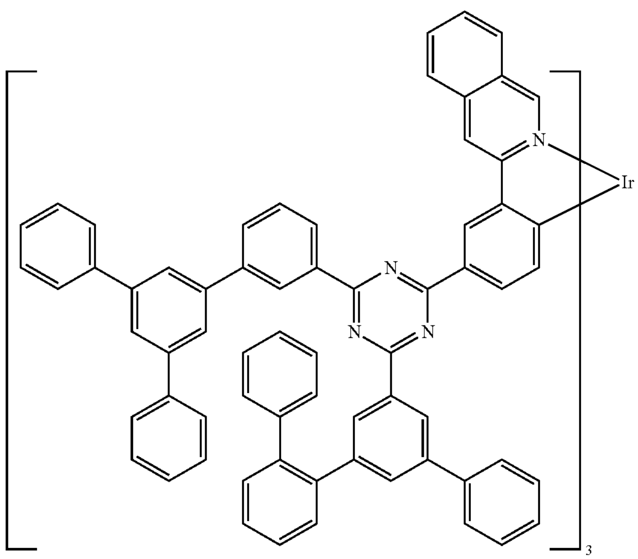
140
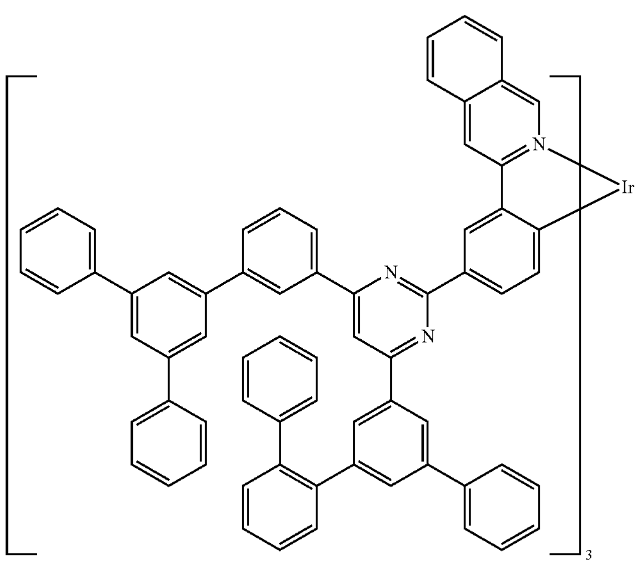

-continued
141
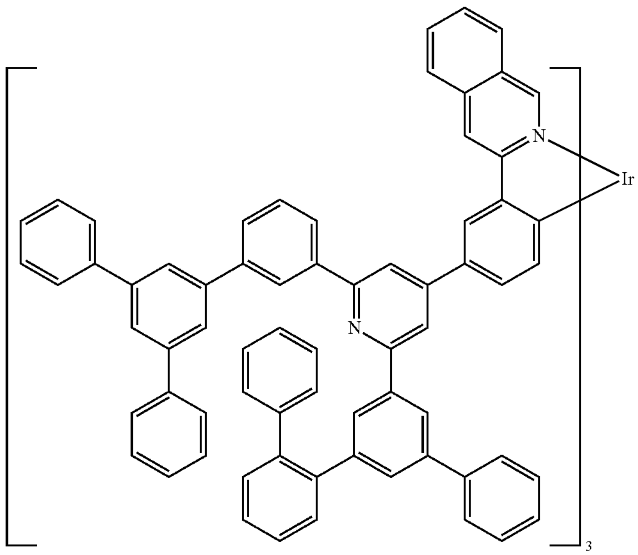
142
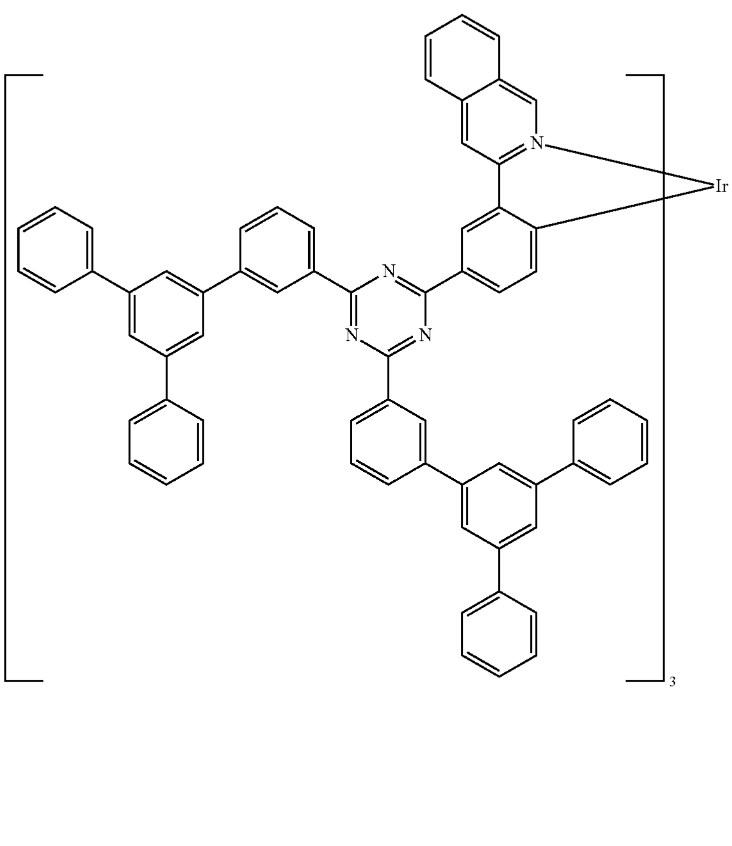

-continued

143

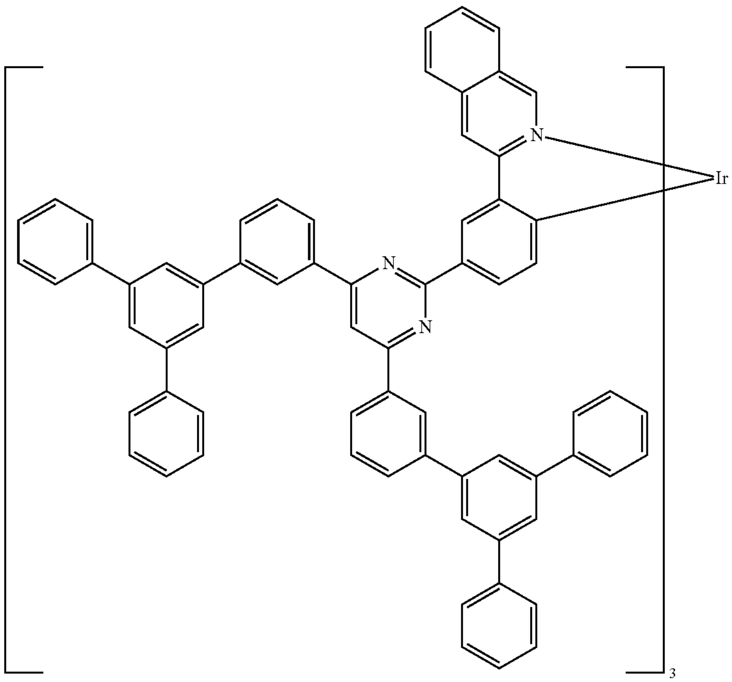

144

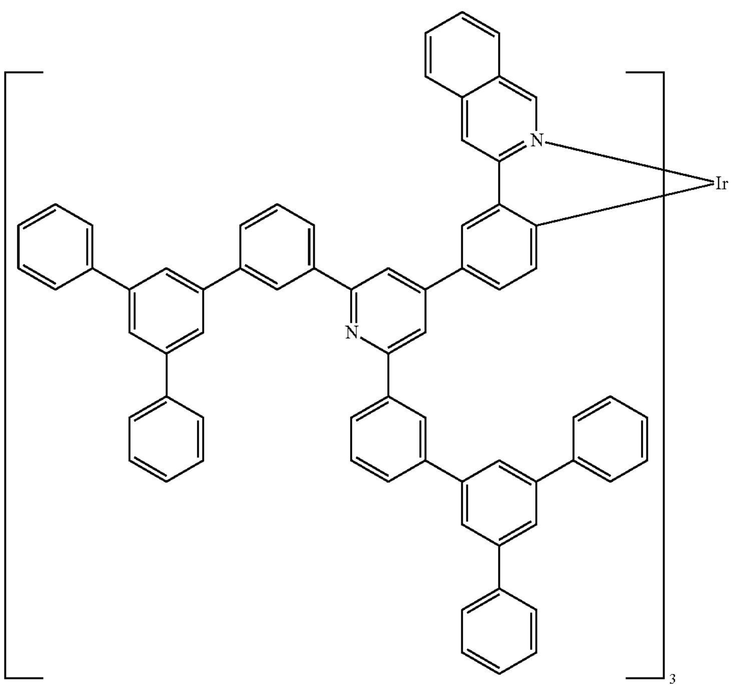

The metal complexes of the invention are preparable in principle by various processes. Thus, it is possible to use, as reactant, a metal complex having the same composition as the compound of the invention, except that it has, rather than the HetAr group, a reactive leaving group, for example a halogen, especially chlorine, bromine or iodine, or a boronic acid or a boronic ester. When the reactant has a halogen group, it is first converted to a corresponding boronic acid derivative, for example by palladium-catalyzed reaction with bis(pinacolato)diborane. This boronic acid derivative is then reacted in a Suzuki coupling reaction under palladium catalysis with a compound HetAr-Hal where Hal is a halogen, especially chlorine or bromine, to give the inventive compound of the formula (1). This is shown in schematic form below:

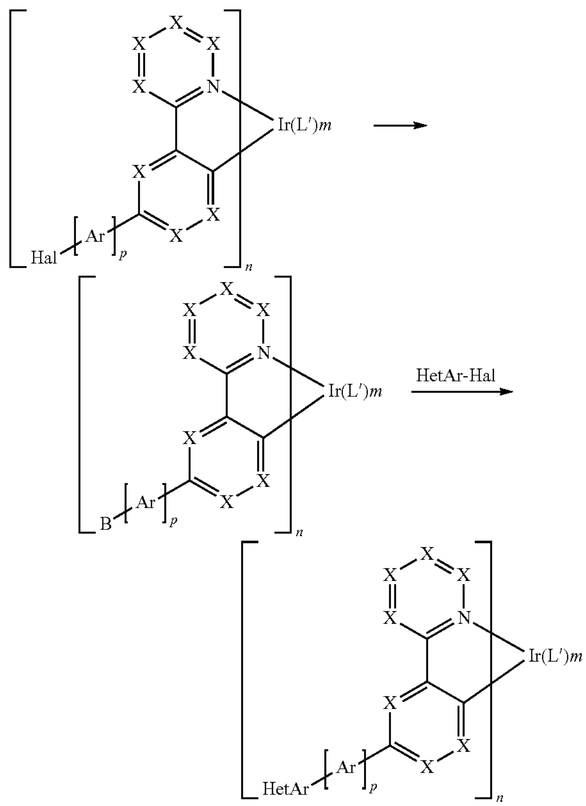

where Hal is a halogen, especially chlorine, bromine or iodine, and B is a boronic acid or a boronic ester.

Additionally suitable is a process for preparing the compounds of formula (1) by reacting the corresponding free ligands L and optionally L' with iridium alkoxides of the formula (40), with iridium ketoketonates of the formula (41), with iridium halides of the formula (42), with dimeric iridium complexes of the formula (43) or with iridium complexes of the formula (44)

Formula (40)

$Ir(OR^1)_n$

Formula (41)

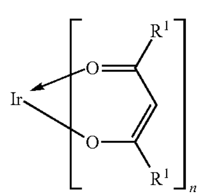

Formula (42)

$IrHal_n$

Formula 43)

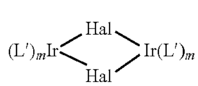

Formula (44)

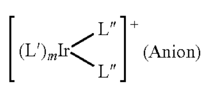

where the symbols and indices m, n and $R^1$ have the definitions given above, Hal=F, Cl, Br or I, L" is an alcohol, especially an alcohol having 1 to 4 carbon atoms or a nitrile, especially acetonitrile or benzonitrile, and (Anion) is a non-coordinating anion, for example triflate.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)]$, metal complexes with acetylacetonate derivatives as ligand, for example $Ir(acac)_3$ or tris(2,2,6,6-tetramethylheptane-3,5-dionato)iridium, and $IrCl_3 \cdot xH_2O$ where x is typically a number from 2 to 4.

The synthesis can also be conducted by reacting the ligands L with iridium complexes of the formula $[Ir(L')_2(HOMe)_2]A$ or $[Ir(L')_2(NCMe)_2]A$ or by reacting the ligands L' with iridium complexes of the formula $[Ir(L)_2(HOMe)_2]A$ or $[Ir(L)_2(NCMe)_2]A$, where A in each case is a non-coordinating anion, for example triflate, tetrafluoroborate, hexafluorophosphate, etc., in dipolar protic solvents, for example ethylene glycol, propylene glycol, glycerol, diethylene glycol, triethylene glycol, etc.

The synthesis of the complexes is preferably conducted as described in WO 2002/060910 and in WO 2004/085449. Heteroleptic complexes can be synthesized, for example, according to WO 05/042548 as well. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metalated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, 1,2-, 1,3- or 1,4-bisphenoxybenzene, triphenylphosphine oxide, 18-crown-6, phenol, 1-naphthol, hydroquinone, etc.

It is possible by these processes, if necessary followed by purification, for example recrystallization or sublimation, to obtain the inventive compounds of formula (1) in high purity, preferably more than 99% (determined by means of $^1H$ NMR and/or HPLC).

In the compounds of the invention, it is also possible to further increase solubility by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Soluble compounds are of particularly good suitability for processing from solution, for example by printing methods.

For the processing of the compounds of the invention from a liquid phase, for example by spin-coating or by printing methods, formulations of the compounds of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The above-described compounds of formula (1) and the above-detailed preferred embodiments can be used as active component in the electronic device. The present invention thus further provides for the use of a compound of the invention in an electronic device. The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer comprising at least one compound of the above-detailed formula (1). Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) and organic laser diodes (O-lasers), comprising at least one compound of the above-detailed formula (1) in at least one layer. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce.

In a preferred embodiment of the invention, the organic electroluminescent device comprises the compound of formula (1) or the above-detailed preferred embodiments as emitting compound in one or more emitting layers.

When the compound of formula (1) is used as emitting compound in an emitting layer, it is preferably used in combination with one or more matrix materials. The mixture of the compound of formula (1) and the matrix material contains between 0.1% and 99% by weight, preferably between 1% and 90% by weight, more preferably between 3% and 40% by weight and especially between 5% and 15% by weight of the compound of formula (1), based on the overall mixture of emitter and matrix material.

Correspondingly, the mixture contains between 99.9% and 1% by weight, preferably between 99% and 10% by weight, more preferably between 97% and 60% by weight and especially between 95% and 85% by weight of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579.

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the inventive complexes of formula (1) as co-matrix for longer-wave emitting triplet emitters, for example for green- or red-emitting triplet emitters.

The compounds of the invention can also be used in other functions in the electronic device, for example as hole transport material in a hole injection or transport layer, as charge generation material or as electron blocker material. It is likewise possible to use the complexes of the invention as matrix material for other phosphorescent metal complexes in an emitting layer.

The compounds of the invention are especially also suitable as phosphorescent emitters in organic electroluminescent devices, as described, for example, in WO 98/24271, US 2011/0248247 and US 2012/0223633. In these multicolor display components, an additional blue emission layer is applied by vapor deposition over the full area to all pixels, including those having a color other than blue. It was found here that the compounds of the invention, when they are used as emitters for the red pixels, lead to very good emission together with the blue emission layer applied by vapor deposition.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O—SC) or the emission of light (OLED/PLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapor deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapor phase deposition) method or with the aid of a carrier gas sublimation. In this case, the materials are applied at a pressure between $10^{-5}$ mbar and 1 bar. A special case of this method is the OVJP (organic vapor jet printing) method, in which the materials are applied directly by a nozzle and thus structured (for example, M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution. It was found here that the compounds of the invention can be processed very efficiently from solution.

The organic electroluminescent device can also be produced as a hybrid system by applying one or more layers from solution and applying one or more other layers by vapor deposition. For example, it is possible to apply an emitting layer comprising a compound of formula (1) and a matrix material from solution, and to apply a hole blocker layer and/or an electron transport layer thereto by vapor deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

(1) The compounds of the invention have a very high photoluminescence quantum efficiency and, even when used in an organic electroluminescent device, lead to very high quantum efficiencies. More particularly, the quantum efficiencies are higher compared to metal complexes having ligands which have the same ligand base structure, but to which no HetAr group is bonded.

(2) The compounds of the invention, when used in an organic electroluminescent device, lead to a very good lifetime.

(3) Compounds of the invention having 1-phenylisoquinoline ligands have less deep red emission compared to corresponding metal complexes which have 1-phenylisoquinoline ligands, but to which no HetAr group is bonded. The improved color coordinates mean that the compounds of the invention have better suitability than the corresponding compounds according to the prior art for use in red-emitting organic electroluminescent devices.

These abovementioned advantages are not accompanied by a deterioration in the further electronic properties.

The invention is illustrated in detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from VWR, Sigma-ALDRICH or ABCR. The respective figures in square brackets or the numbers quoted for individual compounds relate to the CAS numbers of the compounds known from the literature.

Synthesis of Synthons

Preparation of Synthon S1:

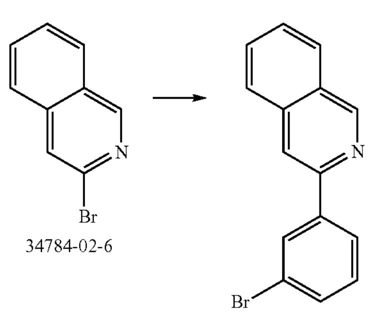 [SMILES: Brc1cc2ccccc2cn1 ; Brc1cccc(-c2cc3ccccc3cn2)c1]

To 3-bromoisoquinoline (20.7 g, 100 mmol), 3-bromophenylboronic acid (20 g, 100 mmol, CAS: 89598-96-9), sodium carbonate (23.2 g, 200 mmol) and tetrakis(triphenylphosphine)palladium(0) (1.2 g, 10 mmol) in a 1 L multineck flask are added 230 mL of dimethoxyethane, 100 mL of demineralized water and 75 mL of ethanol, and the mixture is inertized while stirring for 10 minutes. The reaction mixture is stirred at 70° C. overnight, cooled down to room temperature and diluted with water and dichloromethane. The organic phase is removed and the aqueous phase is re-extracted twice with dichloromethane. The organic phases are combined, washed with water, dried over $Na_2SO_4$ and filtered. The solvent is removed and the residue is recrystallized from acetonitrile, so as to obtain 21.9 g (7.7 mmol, 78% yield) of a colorless powder.

Preparation of Synthon S2:

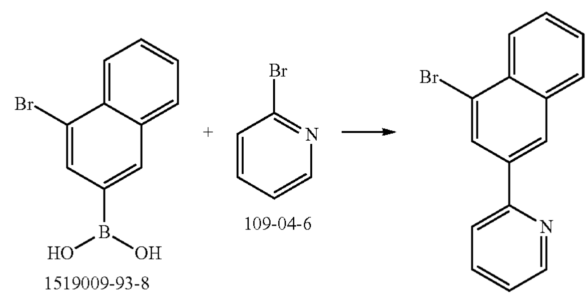 [SMILES: OB(O)c1cc(Br)c2ccccc2c1 ; Brc1ccccn1 ; Brc1cc(-c2ccccn2)cc2ccccc12]

To (4-bromo-2-naphthyl)boronic acid (25.1 g, 100 mmol), 2-bromopyridine (15.8 g, 100 mmol), sodium carbonate (23.2 g, 200 mmol) and tetrakis(triphenylphosphine)palladium(0) (1.2 g, 10 mmol) in a 1 L multineck flask are added 230 mL of dimethoxyethane, 100 mL of demineralized water and 75 mL of ethanol, and the mixture is inertized while stirring for 10 minutes. The reaction mixture is stirred at 70° C. overnight, cooled down to room temperature and diluted with water and dichloromethane. The organic phase is removed and the aqueous phase is re-extracted twice with dichloromethane. The organic phases are combined, washed with water, dried over $Na_2SO_4$ and filtered. The solvent is removed and the residue is recrystallized from acetonitrile, so as to obtain 19.6 g (69 mmol, 69% yield) of a colorless powder.

Further Synthons Known from the Literature

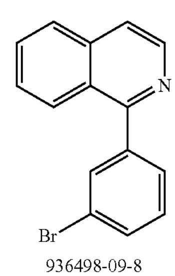

S3

-continued

S4

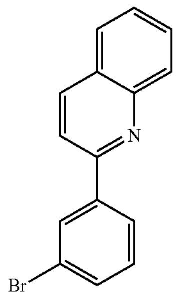

108062-54-0

S5

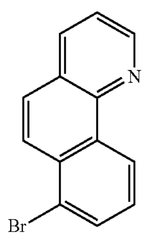

31493-29-5

Conversion of the Bromides to Pinacolborane Esters

General Synthesis Method for Preparation of the Pinacolborane Ester

A 4 liter four-neck flask with precision glass stirrer, reflux condenser, protective gas connection and thermometer is initially charged with the aryl bromide (880 mmol), bis(pinacolato)diborane (265 g, 1.044 mol, 1.2 eq.) and potassium acetate (260 g, 2.65 mol, 3 eq.), the contents are purged with protective gas, and 2 liters of dried 1,4-dioxane are added. The 1,1-bis(diphenylphosphino)ferrocenedichloropalladium(II) catalyst (3.6 g, 4.4 mmol, 0.005 eq.) is added, and the reaction mixture is stirred at 110° C. overnight. After cooling, 500 mL of ethyl acetate and 500 mL of water are added. The phases are separated and the aqueous phase is extracted with 200 mL of ethyl acetate. The organic phases are combined, washed repeatedly with water and saturated NaCl solution and dried over sodium sulfate. The solvent is drawn off on a rotary evaporator. The black solid is dissolved in a mixture of heptane/ethyl acetate (2:1), filtered through a glass frit with silica gel and Celite and washed through with the solvent mixture. The orange solution is freed of the solvent on a rotary evaporator and the residue is recrystallized from heptane. Colorless crystals are obtained.

Analogously to the general method, it is possible to prepare the following synthons:

| Ex. | Reactant | Product | Yield |
|---|---|---|---|
| S6 | 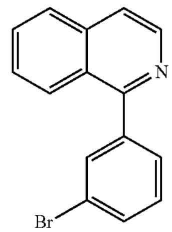 [SMILES: Brc1cccc(-c2nccc3ccccc23)c1] | 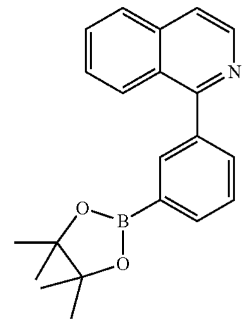 [SMILES: CC1(C)OB(c2cccc(-c3nccc4ccccc34)c2)OC1(C)C] | 91% |
| S7 | 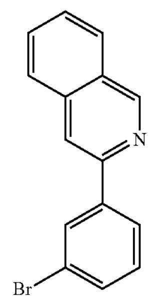 | 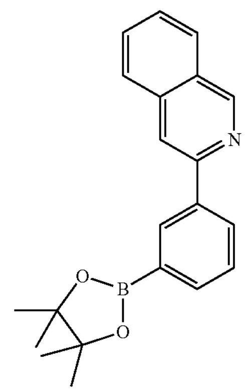 [SMILES: CC1(C)OB(c2cccc(-c3cc4ccccc4cn3)c2)OC1(C)C] | 87% |
| S8 | 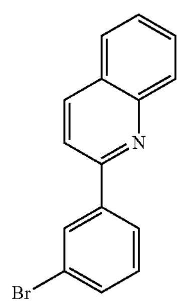 [SMILES: Brc1cccc(-c2ccc3ccccc3n2)c1] | 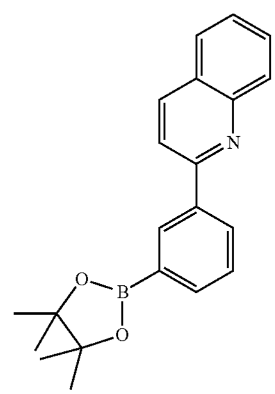 [SMILES: CC1(C)OB(c2cccc(-c3ccc4ccccc4n3)c2)OC1(C)C] | 83% |
| S9 | 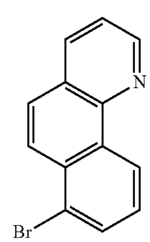 | 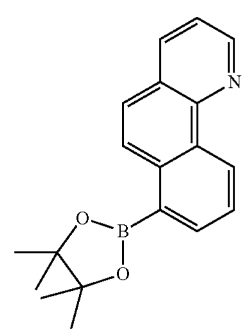 [SMILES: CC1(C)OB(c2cccc3c2ccc2cccnc23)OC1(C)C] | 88% |

-continued

| Ex. | Reactant | Product | Yield |
|---|---|---|---|
| S10 | 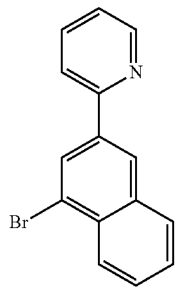 [SMILES: Brc1cc(-c2ccccn2)cc2ccccc12] | 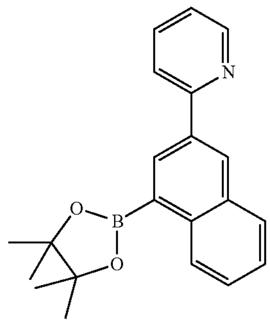 [SMILES: CC1(C)OB(c2cc(-c3ccccn3)cc3ccccc23)OC1(C)C] | 92% |

Synthon S11:

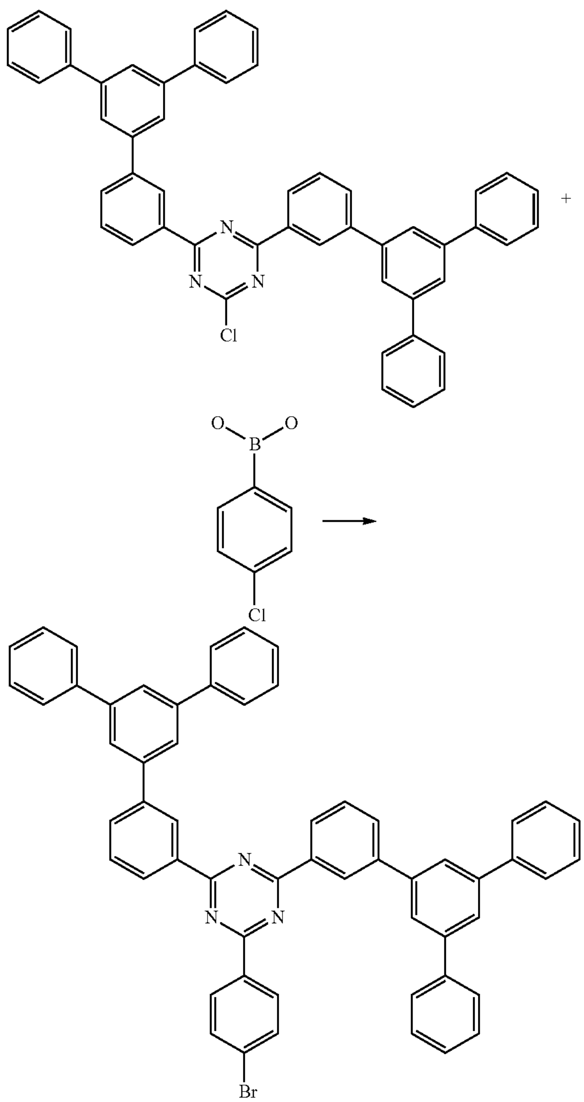

50 g (69 mmol) of 2-chloro-4,6-[3-(3,5-diphenyl)phenyl]-1,3,5-triazine [1233200-61-7] are weighed out together with 10.8 g (69 mmol) of (4-chlorophenyl)boronic acid, 2 g (1.726 mmol) of tetrakis(triphenylphosphine)palladium(0) and 21 g (152 mmol) of potassium carbonate, and mixed with 350 mL of toluene, 350 mL of water and 350 mL of dioxane. The mixture is heated under reflux for 24 h. After cooling, the solids obtained are filtered off with suction and purified by hot extraction with toluene over neutral alumina. 32 g (58%, 40 mmol) of a colorless solid are obtained.

Synthon S12:

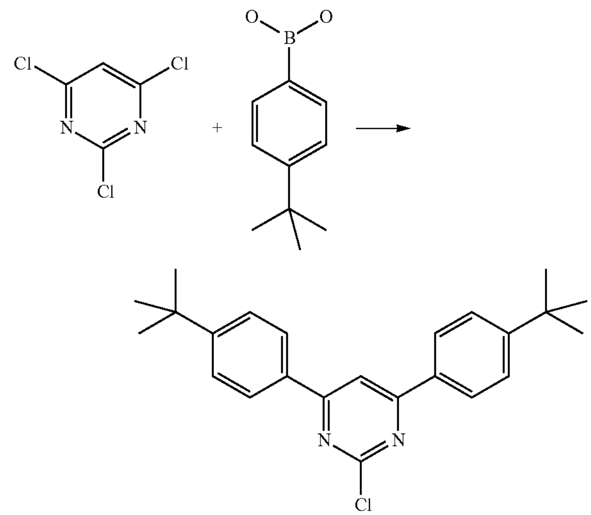

32 g (174 mmol) of 2,4,6-trichloropyrimidine, 62 g (348 mmol) of (4-tert-butylphenyl)boronic acid, 110 g (1.038 mol) of sodium carbonate, 1 g (4.454 mmol) of palladium (II) acetate and 2.3 g (8.8 mmol) of triphenylphosphine are dissolved in 450 mL of ethylene glycol dimethyl ether and 300 mL of water. The mixture is heated to 70° C. for 6 h. After cooling, the precipitated solids are decanted off, dissolved in toluene and subjected to aqueous workup. The brown oil is extracted by stirring with hot ethanol and filtered. 19.8 g (30%, 52 mmol) of a colorless solid are obtained.

The following units can be joined to the synthons S1-S10 to give ligands:

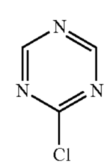

6153-86-2

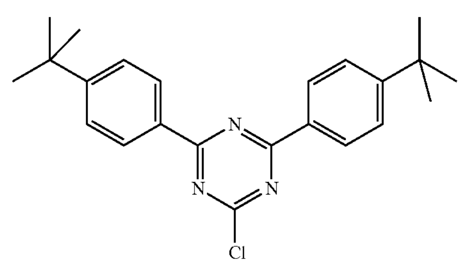

253158-13-3

-continued
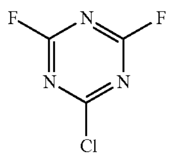
696-85-5
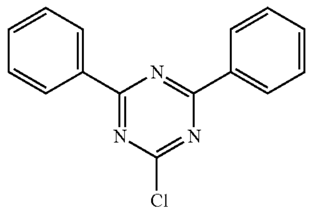
3842-55-5
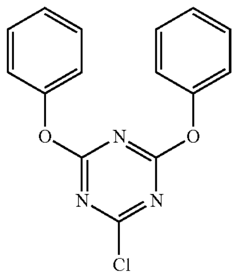
2972-65-8
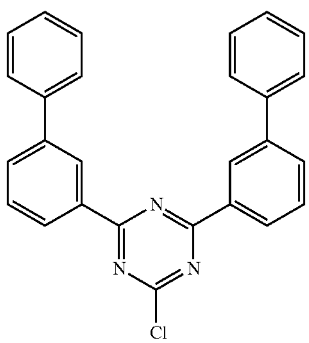
1205748-61-3
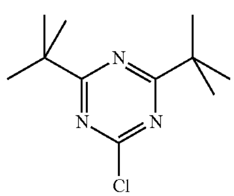
73084-03-4
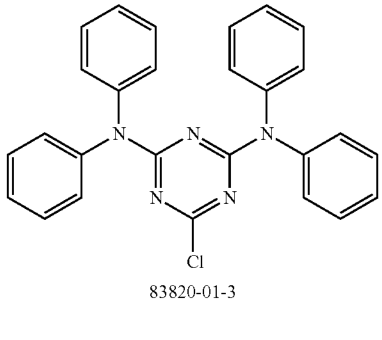
83820-01-3
-continued
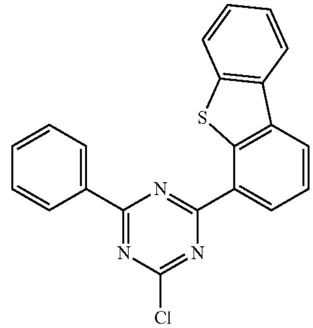
1476735-48-4
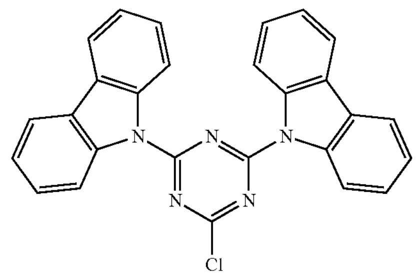
877615-05-9
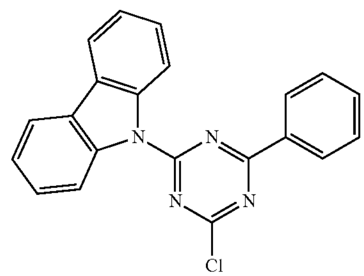
1268244-56-9
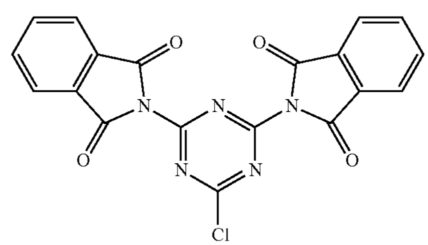
19138-11-5
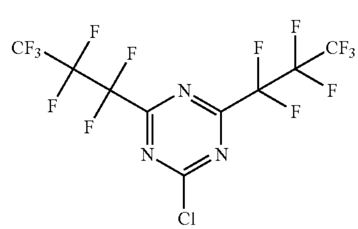
804-67-1

-continued
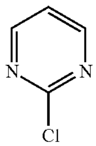
1722-12-9
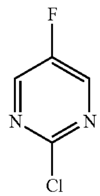
62802-42-0
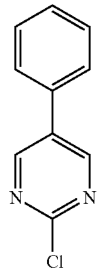
22536-62-5
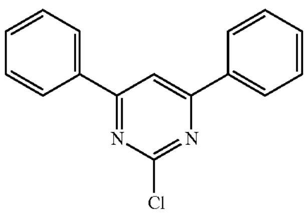
2915-16-4
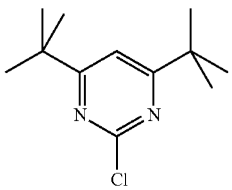
71162-19-1
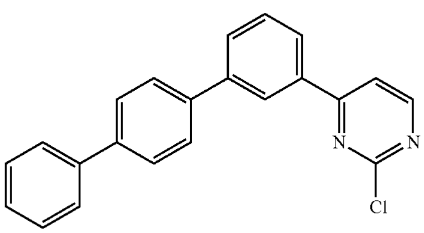
1383627-88-0
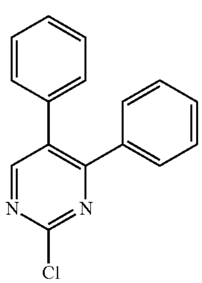
39860-32-7
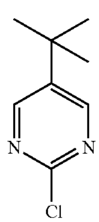
156777-81-0
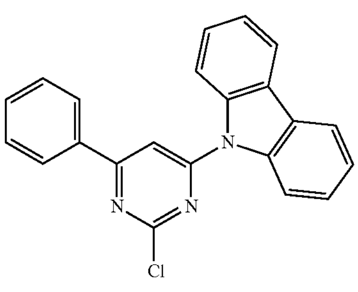
1426818-83-8
-continued
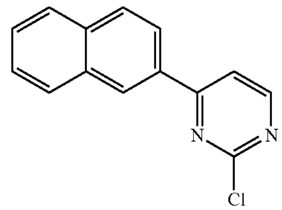
488816-96-2
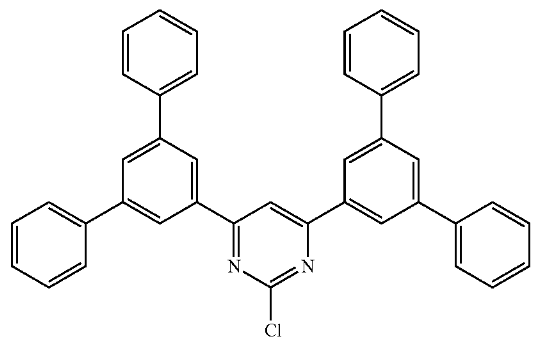
1384480-21-0
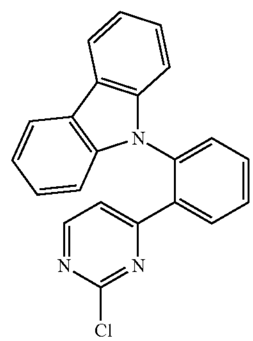
1413615-86-7
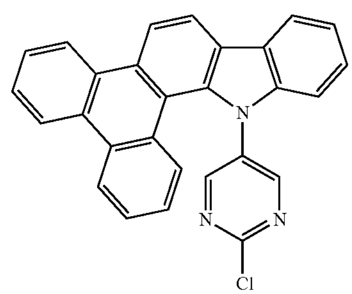
1418124-57-8
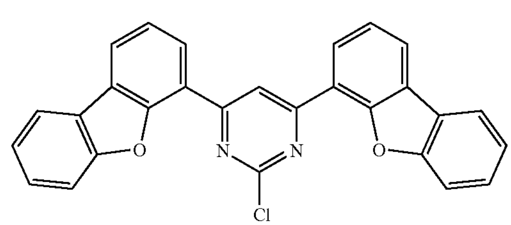
1421599-31-6

-continued
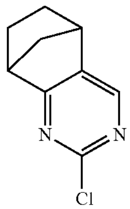
1037776-03-6
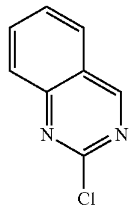
6141-13-5
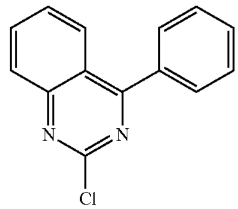
6141-13-5
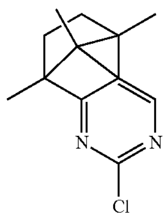
209409-84-7
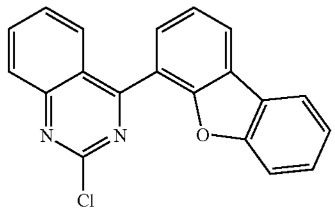
1403252-54-9
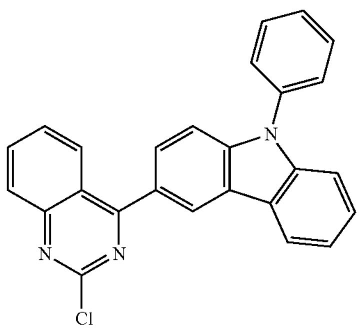
1373317-91-9
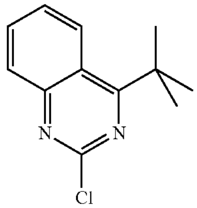
1092837-92-7
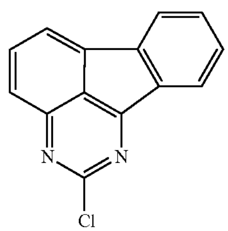
666854-39-3
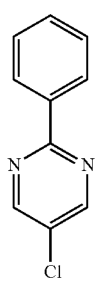
34771-50-1
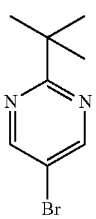
85929-94-8
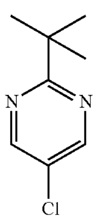
91167-21-4
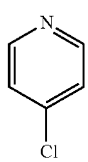
626-61-9
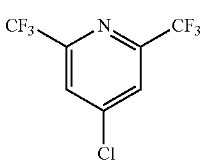
81269-96-7
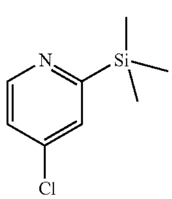
139585-50-5
-continued
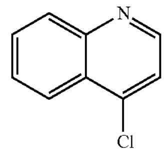
611-35-8
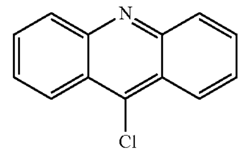
1207-69-8
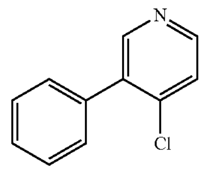
19069-63-7
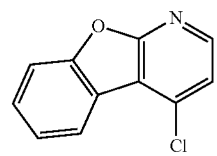
31874-94-9
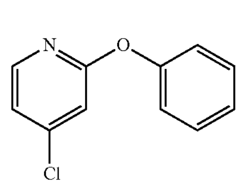
28373-64-0
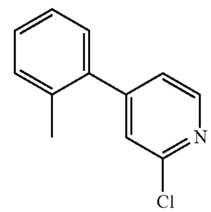
883874-67-7
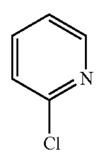
109-09-1
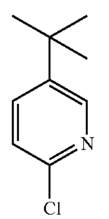
102236-19-1
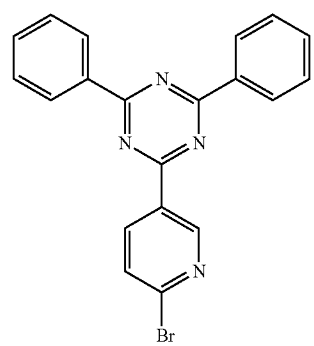
23449-08-3
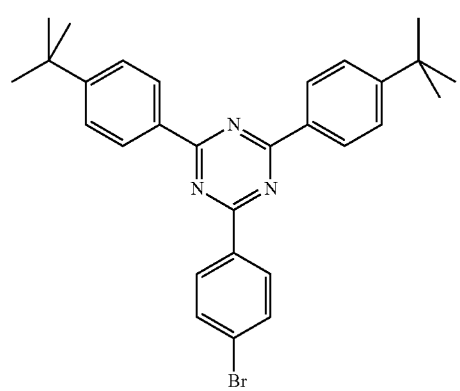
927898-18-8

-continued

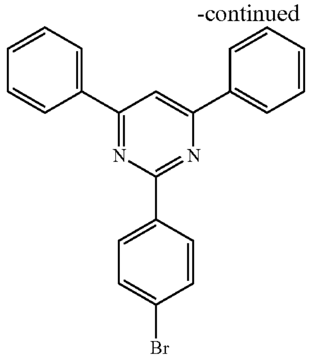

457613-56-8

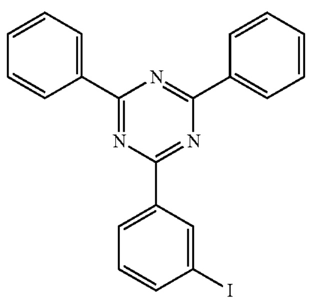

1476799-05-9

-continued

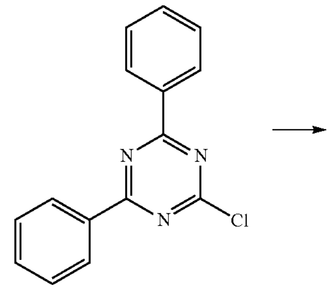

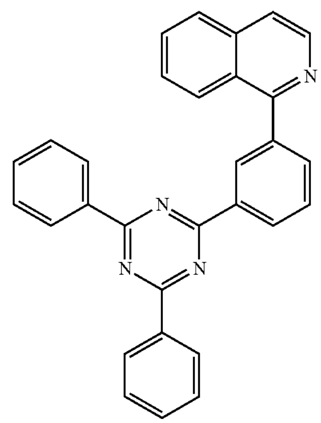

Synthesis of Ligand L4 from an Arylboronic Ester and an Aryl Halide

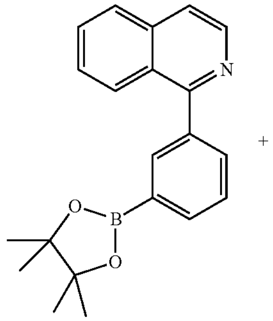

In a 500 mL four-neck round-bottom flask with precision glass stirrer, internal thermometer, reflux condenser and protective gas connection, 50 g (151 mmol) of 1-[2-(4,4,5,5-tetramethyl-[1,3,2]dioxaborolan-2-yl)phenyl]isoquinoline (S3), 21 g (78.4 mmol) of 2-chloro-4,6-diphenyl-[1,3,5]triazine (CAS 3842-55-5) and 32 g (151 mmol) of potassium phosphate are suspended in degassed toluene (150 mL) and 1,4-dioxane (75 mL). To this are added tri-o-tolylphosphine (2.3 g, 7.6 mmol), palladium acetate (0.85 g, 3.8 mmol) and degassed water (75 mL). The reaction mixture is heated to internal temperature 100° C. for 7 h. After cooling, the precipitated solids are filtered off with suction, washed with a little water and toluene and dried in a vacuum drying cabinet at 60° C. overnight. The residue is dissolved in about 400 mL of toluene and filtered through silica gel, the silica gel is washed with toluene, and the organic phases are combined and freed of the solvent. The solids are repeatedly recrystallized from toluene. 25.8 g (117.7 mmol, 78% yield) of a colorless solid are obtained.

Analogously to this synthesis method, it is possible to prepare the following ligands:
| Ex. | Syn-thon | Aryl halide [CAS number] | Ligand | Yield |
|---|---|---|---|---|
| L1 | S6 | 253158-13-3 | 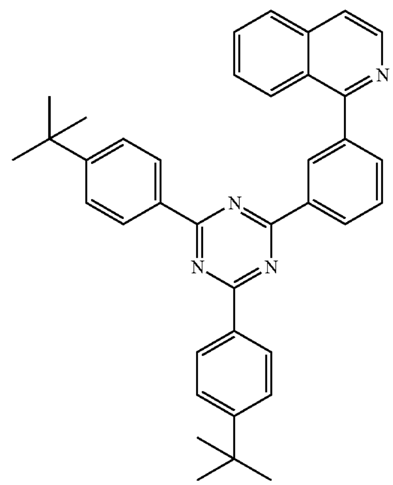 [SMILES: CC(C)(C)c1ccc(-c2nc(-c3ccc(C(C)(C)C)cc3)nc(-c3cccc(-c4nccc5ccccc45)c3)n2)cc1] | 75% |
| L2 | S6 | 696-85-5 | 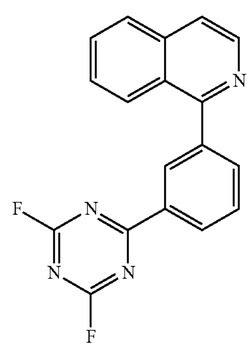 [SMILES: Fc1nc(F)nc(-c2cccc(-c3nccc4ccccc34)c2)n1] | 71% |
| L3 | S6 | 2972-65-8 | 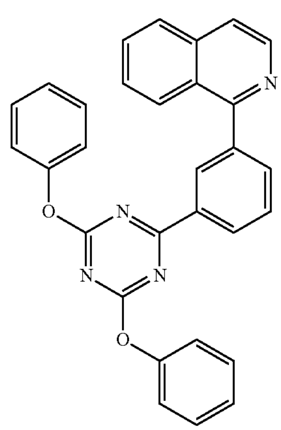 [SMILES: c1ccc(Oc2nc(Oc3ccccc3)nc(-c3cccc(-c4nccc5ccccc45)c3)n2)cc1] | 65% |

-continued
| Ex. | Syn-thon | Aryl halide [CAS number] | Ligand | Yield |
|---|---|---|---|---|
| L5 | S6 | 73084-03-4 | 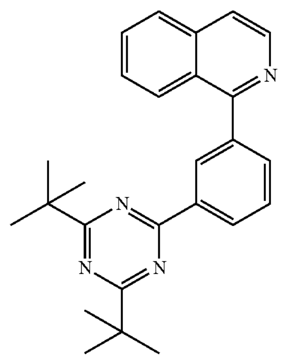 [SMILES: CC(C)(C)c1nc(-c2cccc(-c3nccc4ccccc34)c2)nc(C(C)(C)C)n1] | 70% |
| L6 | S6 | 83820-01-3 | 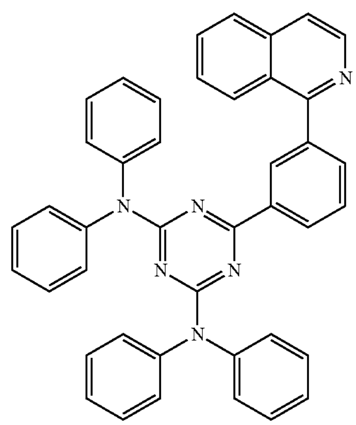 [SMILES: c1ccc(N(c2ccccc2)c2nc(-c3cccc(-c4nccc5ccccc45)c3)nc(N(c3ccccc3)c3ccccc3)n2)cc1] | 87% |
| L7 | S6 | 877615-05-9 | 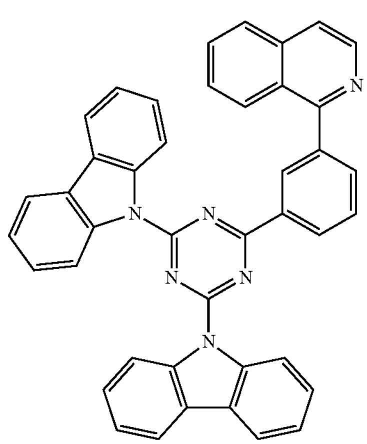 [SMILES: c1cc(-c2nc(-n3c4ccccc4c4ccccc43)nc(-n3c4ccccc4c4ccccc43)n2)cc(-c2nccc3ccccc23)c1] | 84% |

-continued
| Ex. | Syn-thon | Aryl halide [CAS number] | Ligand | Yield |
|---|---|---|---|---|
| L8 | S6 | 19138-11-5 | 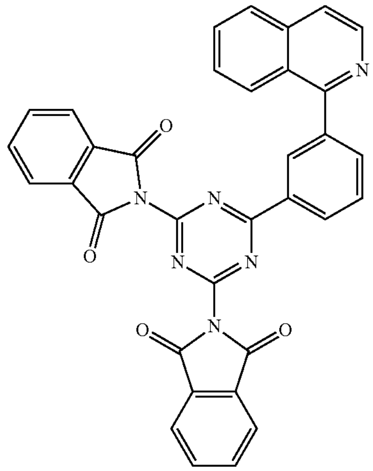 [SMILES: O=C1c2ccccc2C(=O)N1c1nc(-c2cccc(-c3nccc4ccccc34)c2)nc(N2C(=O)c3ccccc3C2=O)n1] | 81% |
| L9 | S6 | 804-67-1 | 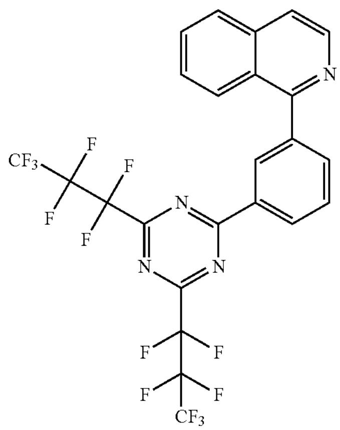 [SMILES: FC(F)(F)C(F)(F)C(F)(F)c1nc(-c2cccc(-c3nccc4ccccc34)c2)nc(C(F)(F)C(F)(F)C(F)(F)F)n1] | 76% |
| L10 | S6 | 2915-16-4 | 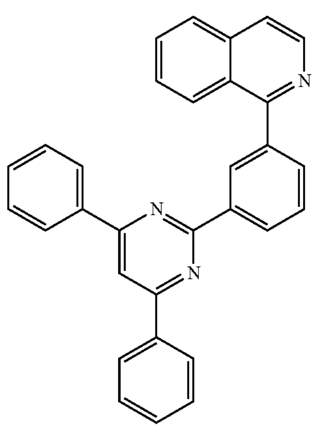 [SMILES: c1ccc(-c2cc(-c3ccccc3)nc(-c3cccc(-c4nccc5ccccc45)c3)n2)cc1] | 76% |

-continued
| Ex. | Syn-thon | Aryl halide [CAS number] | Ligand | Yield |
|---|---|---|---|---|
| L11 | S6 | 71162-19-1 | 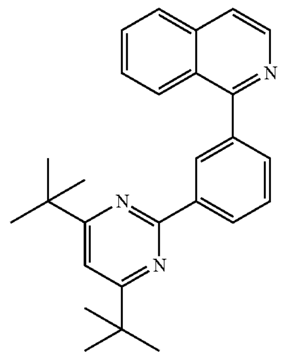 [SMILES: CC(C)(C)c1cc(C(C)(C)C)nc(-c2cccc(-c3nccc4ccccc34)c2)n1] | 71% |
| L12 | S6 | 1421599-31-6 | 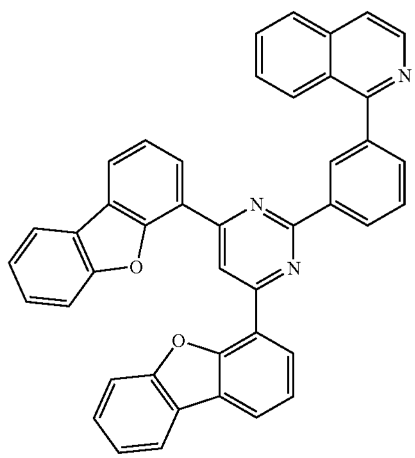 [SMILES: c1cc(-c2nc(-c3cccc4c3oc3ccccc34)cc(-c3cccc4c3oc3ccccc34)n2)cc(-c2nccc3ccccc23)c1] | 56% |
| L13 | S6 | 529874-83-7 | 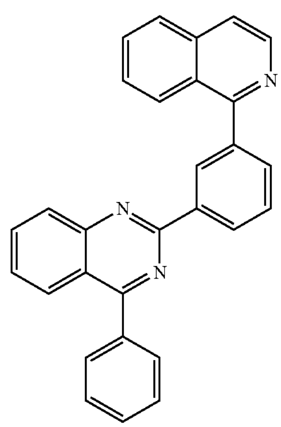 [SMILES: c1ccc(-c2nc(-c3cccc(-c4nccc5ccccc45)c3)nc3ccccc23)cc1] | 61% |
| L14 | S6 | 209409-84-7 | 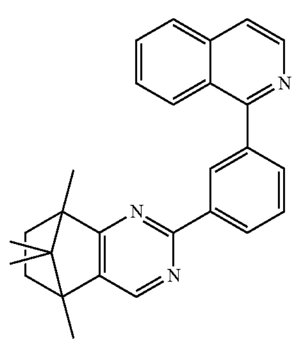 [SMILES: CC12CCC(C)(c3nc(-c4cccc(-c5nccc6ccccc56)c4)ncc31)C2(C)C] | 59% |

-continued
| Ex. | Syn-thon | Aryl halide [CAS number] | Ligand | Yield |
|---|---|---|---|---|
| L15 | S6 | 1092837-92-7 | 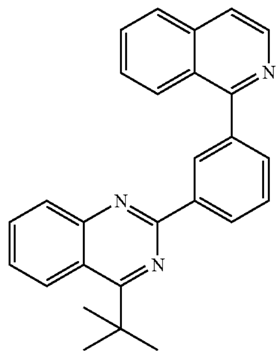 [SMILES: CC(C)(C)c1nc(-c2cccc(-c3nccc4ccccc34)c2)nc2ccccc12] | 70% |
| L16 | S6 | 666854-39-3 | 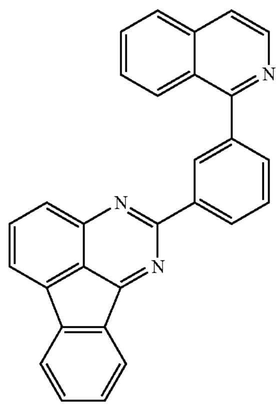 [SMILES: c1cc(-c2nc3c4c(cccc4n2)-c2ccccc2-3)cc(-c2nccc3ccccc23)c1] | 75% |
| L17 | S6 | 85929-94-8 | 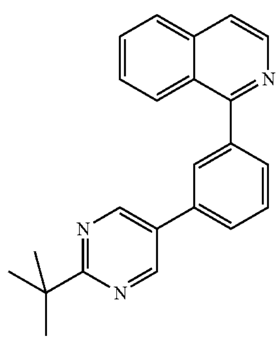 [SMILES: CC(C)(C)c1ncc(-c2cccc(-c3nccc4ccccc34)c2)cn1] | 64% |
| L18 | S6 | 81269-96-7 | 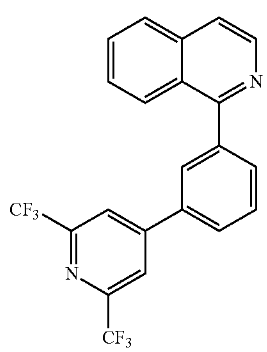 [SMILES: FC(F)(F)c1cc(-c2cccc(-c3nccc4ccccc34)c2)cc(C(F)(F)F)n1] | 58% |

-continued
| Ex. | Syn-thon | Aryl halide [CAS number] | Ligand | Yield |
|---|---|---|---|---|
| L19 | S6 | 611-35-8 | 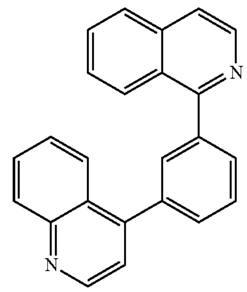 [SMILES: c1cc(-c2nccc3ccccc23)cc(-c2ccnc3ccccc23)c1] | 67% |
| L20 | S6 | 1207-69-8 | 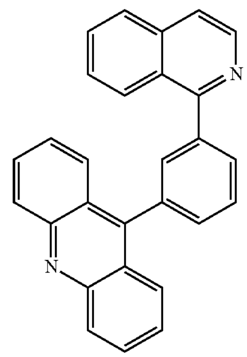 [SMILES: c1cc(-c2nccc3ccccc23)cc(-c2c3ccccc3nc3ccccc23)c1] | 69% |
| L21 | S6 | 19069-63-7 | 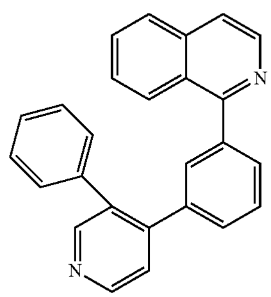 [SMILES: c1ccc(-c2cnccc2-c2cccc(-c3nccc4ccccc34)c2)cc1] | 45% |
| L22 | S6 | 31874-94-9 | 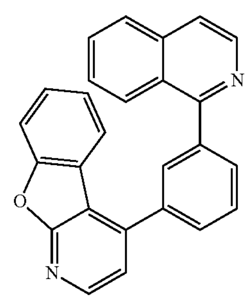 [SMILES: c1cc(-c2nccc3ccccc23)cc(-c2ccnc3oc4ccccc4c23)c1] | 51% |
| L23 | S6 | 90732-01-7 | 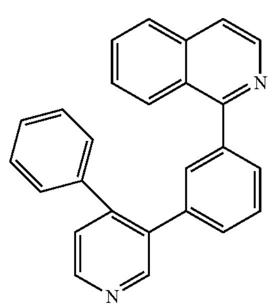 [SMILES: c1ccc(-c2ccncc2-c2cccc(-c3nccc4ccccc34)c2)cc1] | 32% |

-continued
| Ex. | Syn-thon | Aryl halide [CAS number] | Ligand | Yield |
|---|---|---|---|---|
| L24 | S6 | 284040-67-1 | 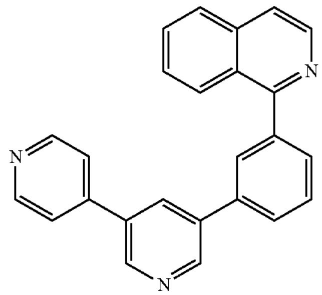 [SMILES: c1cc(-c2cncc(-c3ccncc3)c2)cc(-c2nccc3ccccc23)c1] | 58% |
| L25 | S6 | 626-60-8 | 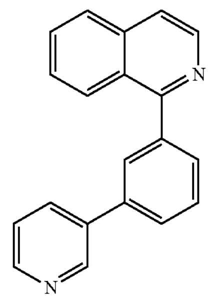 [SMILES: c1cncc(-c2cccc(-c3nccc4ccccc34)c2)c1] | 43% |
| L26 | S6 | S12 | 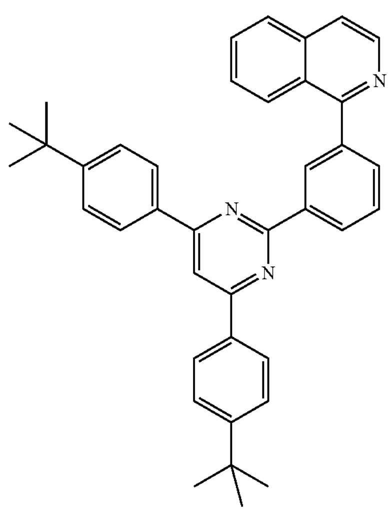 [SMILES: CC(C)(C)c1ccc(-c2cc(-c3ccc(C(C)(C)C)cc3)nc(-c3cccc(-c4nccc5ccccc45)c3)n2)cc1] | 52% |

-continued
| Ex. | Syn-thon | Aryl halide [CAS number] | Ligand | Yield |
|---|---|---|---|---|
| L27 | S7 | 253158-13-3 | 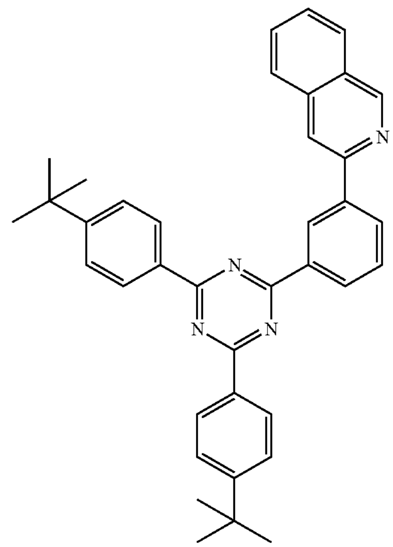 [SMILES: CC(C)(C)c1ccc(-c2nc(-c3ccc(C(C)(C)C)cc3)nc(-c3cccc(-c4cc5ccccc5cn4)c3)n2)cc1] | 45% |
| L28 | S7 | 696-85-5 | 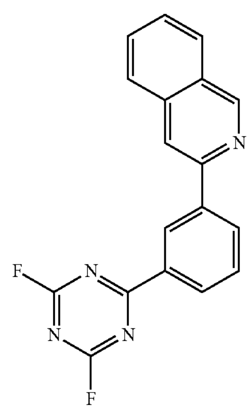 [SMILES: Fc1nc(F)nc(-c2cccc(-c3cc4ccccc4cn3)c2)n1] | 35% |
| L29 | S7 | 2972-65-8 | 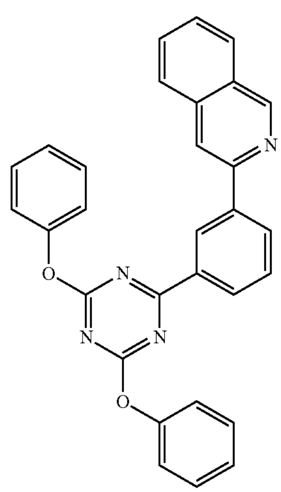 [SMILES: c1ccc(Oc2nc(Oc3ccccc3)nc(-c3cccc(-c4cc5ccccc5cn4)c3)n2)cc1] | 51% |

-continued
| Ex. | Syn-thon | Aryl halide [CAS number] | Ligand | Yield |
|---|---|---|---|---|
| L30 | S7 | 73084-03-4 | 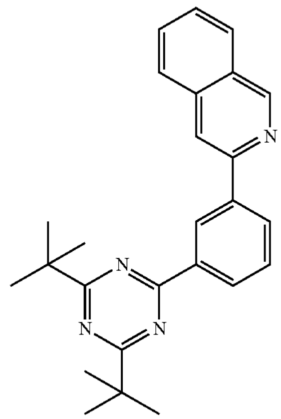 [SMILES: CC(C)(C)c1nc(-c2cccc(-c3cc4ccccc4cn3)c2)nc(C(C)(C)C)n1] | 34% |
| L31 | S7 | 83820-01-3 | 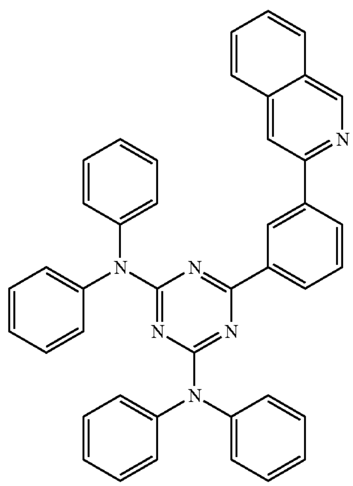 [SMILES: c1ccc(N(c2ccccc2)c2nc(-c3cccc(-c4cc5ccccc5cn4)c3)nc(N(c3ccccc3)c3ccccc3)n2)cc1] | 34% |
| L32 | S7 | 877615-05-9 | 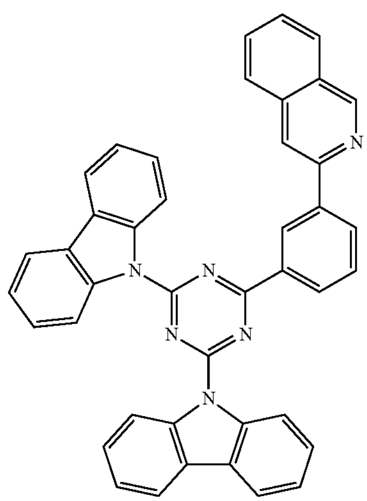 [SMILES: c1cc(-c2cc3ccccc3cn2)cc(-c2nc(-n3c4ccccc4c4ccccc43)nc(-n3c4ccccc4c4ccccc43)n2)c1] | 48% |

-continued
| Ex. | Syn-thon | Aryl halide [CAS number] | Ligand | Yield |
|---|---|---|---|---|
| L33 | S7 | 19138-11-5 | 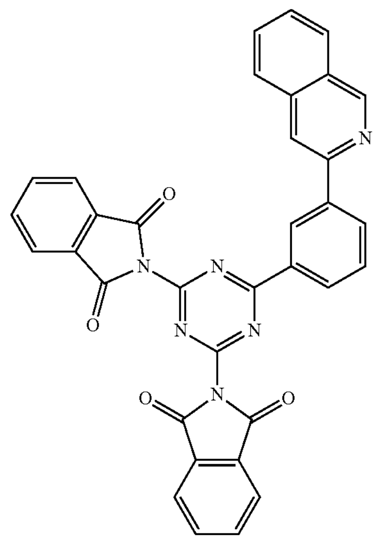 [SMILES: O=C1c2ccccc2C(=O)N1c1nc(-c2cccc(-c3cc4ccccc4cn3)c2)nc(N2C(=O)c3ccccc3C2=O)n1] | 29% |
| L34 | S7 | 804-67-1 | 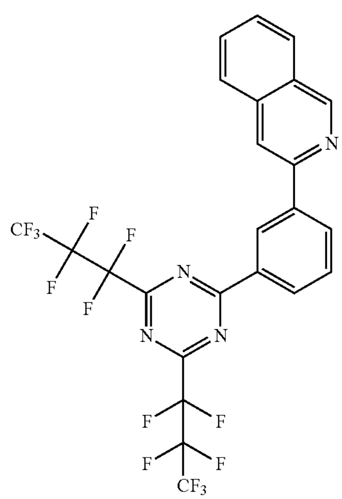 [SMILES: FC(F)(F)C(F)(F)C(F)(F)c1nc(-c2cccc(-c3cc4ccccc4cn3)c2)nc(C(F)(F)C(F)(F)C(F)(F)F)n1] | 21% |
| L35 | S7 | 2915-16-4 | 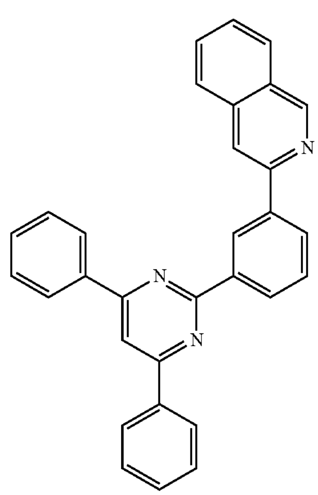 [SMILES: c1ccc(-c2cc(-c3ccccc3)nc(-c3cccc(-c4cc5ccccc5cn4)c3)n2)cc1] | 78% |

-continued
| Ex. | Syn-thon | Aryl halide [CAS number] | Ligand | Yield |
|---|---|---|---|---|
| L36 | S7 | 71162-19-1 | 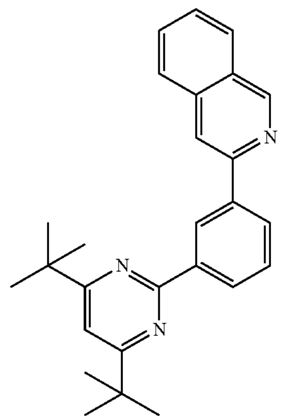 [SMILES: CC(C)(C)c1cc(C(C)(C)C)nc(-c2cccc(-c3cc4ccccc4cn3)c2)n1] | 65% |
| L37 | S7 | 1421599-31-6 | 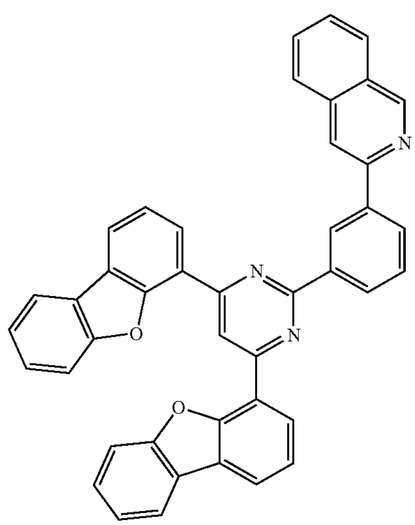 [SMILES: c1cc(-c2cc3ccccc3cn2)cc(-c2nc(-c3cccc4c3oc3ccccc34)cc(-c3cccc4c3oc3ccccc34)n2)c1] | 81% |
| L38 | S7 | 529874-83-7 | 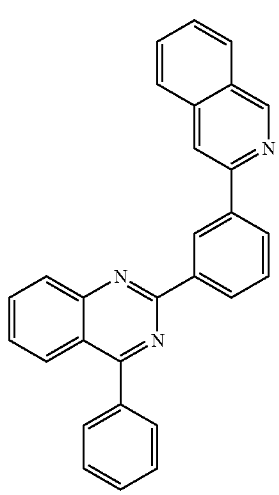 [SMILES: c1ccc(-c2nc(-c3cccc(-c4cc5ccccc5cn4)c3)nc3ccccc23)cc1] | 59% |

-continued
| Ex. | Syn-thon | Aryl halide [CAS number] | Ligand | Yield |
|---|---|---|---|---|
| L39 | S7 | 209409-84-7 | 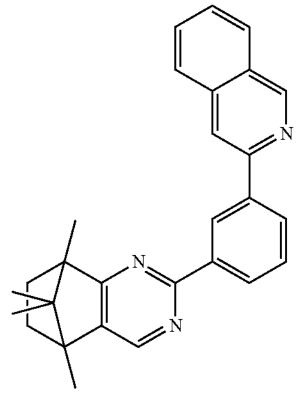 [SMILES: CC12CCC(C)(c3nc(-c4cccc(-c5cc6ccccc6cn5)c4)ncc31)C2(C)C] | 43% |
| L40 | S7 | 1092837-92-7 | 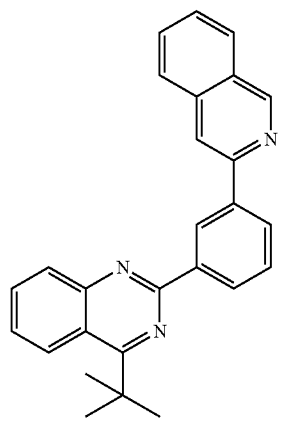 [SMILES: CC(C)(C)c1nc(-c2cccc(-c3cc4ccccc4cn3)c2)nc2ccccc12] | 67% |
| L41 | S7 | 666854-39-3 | 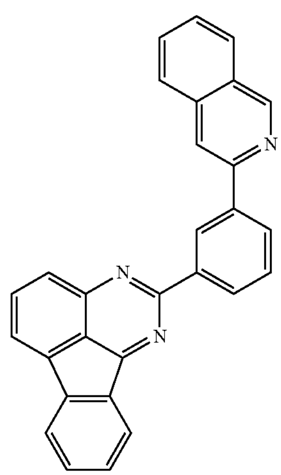 [SMILES: c1cc(-c2cc3ccccc3cn2)cc(-c2nc3c4c(cccc4n2)-c2ccccc2-3)c1] | 72% |

-continued
| Ex. | Syn-thon | Aryl halide [CAS number] | Ligand | Yield |
|---|---|---|---|---|
| L42 | S7 | 85929-94-8 | 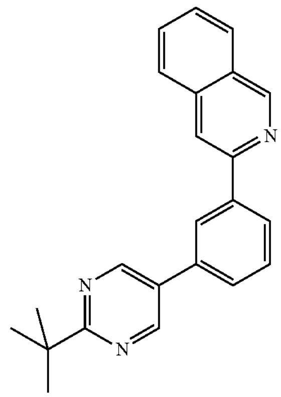 [SMILES: CC(C)(C)c1ncc(-c2cccc(-c3cc4ccccc4cn3)c2)cn1] | 88% |
| L43 | S7 | 81269-96-7 | 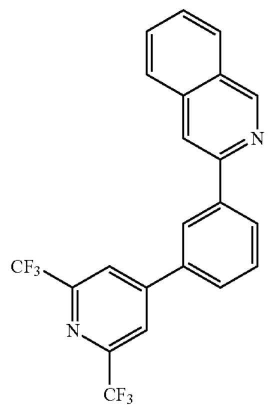 [SMILES: FC(F)(F)c1cc(-c2cccc(-c3cc4ccccc4cn3)c2)cc(C(F)(F)F)n1] | 66% |
| L44 | S7 | 611-35-8 | 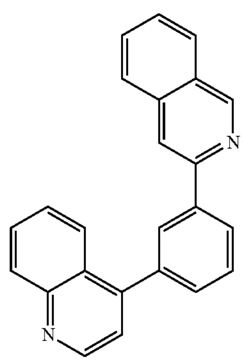 [SMILES: c1cc(-c2cc3ccccc3cn2)cc(-c2ccnc3ccccc23)c1] | 73% |
| L45 | S7 | 1207-69-8 | 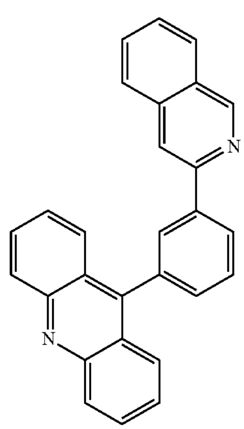 [SMILES: c1cc(-c2cc3ccccc3cn2)cc(-c2c3ccccc3nc3ccccc23)c1] | 33% |

-continued
| Ex. | Synthon | Aryl halide [CAS number] | Ligand | Yield |
|---|---|---|---|---|
| L46 | S7 | 19069-63-7 | 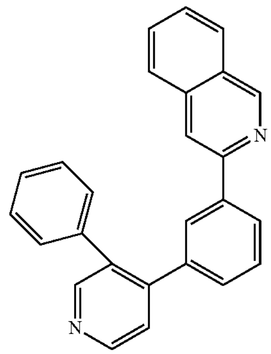 [SMILES: c1ccc(-c2cnccc2-c2cccc(-c3cc4ccccc4cn3)c2)cc1] | 21% |
| L47 | S7 | 31874-94-9 | 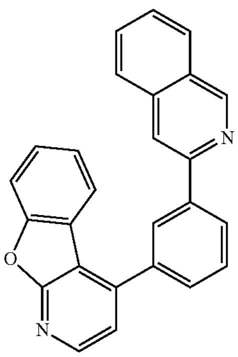 [SMILES: c1cc(-c2cc3ccccc3cn2)cc(-c2ccnc3oc4ccccc4c23)c1] | 65% |
| L48 | S7 | 90732-01-7 | 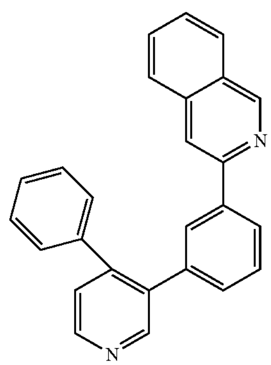 [SMILES: c1ccc(-c2ccncc2-c2cccc(-c3cc4ccccc4cn3)c2)cc1] | 36% |
| L49 | S7 | 284040-67-1 | 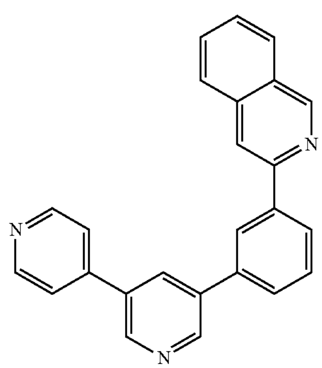 [SMILES: c1cc(-c2cncc(-c3ccncc3)c2)cc(-c2cc3ccccc3cn2)c1] | 87% |

-continued
| Ex. | Syn-thon | Aryl halide [CAS number] | Ligand | Yield |
|---|---|---|---|---|
| L50 | S7 | 626-60-8 | 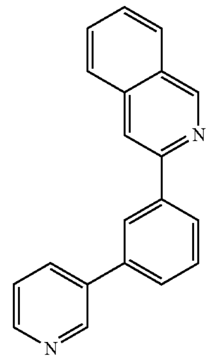 [SMILES: c1cncc(-c2cccc(-c3cc4ccccc4cn3)c2)c1] | 74% |
| L51 | S8 | 253158-13-3 | 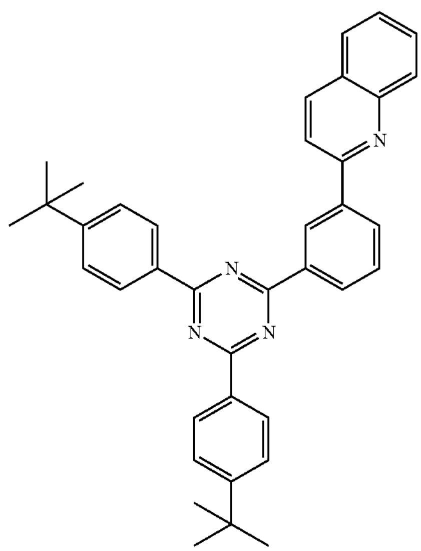 [SMILES: CC(C)(C)c1ccc(-c2nc(-c3ccc(C(C)(C)C)cc3)nc(-c3cccc(-c4ccc5ccccc5n4)c3)n2)cc1] | 71% |
| L52 | S8 | 83820-01-3 | 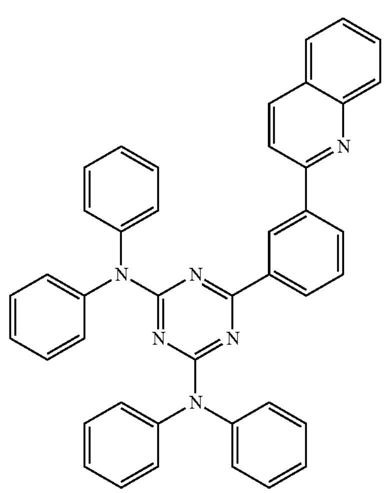 [SMILES: c1ccc(N(c2ccccc2)c2nc(-c3cccc(-c4ccc5ccccc5n4)c3)nc(N(c3ccccc3)c3ccccc3)n2)cc1] | 64% |

-continued
| Ex. | Syn-thon | Aryl halide [CAS number] | Ligand | Yield |
|---|---|---|---|---|
| L53 | S8 | 877615-05-9 | 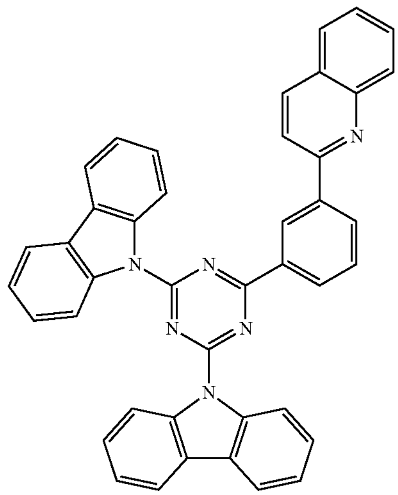 [SMILES: c1cc(-c2ccc3ccccc3n2)cc(-c2nc(-n3c4ccccc4c4ccccc43)nc(-n3c4ccccc4c4ccccc43)n2)c1] | 70% |
| L54 | S8 | 2915-16-4 | 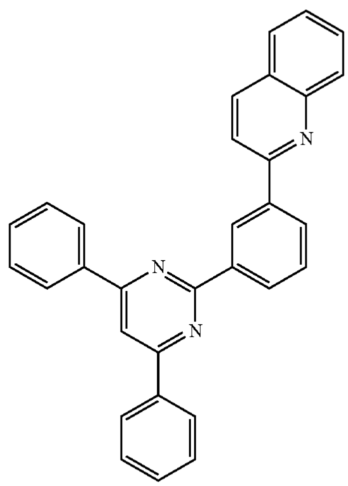 [SMILES: c1ccc(-c2cc(-c3ccccc3)nc(-c3cccc(-c4ccc5ccccc5n4)c3)n2)cc1] | 65% |
| L55 | S8 | 1421599-31-6 | 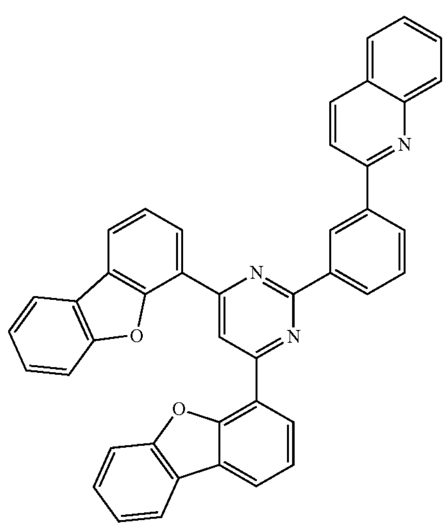 [SMILES: c1cc(-c2ccc3ccccc3n2)cc(-c2nc(-c3cccc4c3oc3ccccc34)cc(-c3cccc4c3oc3ccccc34)n2)c1] | 54% |

-continued
| Ex. | Syn-thon | Aryl halide [CAS number] | Ligand | Yield |
|---|---|---|---|---|
| L56 | S8 | 209409-84-7 | 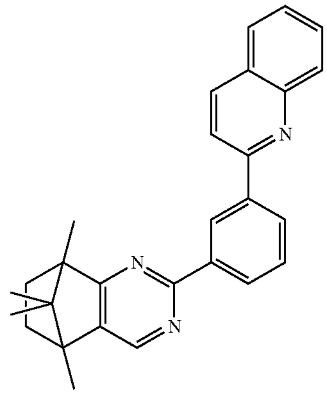 [SMILES: CC12CCC(C)(c3nc(-c4cccc(-c5ccc6ccccc6n5)c4)ncc31)C2(C)C] | 73% |
| L57 | S9 | 253158-13-3 | 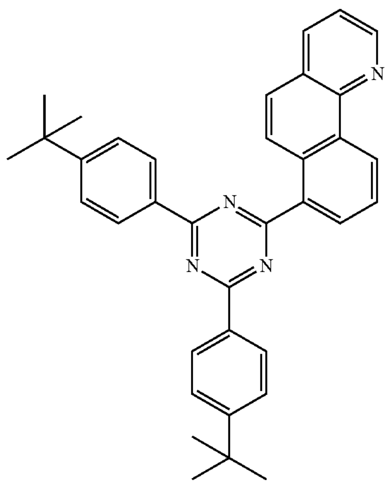 [SMILES: CC(C)(C)c1ccc(-c2nc(-c3ccc(C(C)(C)C)cc3)nc(-c3cccc4c3ccc3cccnc34)n2)cc1] | 62% |
| L58 | S9 | 2972-65-8 | 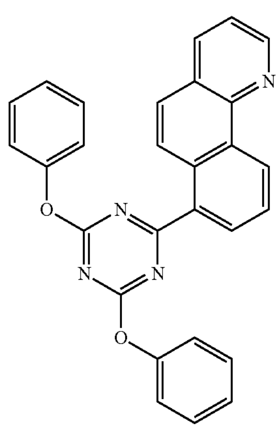 [SMILES: c1ccc(Oc2nc(Oc3ccccc3)nc(-c3cccc4c3ccc3cccnc34)n2)cc1] | 76% |

-continued
| Ex. | Syn-thon | Aryl halide [CAS number] | Ligand | Yield |
|---|---|---|---|---|
| L59 | S9 | 83820-01-3 | 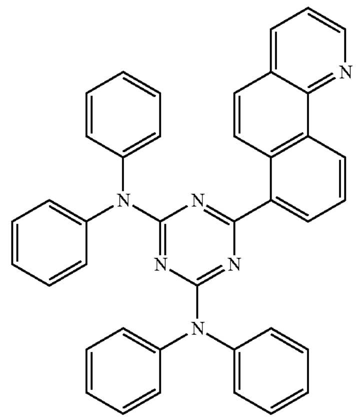 [SMILES: c1ccc(N(c2ccccc2)c2nc(-c3cccc4c3ccc3cccnc34)nc(N(c3ccccc3)c3ccccc3)n2)cc1] | 59% |
| L60 | S9 | 877615-05-9 | 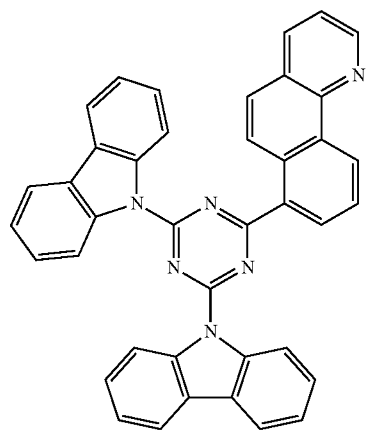 [SMILES: c1cnc2c(c1)ccc1c(-c3nc(-n4c5ccccc5c5ccccc54)nc(-n4c5ccccc5c5ccccc54)n3)cccc12] | 48% |
| L61 | S9 | 19138-11-5 | 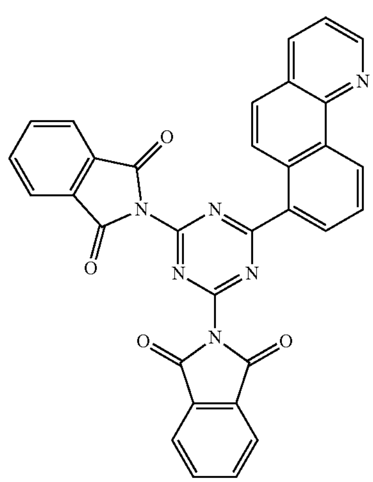 [SMILES: O=C1c2ccccc2C(=O)N1c1nc(-c2cccc3c2ccc2cccnc23)nc(N2C(=O)c3ccccc3C2=O)n1] | 36% |

-continued
| Ex. | Syn-thon | Aryl halide [CAS number] | Ligand | Yield |
|---|---|---|---|---|
| L62 | S9 | 804-67-1 | 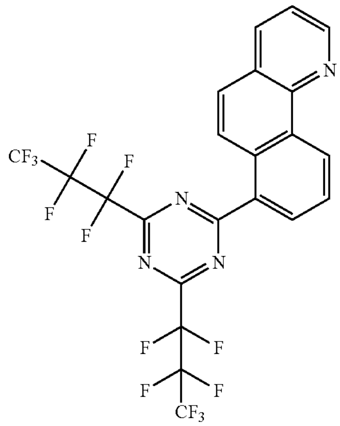 [SMILES: FC(F)(F)C(F)(F)C(F)(F)c1nc(-c2cccc3c2ccc2cccnc23)nc(C(F)(F)C(F)(F)C(F)(F)F)n1] | 19% |
| L63 | S9 | 2915-16-4 | 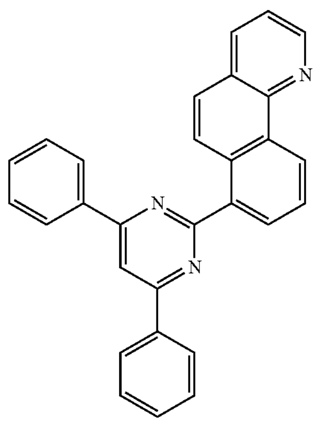 [SMILES: c1ccc(-c2cc(-c3ccccc3)nc(-c3cccc4c3ccc3cccnc34)n2)cc1] | 58% |
| L64 | S9 | 209409-84-7 | 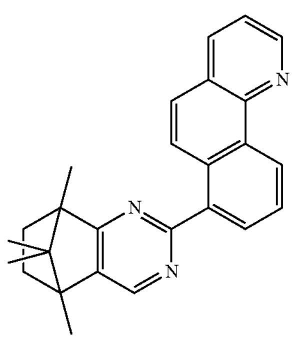 [SMILES: CC12CCC(C)(c3nc(-c4cccc5c4ccc4cccnc45)ncc31)C2(C)C] | 52% |
| L65 | S9 | 19069-63-7 | 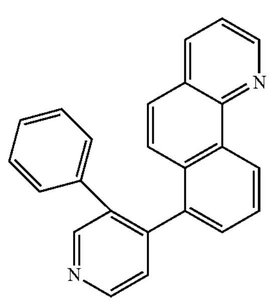 [SMILES: c1ccc(-c2cnccc2-c2cccc3c2ccc2cccnc23)cc1] | 31% |

-continued
| Ex. | Syn-thon | Aryl halide [CAS number] | Ligand | Yield |
|---|---|---|---|---|
| L66 | S9 | 31874-94-9 | 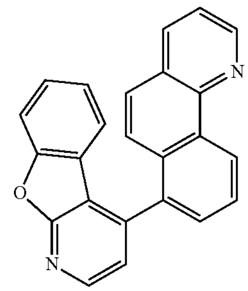 [SMILES: c1cnc2c(c1)ccc1c(-c3ccnc4oc5ccccc5c34)cccc12] | 45% |
| L67 | S10 | 253158-13-3 | 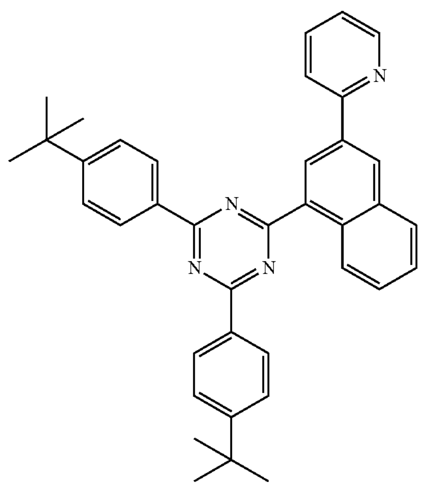 [SMILES: CC(C)(C)c1ccc(-c2nc(-c3ccc(C(C)(C)C)cc3)nc(-c3cc(-c4ccccn4)cc4ccccc34)n2)cc1] | 61% |
| L68 | S10 | 877615-05-9 | 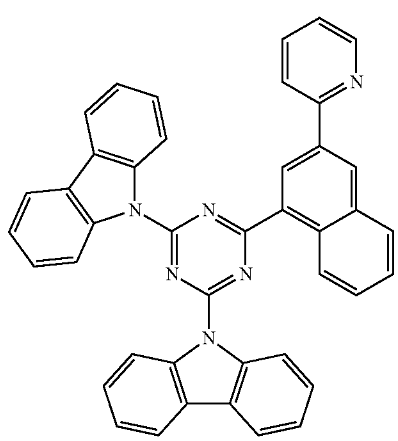 [SMILES: c1ccc(-c2cc(-c3nc(-n4c5ccccc5c5ccccc54)nc(-n4c5ccccc5c5ccccc54)n3)c3ccccc3c2)nc1] | 72% |

-continued
| Ex. | Syn-thon | Aryl halide [CAS number] | Ligand | Yield |
|---|---|---|---|---|
| L69 | S10 | 2915-16-4 | 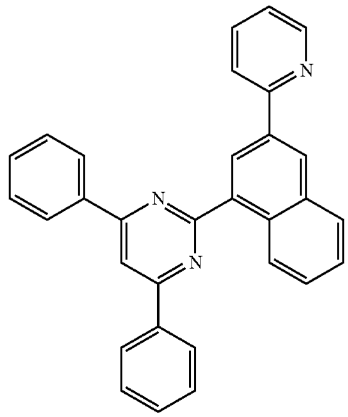 [SMILES: c1ccc(-c2cc(-c3ccccc3)nc(-c3cc(-c4ccccn4)cc4ccccc34)n2)cc1] | 78% |
| L70 | S10 | 71162-19-1 | 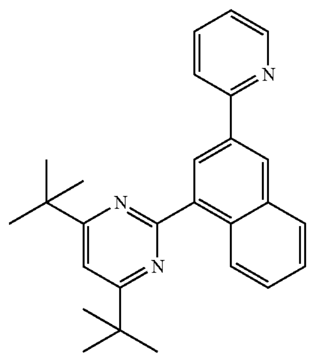 [SMILES: CC(C)(C)c1cc(C(C)(C)C)nc(-c2cc(-c3ccccn3)cc3ccccc23)n1] | 81% |
| L71 | S10 | 209409-84-7 | 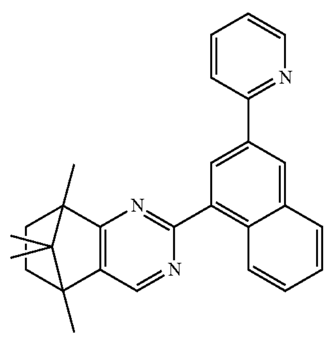 [SMILES: CC12CCC(C)(c3nc(-c4cc(-c5ccccn5)cc5ccccc45)ncc31)C2(C)C] | 75% |
| L72 | S6 | 23449-08-3 | 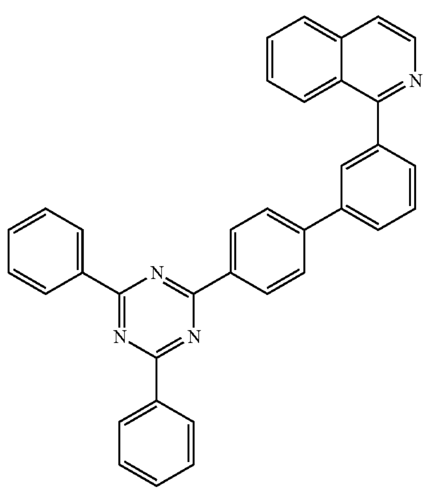 | 65% |

-continued
| Ex. | Syn-thon | Aryl halide [CAS number] | Ligand | Yield |
|---|---|---|---|---|
| L73 | S6 | 927898-18-8 | 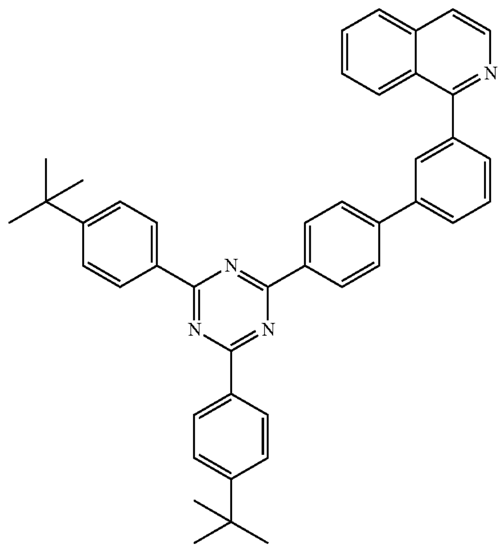 [SMILES: CC(C)(C)c1ccc(-c2nc(-c3ccc(-c4cccc(-c5nccc6ccccc56)c4)cc3)nc(-c3ccc(C(C)(C)C)cc3)n2)cc1] | 58& |
| L74 | S6 | 457613-56-8 | 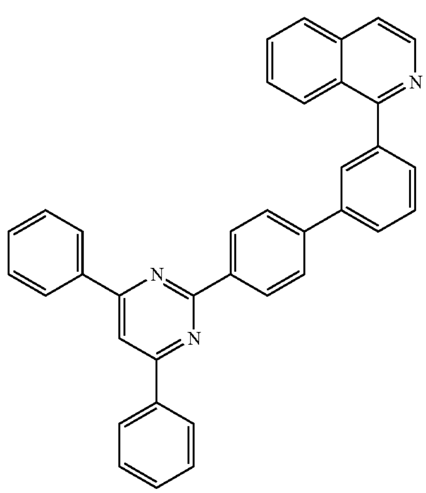 [SMILES: c1ccc(-c2cc(-c3ccccc3)nc(-c3ccc(-c4cccc(-c5nccc6ccccc56)c4)cc3)n2)cc1] | 71% |

-continued
| Ex. | Syn-thon | Aryl halide [CAS number] | Ligand | Yield |
|---|---|---|---|---|
| L75 | S6 | S11 | 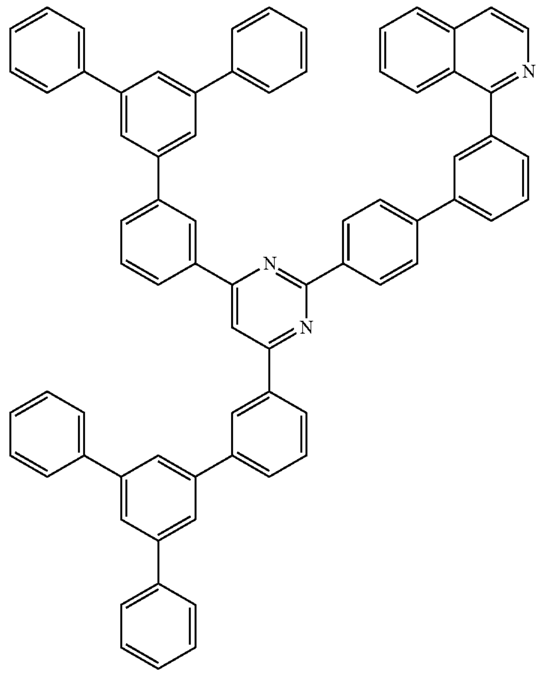 [SMILES: c1ccc(-c2cc(-c3ccccc3)cc(-c3cccc(-c4cc(-c5cccc(-c6cc(-c7ccccc7)cc(-c7ccccc7)c6)c5)nc(-c5ccc(-c6cccc(-c7nccc8ccccc78)c6)cc5)n4)c3)c2)cc1] | 74% |
| L76 | S7 | 23449-08-3 | 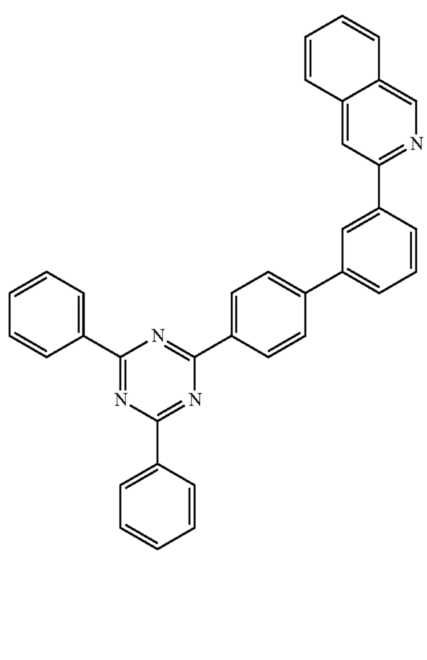 | 81% |

-continued
| Ex. | Syn-thon | Aryl halide [CAS number] | Ligand | Yield |
|---|---|---|---|---|
| L77 | S7 | 927898-18-8 | 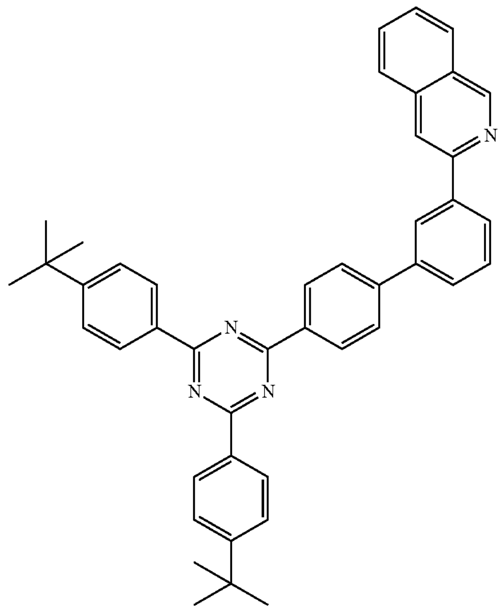 [SMILES: CC(C)(C)c1ccc(-c2nc(-c3ccc(-c4cccc(-c5cc6ccccc6cn5)c4)cc3)nc(-c3ccc(C(C)(C)C)cc3)n2)cc1] | 78% |
| L78 | S7 | 457613-56-8 | 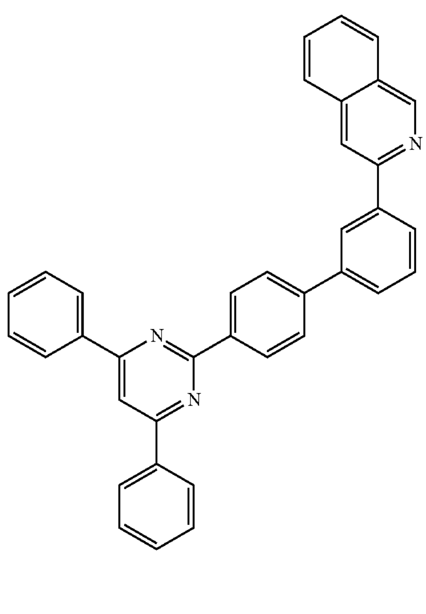 [SMILES: c1ccc(-c2cc(-c3ccccc3)nc(-c3ccc(-c4cccc(-c5cc6ccccc6cn5)c4)cc3)n2)cc1] | 80% |

-continued
| Ex. | Syn-thon | Aryl halide [CAS number] | Ligand | Yield |
|---|---|---|---|---|
| L79 | S8 | 23449-08-3 | 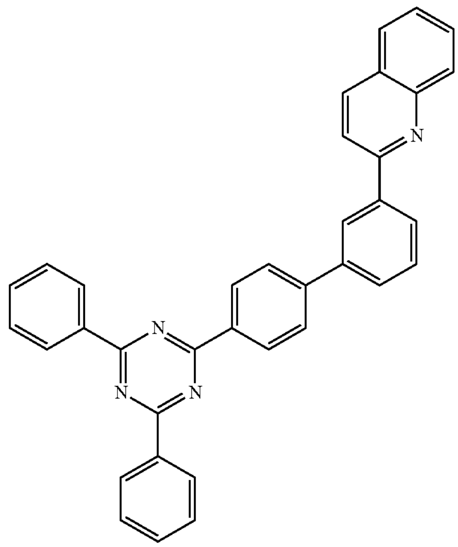 [SMILES: c1ccc(-c2nc(-c3ccccc3)nc(-c3ccc(-c4cccc(-c5ccc6ccccc6n5)c4)cc3)n2)cc1] | 69% |
| L80 | S8 | 927898-18-8 | 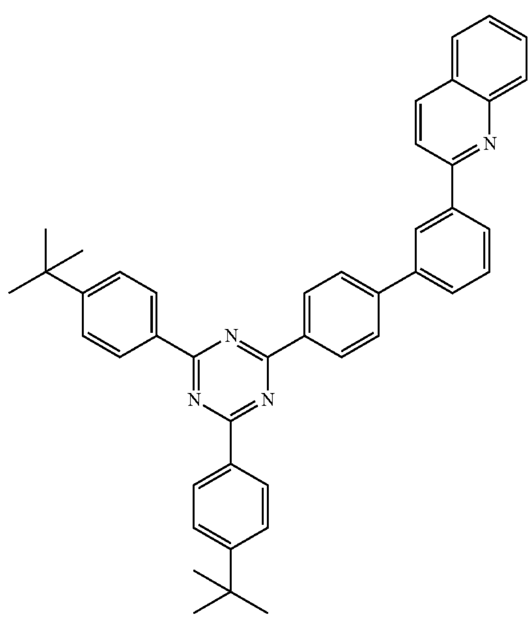 [SMILES: CC(C)(C)c1ccc(-c2nc(-c3ccc(-c4cccc(-c5ccc6ccccc6n5)c4)cc3)nc(-c3ccc(C(C)(C)C)cc3)n2)cc1] | 73% |

-continued
| Ex. | Syn-thon | Aryl halide [CAS number] | Ligand | Yield |
|---|---|---|---|---|
| L81 | S8 | 457613-56-8 | 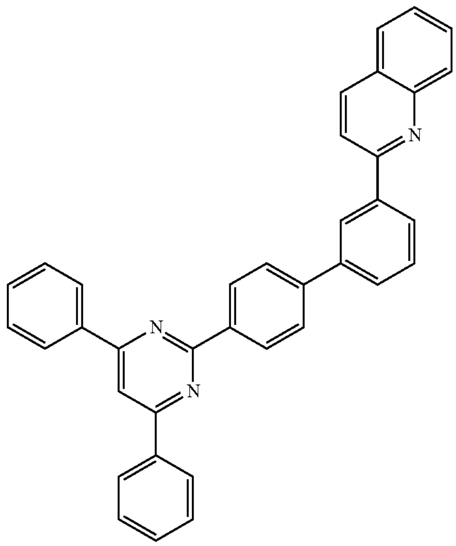 [SMILES: c1ccc(-c2cc(-c3ccccc3)nc(-c3ccc(-c4cccc(-c5ccc6ccccc6n5)c4)cc3)n2)cc1] | 78% |
| L82 | S9 | 23449-08-3 | 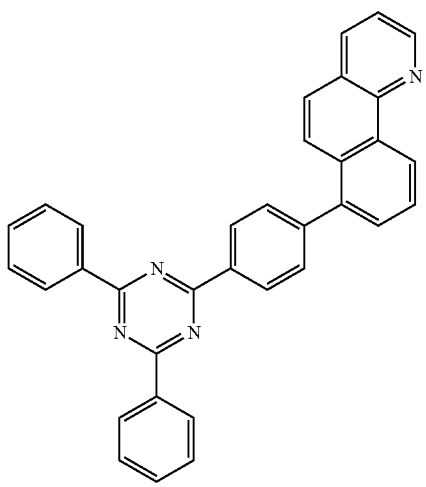 [SMILES: c1ccc(-c2nc(-c3ccccc3)nc(-c3ccc(-c4cccc5c4ccc4cccnc45)cc3)n2)cc1] | 72% |
| L83 | S9 | 927898-18-8 | 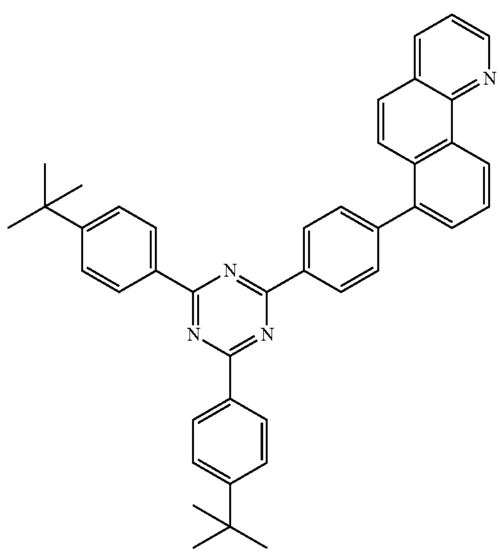 [SMILES: CC(C)(C)c1ccc(-c2nc(-c3ccc(-c4cccc5c4ccc4cccnc45)cc3)nc(-c3ccc(C(C)(C)C)cc3)n2)cc1] | 61% |

-continued
| Ex. | Syn-thon | Aryl halide [CAS number] | Ligand | Yield |
|---|---|---|---|---|
| L84 | S9 | 457613-56-8 | 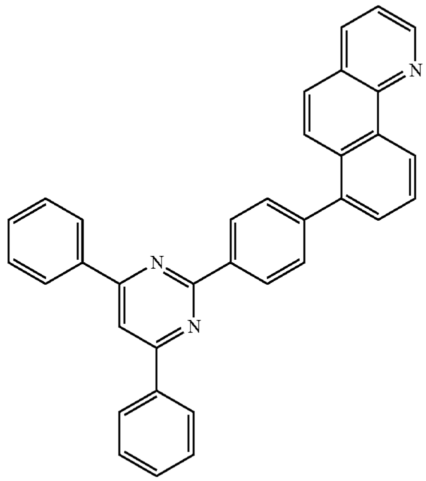 [SMILES: c1ccc(-c2cc(-c3ccccc3)nc(-c3ccc(-c4cccc5c4ccc4cccnc45)cc3)n2)cc1] | 67% |
| L85 | S10 | 23449-08-3 | 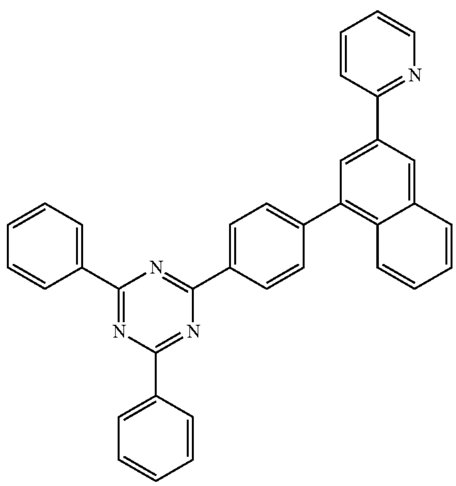 [SMILES: c1ccc(-c2nc(-c3ccccc3)nc(-c3ccc(-c4cc(-c5ccccn5)cc5ccccc45)cc3)n2)cc1] | 63% |
| L86 | S10 | 927898-18-8 | 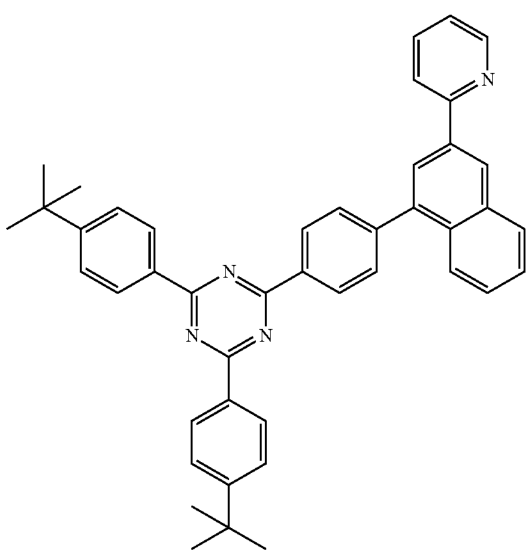 [SMILES: CC(C)(C)c1ccc(-c2nc(-c3ccc(-c4cc(-c5ccccn5)cc5ccccc45)cc3)nc(-c3ccc(C(C)(C)C)cc3)n2)cc1] | 58% |

-continued

| Ex. | Syn-thon | Aryl halide [CAS number] | Ligand | Yield |
|---|---|---|---|---|
| L87 | S10 | 457613-56-8 | 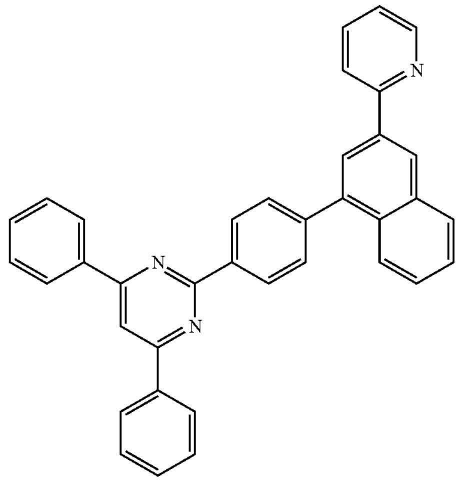 [SMILES: c1ccc(-c2cc(-c3ccccc3)nc(-c3ccc(-c4cc(-c5ccccn5)cc5ccccc45)cc3)n2)cc1] | 57% |
| L-V5 | S6 | 1476799-05-9 | 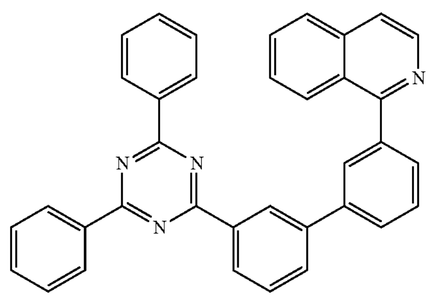 [SMILES: c1ccc(-c2nc(-c3ccccc3)nc(-c3cccc(-c4cccc(-c5nccc6ccccc56)c4)c3)n2)cc1] | 59% |

Synthesis of the Metal Complexes

1) Homoleptic Tris-Facial Iridium Complexes of the Phenyl-Pyridine, Phenyl-Imidazole or Phenyl-Benzimidazole Type Variant A: Tris(Acetylacetonato)Iridium(III) as Iridium Reactant A mixture of 10 mmol of tris(acetylacetonato)iridium(III) [15635-87-7] and 40-60 mmol (preferably 40 mmol) of the ligand L, optionally 1-10 g—typically 3 g—of an inert high-boiling additive as melting aid or solvent, for example hexadecane, m-terphenyl, triphenylene, bisphenyl ether, 3-phenoxytoluene, 1,2-, 1,3-, 1,4-bisphenoxybenzene, triphenylphosphine oxide, sulfolane, 18-crown-6, triethylene glycol, glycerol, polyethylene glycols, phenol, 1-naphthol, hydroquinone, etc., and a glass-ensheathed magnetic stirrer bar are sealed by melting under reduced pressure ($10^{-5}$ mbar) into a thick-wall 50 mL glass ampoule. The ampoule is heated at the temperature specified for the time specified, in the course of which the molten mixture is stirred with the aid of a magnetic stirrer. In order to prevent sublimation of the ligands at colder points in the ampoule, the whole ampoule has to have the temperature specified. Alternatively, the synthesis can be effected in a stirred autoclave with a glass insert. After cooling (CAUTION: the ampoules are usually under pressure!), the ampoule is opened, the sinter cake is stirred with 100 g of glass beads (diameter 3 mm) in 100 mL of a suspension medium (the suspension medium is chosen such that the ligand has good solubility but the metal complex has sparing solubility therein; typical suspension media are methanol, ethanol, dichloromethane, acetone, THF, ethyl acetate, toluene, etc.) for 3 h and mechanically digested in the process. The fine suspension is decanted off from the glass beads, and the solids are filtered off with suction, washed with 50 mL of the suspension medium and dried under reduced pressure. The dry solid is placed in a continuous hot extractor on an Alox bed of height 3-5 cm (Alox, basic, activity level 1) and then extracted with an extractant (initial charge of about 500 mL; the extractant is chosen such that the complex has good solubility in the hot extractant and sparing solubility in the cold extractant; particularly suitable extractants are hydrocarbons such as toluene, xylenes, mesitylene, naphthalene, o-dichlorobenzene; halogenated aliphatic solvents are generally unsuitable since they sometimes halogenate the complexes or cause them to break down). After the extraction has ended, the extractant is concentrated under 4 reduced pressure to about 100 mL. Metal complexes having too good a solubility in the extractant are made to crystallize by dropwise addition of 200 mL of methanol. The solid from the suspensions thus obtained is filtered off with suction, washed once with about 50 mL of methanol and dried. After drying, the purity of the metal complex is determined by means of NMR and/or HPLC. If the purity is below 99.5%, the hot extraction step is repeated, omitting the Alox bed from the 2nd extraction onward. Once the purity of 99.5%-99.9% has been attained, the metal complex is heat-treated or chromatographed. The heat treatment is effected under high vacuum (p about $10^{-6}$ mbar) within the temperature range of about 200-300° C. Complexes having good solubility in organic solvents can alternatively also be chromatographed on silica gel.

If chiral ligands are used, the fac metal complexes derived are obtained as a diastereomer mixture. The enantiomers Λ,Δ of the C3 point group generally have much lower solubility in the extractant than the enantiomers of the C1 point group, which consequently accumulate in the mother liquor. Separation of the C3 from the C1 diastereomers in this way is frequently possible. In addition, the diastereomers can also be separated by chromatography. If ligands of the C1 point group are used in enantiomerically pure form, a Λ,Δ diastereomer pair of the C3 point group is the result. The diastereomers can be separated by crystallization or chromatography and hence be obtained as enantiomerically pure compounds.

Variant B: Tris(2,2,6,6-tetramethyl-3,5-heptanedionato)iridium(III) as Iridium Reactant Procedure analogous to variant A, except using 10 mmol of tris(2,2,6,6-tetramethyl-3,5-heptanedionato)iridium [99581-86-9] in place of 10 mmol of trisacetylacetonatoiridium(III) [15635-87-7]. The use of this reactant is advantageous since the purity of the crude products obtained is frequently better than in variant A. In addition, the pressure buildup in the ampoule is frequently not as significant.

Variant C: Sodium [cis,trans-dichlorobis(acetylacetonato)]iridate(III) as Iridium Reactant A mixture of 10 mmol of sodium [cis,trans-di-chloro-bis(acetylacetonato)]iridate(III) [876296-21-8] and 60 mmol of the ligand in 50 mL of ethylene glycol, propylene glycol or diethylene glycol is heated under gentle reflux under a gentle argon stream for the time specified. After cooling to 60° C., the mixture is diluted while stirring with a mixture of 50 mL of ethanol and 50 mL of 2 N hydrochloric acid and stirred for a further 1 h, and the precipitated solids are filtered off with suction, washed three times with 30 mL each time of ethanol and then dried under reduced pressure. Purification by hot extraction or chromatography and fractional sublimation as described in A.

| Ex. | Ligand L | Ir complex Diastereomer | Variant Reaction medium Melting aid Reaction temp. Reaction time Suspension medium Extractant | Yield |
|---|---|---|---|---|
| $Ir(L1)_3$ | L1 | 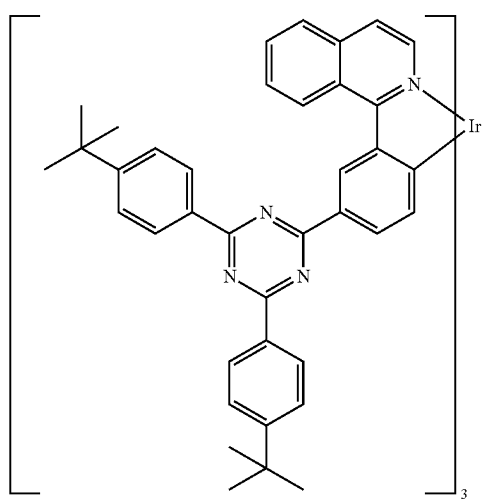 | A<br>—<br>—<br>285° C.<br>24 h<br>EtOH<br>toluene | 22% |
| $Ir(L2)_3$ | L2 | 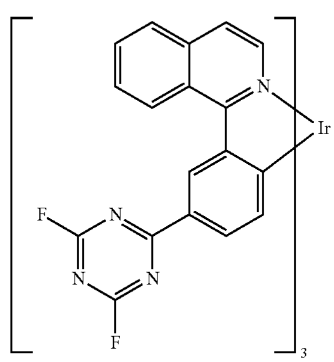 | A<br>—<br>—<br>265° C.<br>24 h<br>MeOH<br>toluene | 21% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L3)_3$ | L3 | 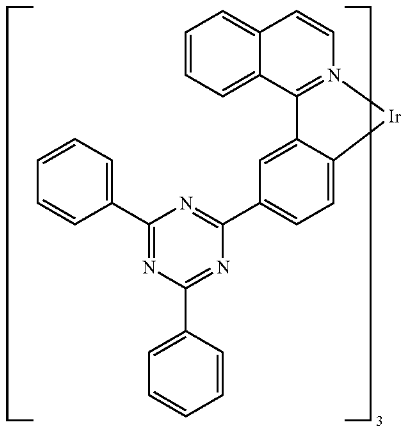 | A<br>—<br>—<br>285° C.<br>24 h<br>EtOH<br>o-xylene | 18% |
| $Ir(L4)_3$ | L4 | 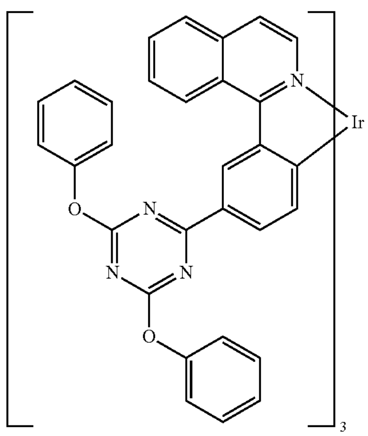 | A<br>—<br>—<br>275° C.<br>24 h<br>EtOH<br>toluene | 18% |
| $Ir(L5)_3$ | L5 | 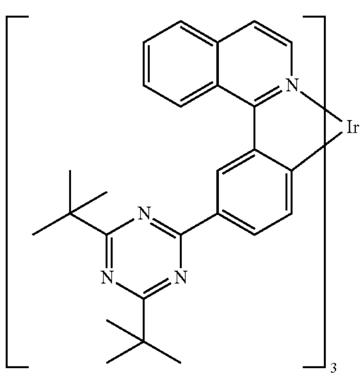 | as $Ir(L4)_3$ | 24% |

-continued
| Ex. | Ligand L | Ir complex Diastereomer | Variant Reaction medium Melting aid Reaction temp. Reaction time Suspension medium Extractant | Yield |
|---|---|---|---|---|
| Ir(L6)$_3$ | L6 | 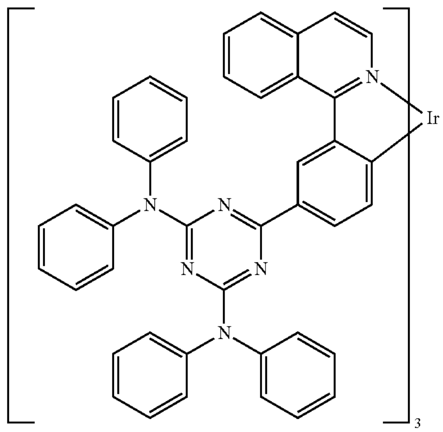 | B<br>—<br>—<br>285° C.<br>36 h<br>ethyl acetate<br>o-xylene | 16% |
| Ir(L7)$_3$ | L7 | 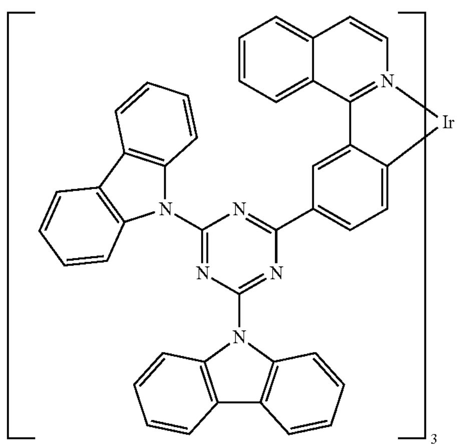 | A<br>—<br>1-naphthol<br>280° C.<br>24 h<br>ethyl acetate<br>toluene | 17% |
| Ir(L8)$_3$ | L8 | 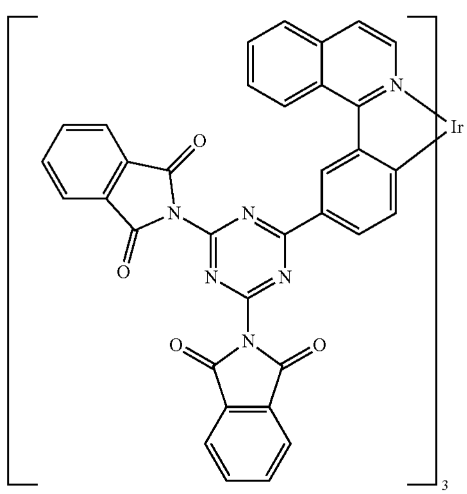 | A<br>—<br>1-naphthol<br>280° C.<br>24 h<br>ethanol<br>o-xylene | 15% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L9)_3$ | L9 | 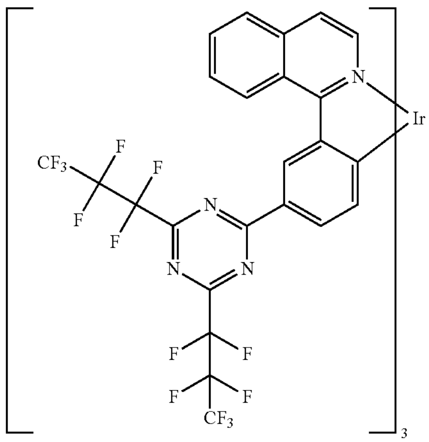 | A<br>—<br>1-naphthol<br>280° C.<br>24 h<br>ethyl acetate<br>toluene | 12% |
| $Ir(L10)_3$ | L10 | 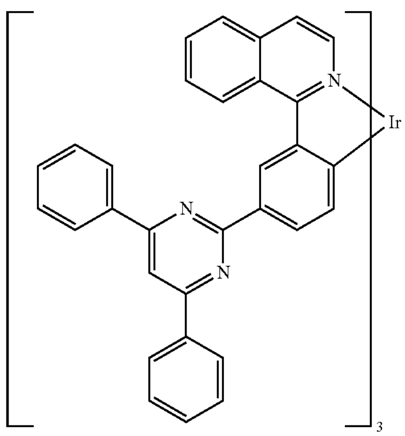 | A<br>—<br>—<br>275° C.<br>24 h<br>EtOH<br>o-xylene | 16% |
| $Ir(L11)_3$ | L11 | 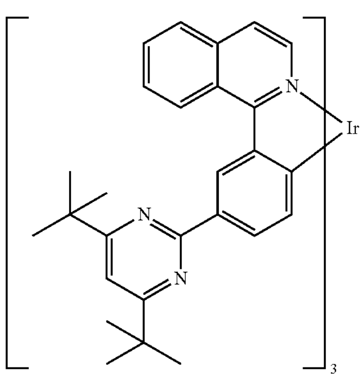 | A<br>—<br>—<br>275° C.<br>24 h<br>EtOH<br>toluene | 22% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L12)_3$ | L12 | 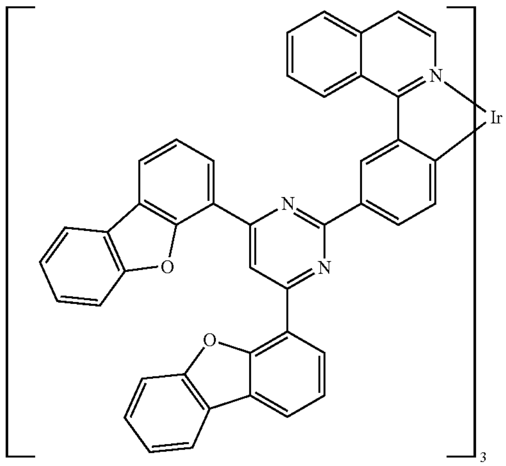 | A<br>—<br>hydroquinone<br>270° C.<br>24 h<br>ethyl acetate<br>toluene | 20% |
| $Ir(L13)_3$ | L13 | 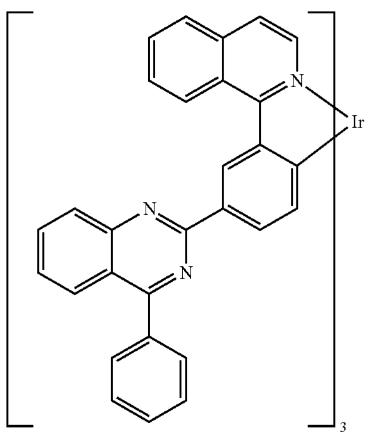 | A<br>—<br>—<br>280° C.<br>24 h<br>ethyl acetate<br>xylene | 16% |
| $Ir(L14)_3$ | L14 | 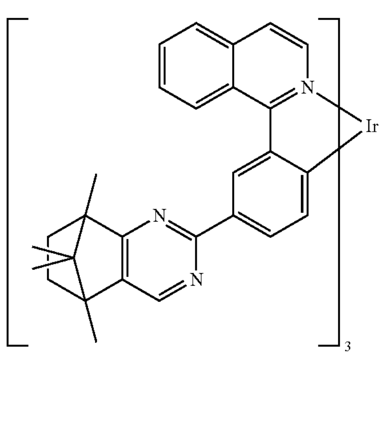 | A<br>—<br>—<br>270° C.<br>24 h<br>ethyl acetate<br>toluene | 24% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L15)_3$ | L15 | 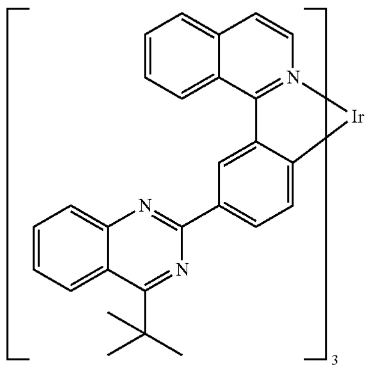 | A<br>—<br>—<br>280° C.<br>24 h<br>ethanol<br>toluene | 22% |
| $Ir(L16)_3$ | L16 | 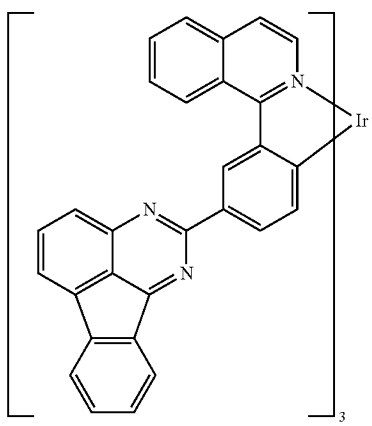 | A<br>—<br>1-naphthol<br>280° C.<br>24 h<br>ethyl acetate<br>chlorobenzene | 16% |
| $Ir(L17)_3$ | L17 | 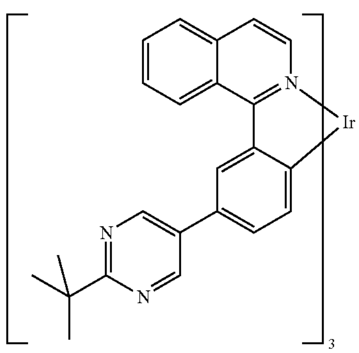 | A<br>—<br>—<br>280° C.<br>24 h<br>ethyl acetate<br>toluene | 27% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(L18)$_3$ | L18 | 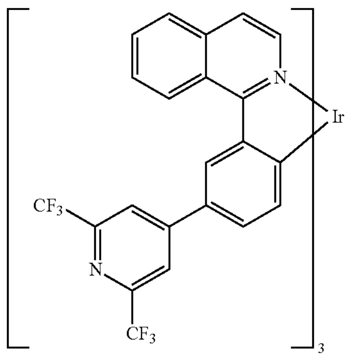 | A<br>—<br>hydroquinone<br>270° C.<br>24 h<br>ethyl acetate<br>toluene | 24% |
| Ir(L19)$_3$ | L19 | 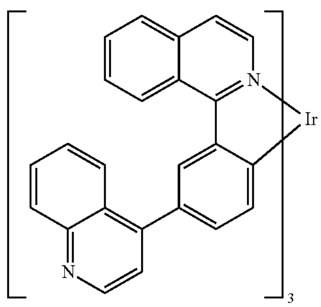 | A<br>—<br>hydroquinone<br>270° C.<br>24 h<br>ethyl acetate<br>toluene | 19% |
| Ir(L20)$_3$ | L20 | 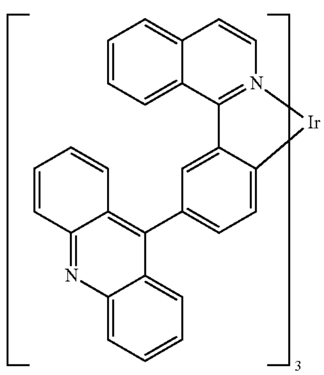 | B<br>—<br>—<br>300° C.<br>24 h<br>ethyl acetate<br>1,2-dichlorobenzene | 20% |
| Ir(L21)$_3$ | L21 | 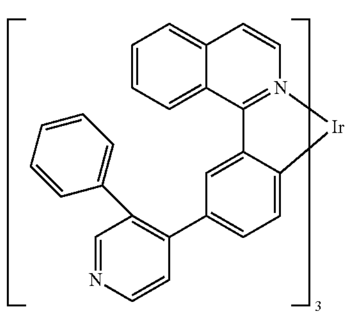 | A<br>—<br>—<br>285° C.<br>36 h<br>ethyl acetate<br>o-xylene | 20% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L22)_3$ | L22 | 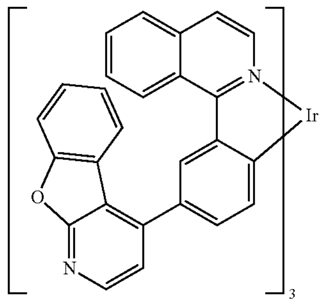 | A<br>—<br>hydroquinone<br>280° C.<br>24 h<br>ethyl acetate<br>toluene | 26% |
| $Ir(L23)_3$ | L23 | 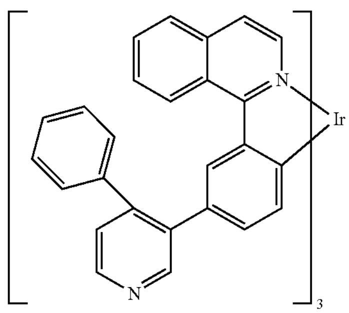 | C<br>—<br>—<br>285° C.<br>24 h<br>ethyl acetate<br>o-xylene | 23% |
| $Ir(L24)_3$ | L24 | 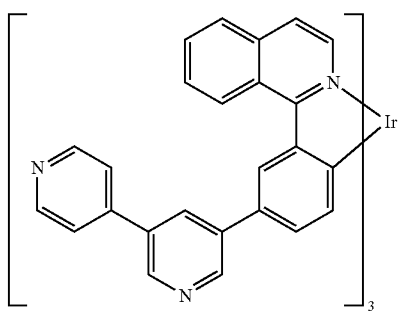 | C<br>—<br>—<br>285° C.<br>24 h<br>ethyl acetate<br>o-xylene | 12% |
| $Ir(L25)_3$ | L25 | 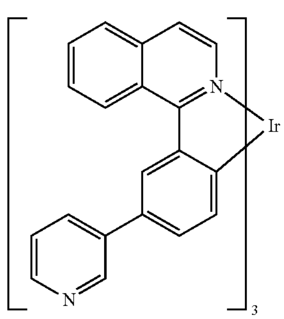 | as $Ir(L25)_3$ | 14% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L26)_3$ | L26 | 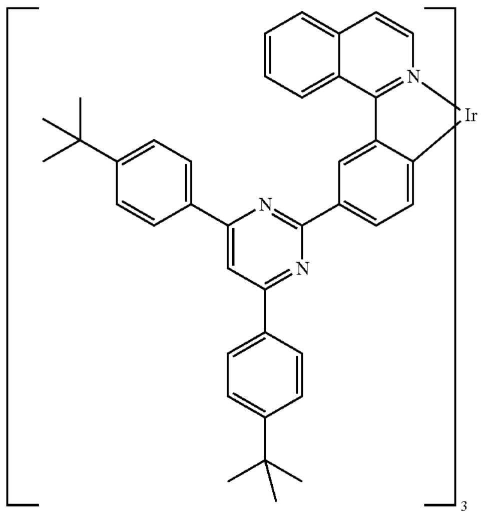 | A<br>—<br>—<br>275° C.<br>48 h<br>ethyl acetate<br>toluene | 34% |
| $Ir(L27)_3$ | L27 | 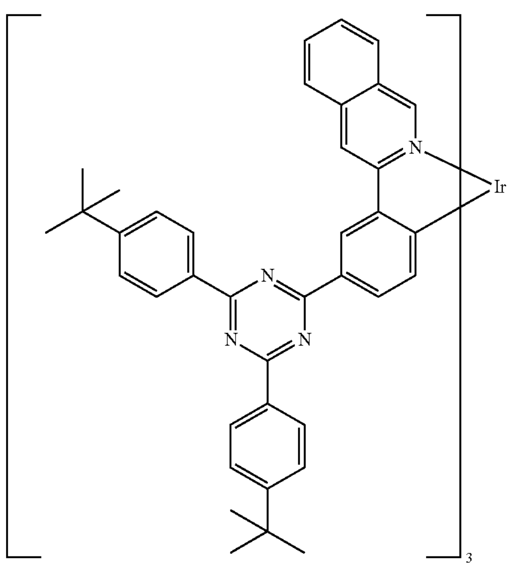 | A<br>—<br>—<br>285° C.<br>24 h<br>ethyl acetate<br>toluene | 25% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L28)_3$ | L28 | 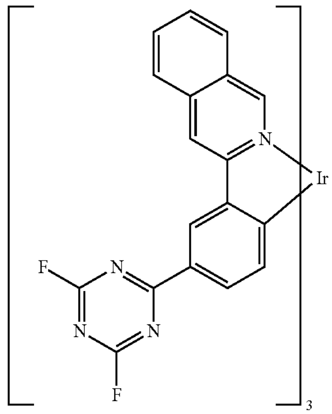 | C<br>—<br>—<br>275° C.<br>24 h<br>ethanol<br>mesitylene | 22% |
| $Ir(L29)_3$ | L29 | 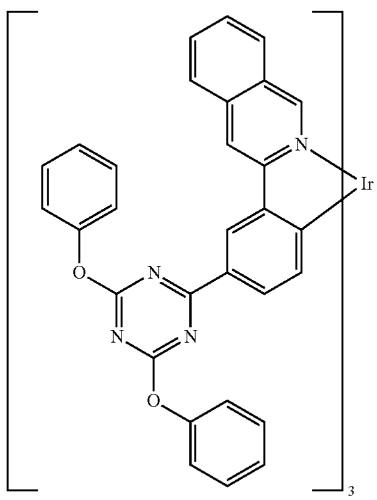 | A<br>—<br>hydroquinone<br>275° C.<br>24 h<br>ethanol<br>toluene | 20% |
| $Ir(L30)_3$ | L30 | 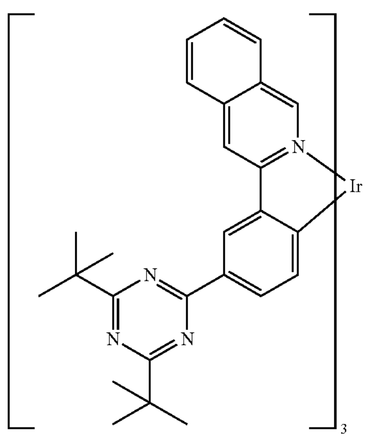 | as $Ir(L28)_3$ | 24% |

-continued
| Ex. | Ligand L | Ir complex Diastereomer | Variant Reaction medium Melting aid Reaction temp. Reaction time Suspension medium Extractant | Yield |
|---|---|---|---|---|
| Ir(L31)$_3$ | L31 | 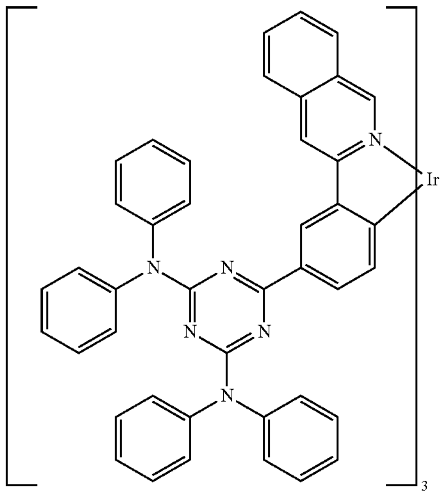 | C<br>—<br>—<br>285° C.<br>36 h<br>ethyl acetate<br>o-xylene | 18% |
| Ir(L32)$_3$ | L32 | 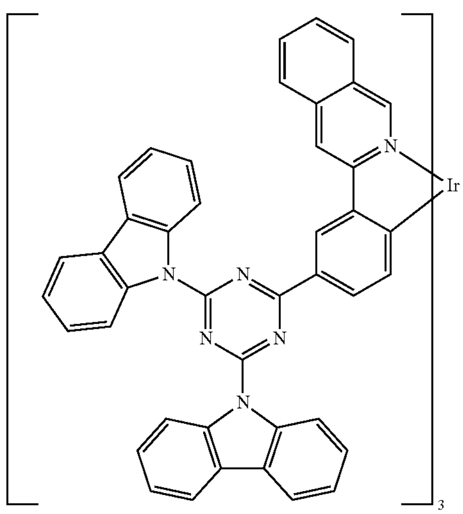 | A<br>—<br>hydroquinone<br>280° C.<br>24 h<br>ethyl acetate<br>chlorobenzene | 21% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L33)_3$ | L33 | 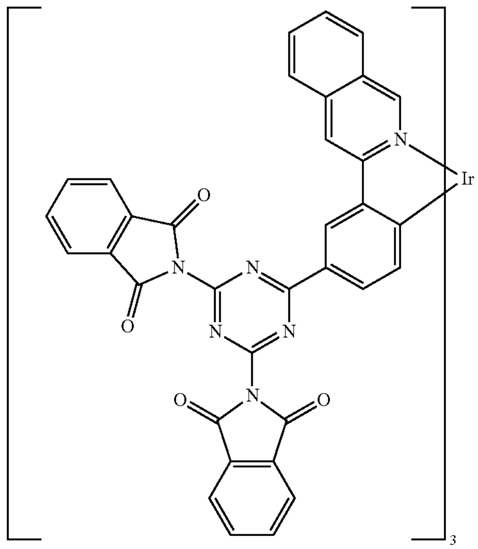 | B<br>—<br>—<br>290° C.<br>24 h<br>ethyl acetate<br>mesitylene | 14% |
| $Ir(L34)_3$ | L34 | 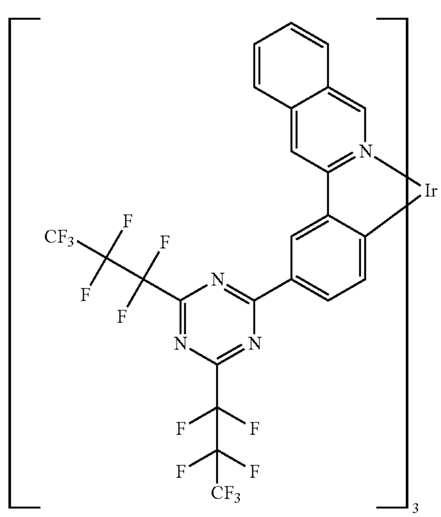 | A<br>—<br>hydroquinone<br>280° C.<br>36 h<br>ethyl acetate<br>chlorobenzene | 14% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L35)_3$ | L35 | 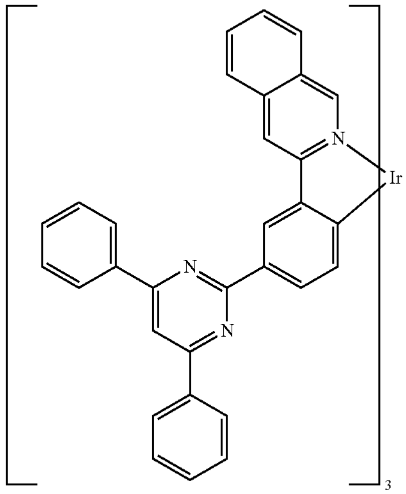 | A<br>—<br>—<br>290° C.<br>24 h<br>ethyl acetate<br>toluene | 21% |
| $Ir(L36)_3$ | L36 | 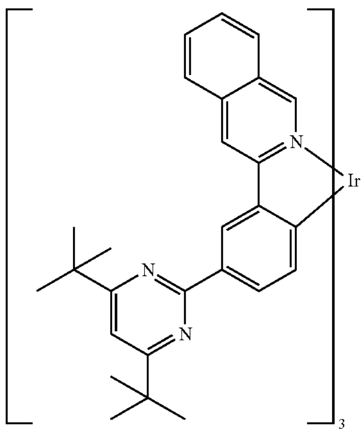 | A<br>—<br>—<br>280° C.<br>24 h<br>ethyl acetate<br>o-xylene | 18% |
| $Ir(L37)_3$ | L37 | 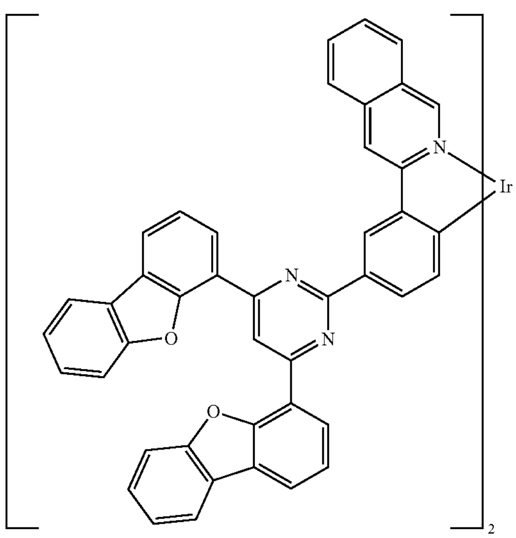 | A<br>—<br>1-naphthol<br>280° C.<br>24 h<br>ethyl acetate<br>toluene | 21% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L38)_3$ | L38 | 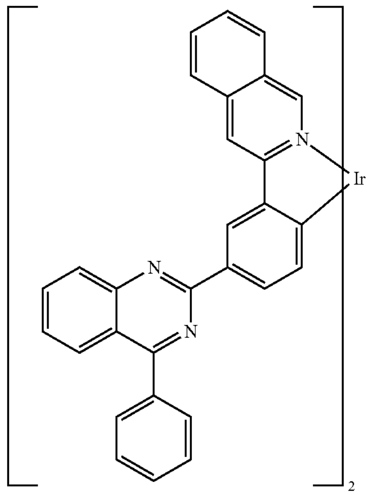 | A<br>—<br>hydroquinone<br>270° C.<br>24 h<br>ethyl acetate<br>o-xylene | 17% |
| $Ir(L39)_3$ | L39 | 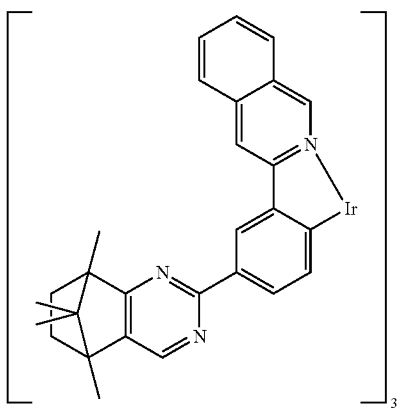 | B<br>—<br>—<br>290° C.<br>24 h<br>ethanol<br>toluene | 18% |
| $Ir(L40)_3$ | L40 | 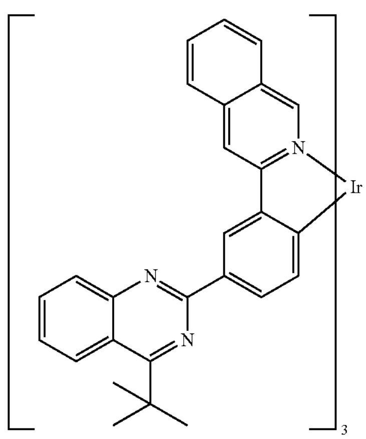 | C<br>—<br>—<br>280° C.<br>24 h<br>ethyl acetate<br>o-xylene | 15% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L41)_3$ | L41 | 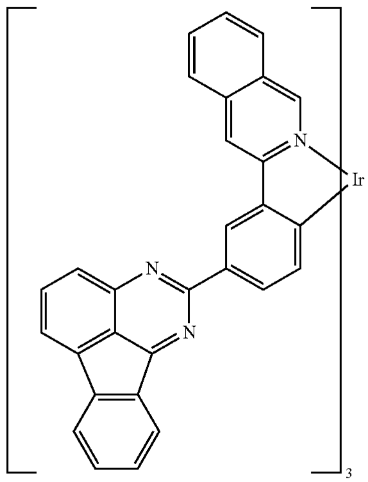 | A<br>—<br>1-naphthol<br>280° C.<br>24 h<br>ethyl acetate<br>mesitylene | 16% |
| $Ir(L42)_3$ | L42 | 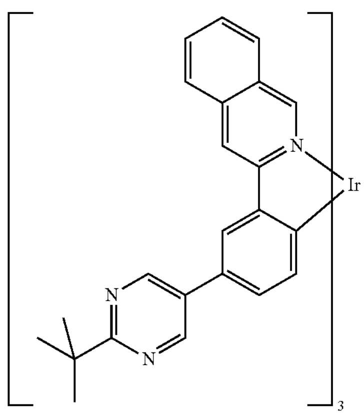 | A<br>—<br>—<br>270° C.<br>24 h<br>ethyl acetate<br>toluene | 16% |
| $Ir(L43)_3$ | L43 | 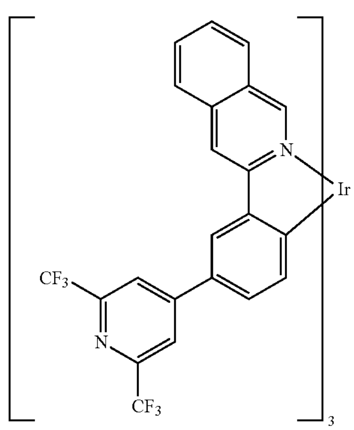 | C<br>—<br>—<br>280° C.<br>24 h<br>ethyl acetate<br>mesitylene | 16% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L44)_3$ | L44 | 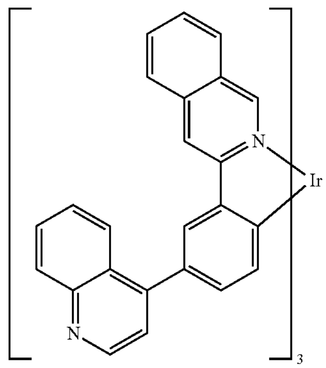 | A<br>—<br>hydroquinone<br>270° C.<br>24 h<br>ethyl acetate<br>o-xylene | 19% |
| $Ir(L45)_3$ | L45 | 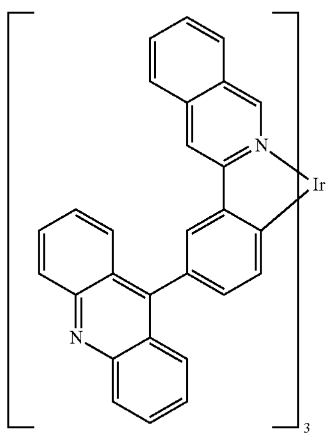 | B<br>—<br>—<br>300° C.<br>36 h<br>ethyl acetate<br>o-dichlorobenzene | 15% |
| $Ir(L46)_3$ | L46 | 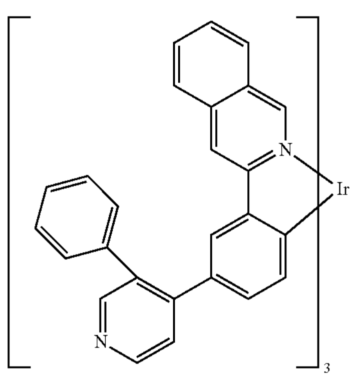 | as $Ir(L25)_3$ | 18% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L47)_3$ | L47 | 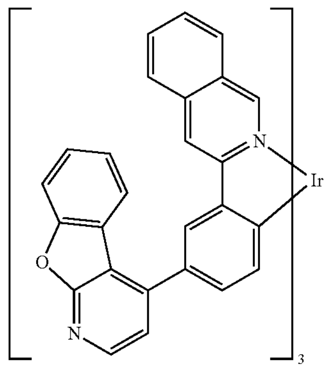 | B<br>—<br>—<br>290° C.<br>24 h<br>ethanol<br>toluene | 19% |
| $Ir(L48)_3$ | L48 | 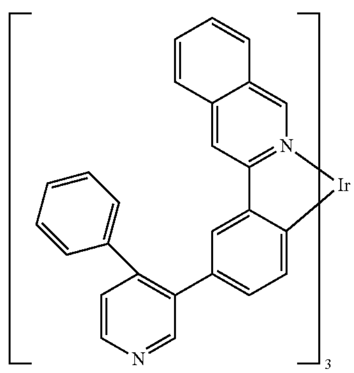 | as $Ir(L25)_3$ | 19% |
| $Ir(L49)_3$ | L49 | 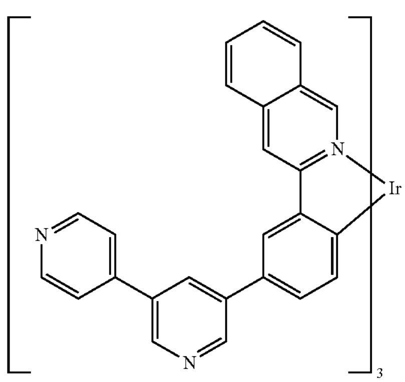 | as $Ir(L25)_3$ | 14% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L50)_3$ | L50 | 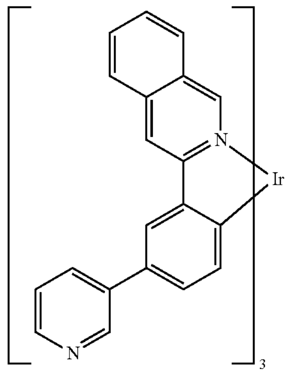 | as $Ir(L25)_3$ | 16% |
| $Ir(L51)_3$ | L51 | 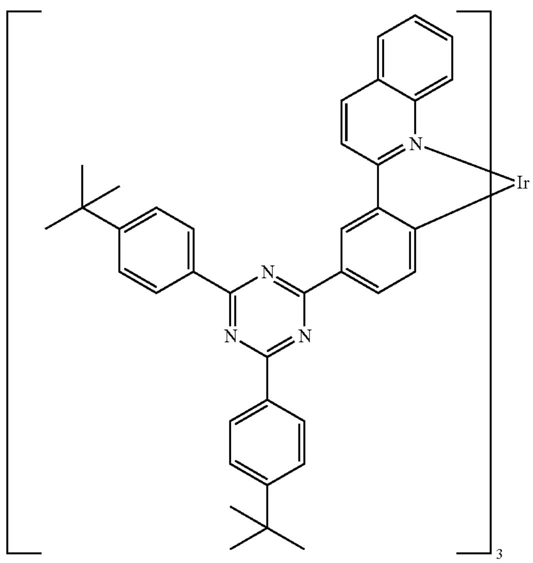 | B<br>—<br>—<br>290° C.<br>36 h<br>ethanol<br>toluene | 8% |
| $Ir(L52)_3$ | L52 | 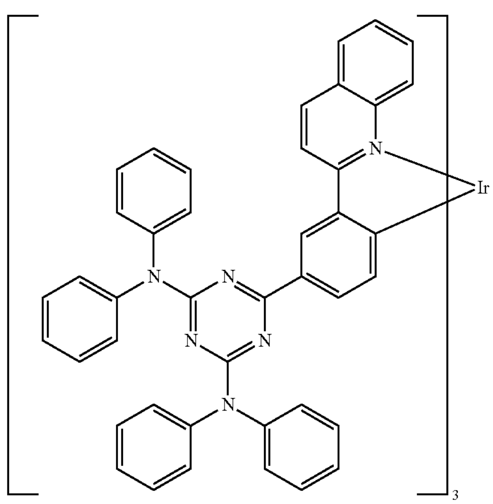 | as $Ir(L50)_3$ | 10% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L53)_3$ | L53 | 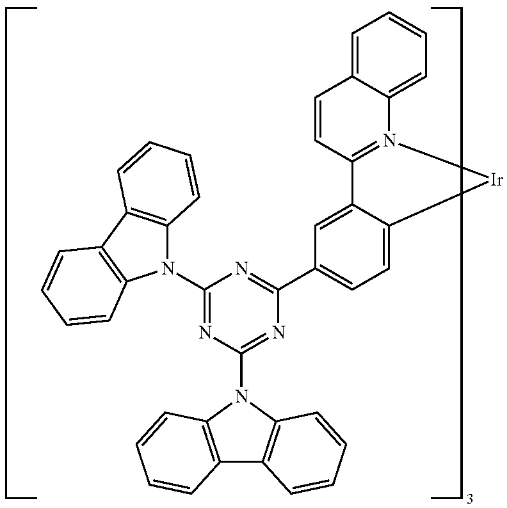 | as $Ir(L50)_3$ | 5% |
| $Ir(L54)_3$ | L54 | 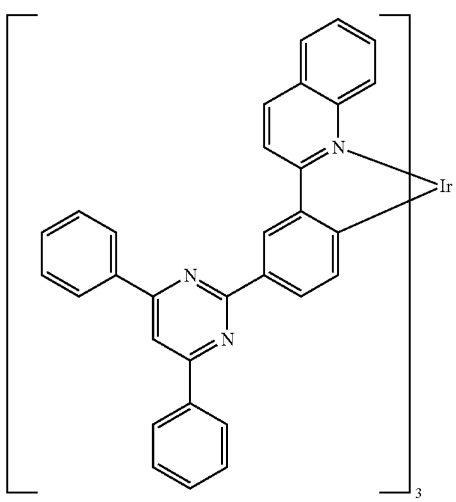 | as $Ir(L50)_3$ | 7% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L55)_3$ | L55 | 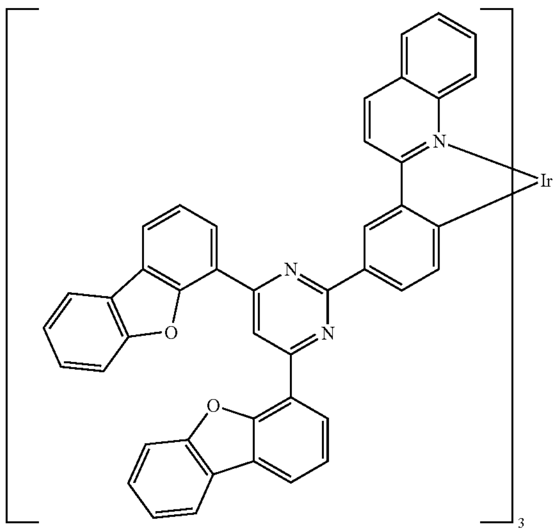 | A<br>—<br>hydroquinone<br>280° C.<br>24 h<br>ethyl acetate<br>o-xylene | 9% |
| $Ir(L56)_3$ | L56 | 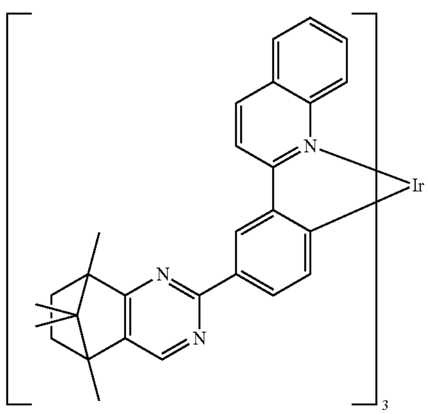 | as $Ir(L50)_3$ | 8% |
| $Ir(L57)_3$ | L57 | 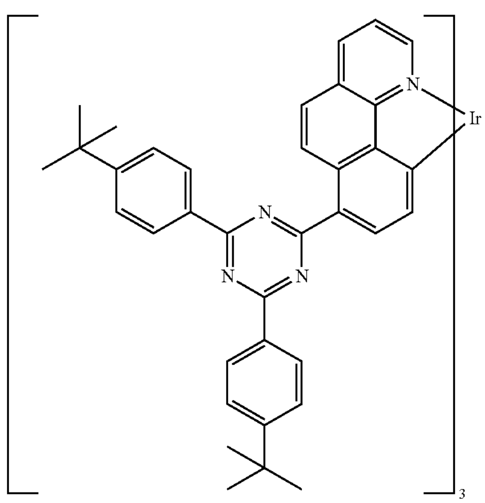 | A<br>—<br>—<br>280° C.<br>24 h<br>ethyl acetate<br>chlorobenzene | 18% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L58)_3$ | L58 | 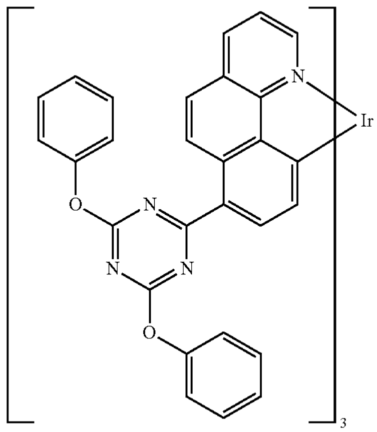 | A<br>—<br>—<br>280° C.<br>24 h<br>ethyl acetate<br>o-xylene | 16% |
| $Ir(L59)_3$ | L59 | 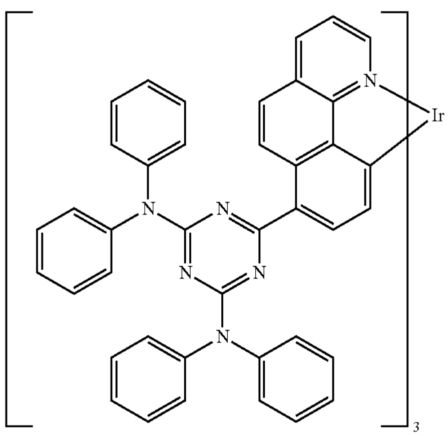 | as $Ir(L57)_3$ | 12% |
| $Ir(L60)_3$ | L60 | 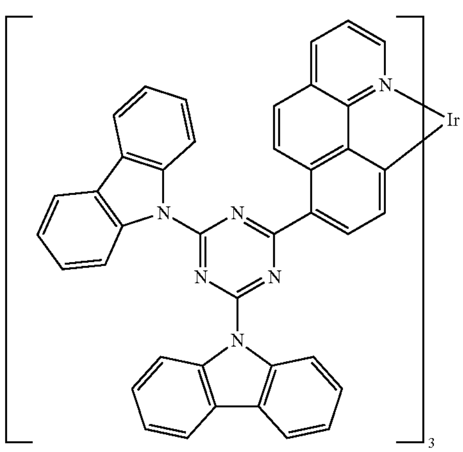 | as $Ir(L57)_3$ | 9% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L61)_3$ | L61 | 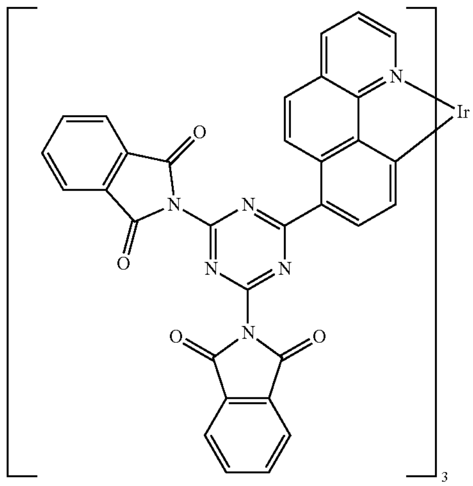 | A<br>—<br>hydroquinone<br>280° C.<br>24 h<br>ethyl acetate<br>o-dichlorobenzene | 8% |
| $Ir(L62)_3$ | L62 | 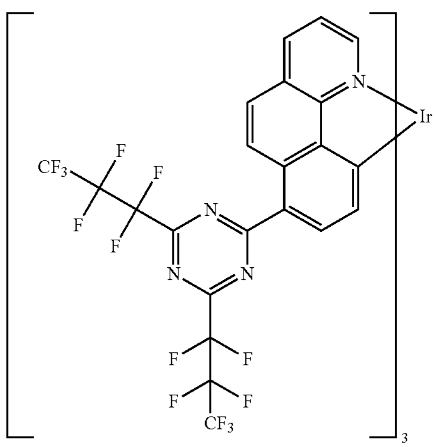 | as $Ir(L57)_3$ | 11% |
| $Ir(L63)_3$ | L63 | 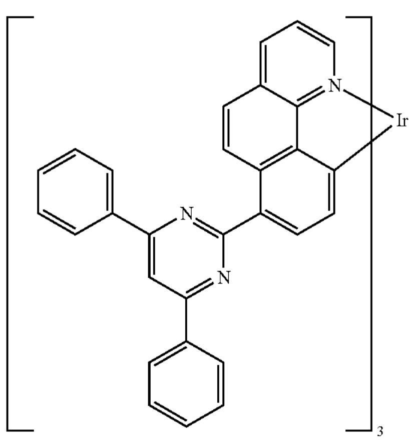 | as $Ir(L57)_3$ | 8% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L64)_3$ | L64 | 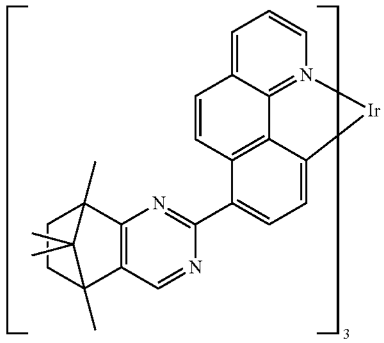 | as $Ir(L56)_3$ | 12% |
| $Ir(L65)_3$ | L65 | 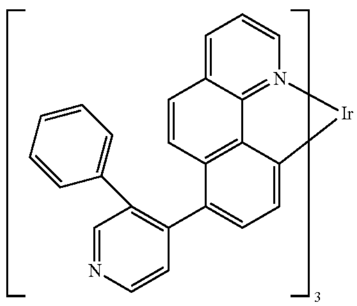 | C<br>—<br>—<br>280° C.<br>24 h<br>ethyl acetate<br>o-xylene | 8% |
| $Ir(L66)_3$ | L66 | 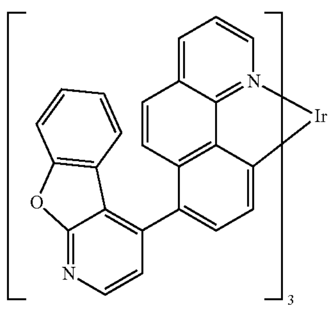 | A<br>—<br>1-naphthol<br>270° C.<br>36 h<br>ethyl acetate<br>mesitylene | 11% |
| $Ir(L67)_3$ | L67 | 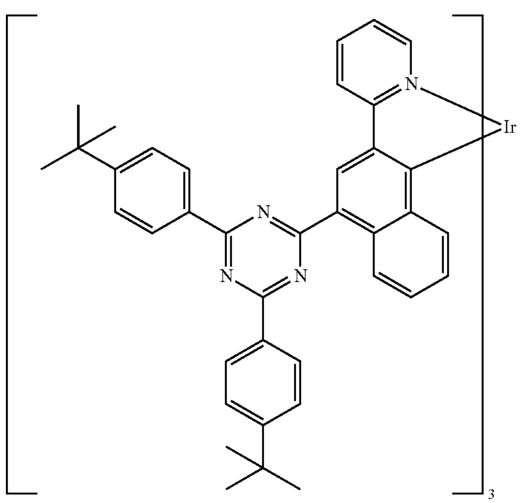 | B<br>—<br>—<br>290° C.<br>24 h<br>ethyl acetate<br>o-xylene | 5% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L68)_3$ | L68 | 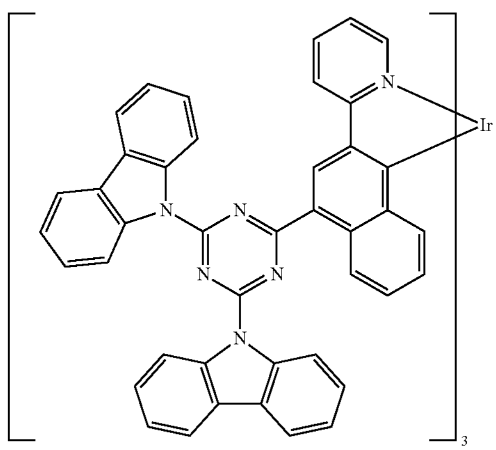 | A<br>—<br>hydroquinone<br>280° C.<br>24 h<br>ethyl acetate<br>chlorobenzene | 3% |
| $Ir(L69)_3$ | L69 | 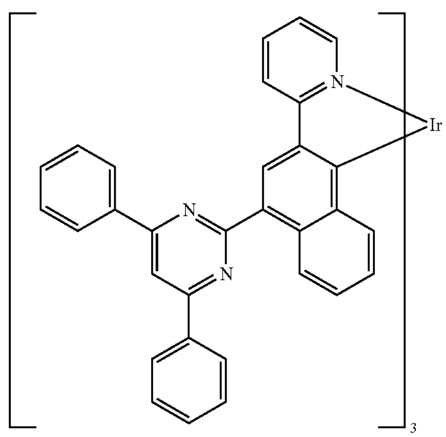 | C<br>—<br>—<br>280° C.<br>24 h<br>ethyl acetate<br>o-xylene | 6% |
| $Ir(L70)_3$ | L70 | 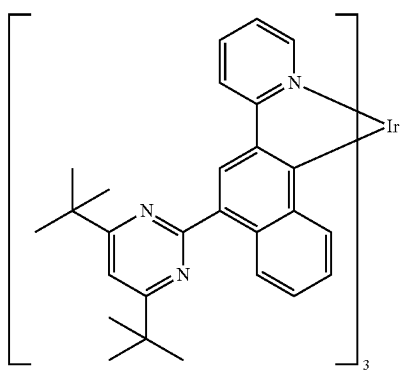 | C<br>—<br>—<br>270° C.<br>24 h<br>ethyl acetate<br>o-dichlorobenzene | 6% |

-continued
| Ex. | Ligand L | Ir complex Diastereomer | Variant Reaction medium Melting aid Reaction temp. Reaction time Suspension medium Extractant | Yield |
|---|---|---|---|---|
| Ir(L71)$_3$ | L71 | 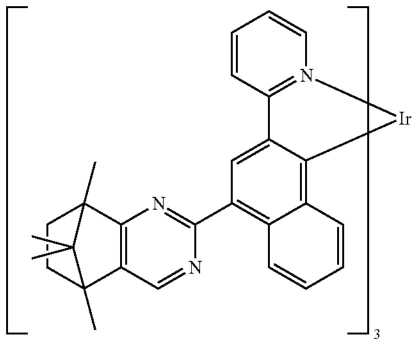 | A<br>—<br>—<br>270° C.<br>24 h<br>ethyl acetate<br>mesitylene | 5% |
| Ir(L72)$_3$ | L72 | 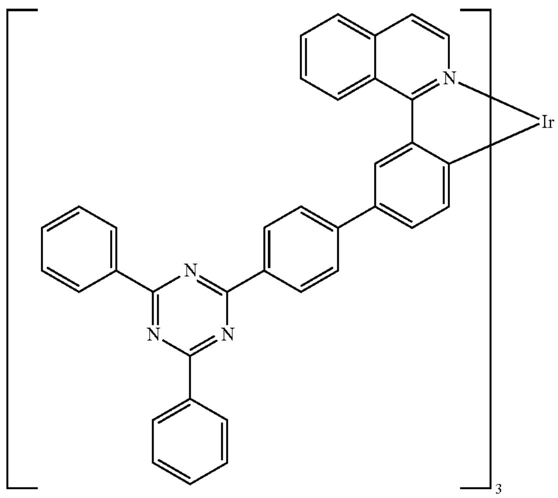 | A<br>—<br>—<br>260° C.<br>48 h<br>ethyl acetate<br>toluene | 15% |
| Ir(L73)$_3$ | L73 | 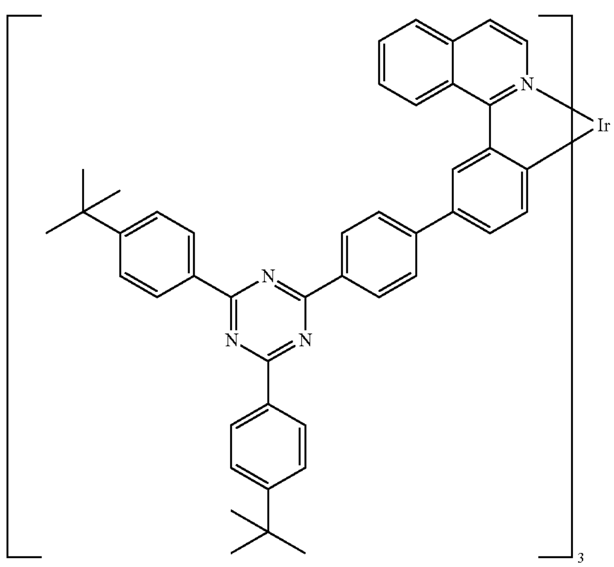 | A<br>—<br>—<br>260° C.<br>48 h<br>propanol<br>toluene | 12% |

-continued
| Ex. | Ligand L | Ir complex Diastereomer | Variant Reaction medium Melting aid Reaction temp. Reaction time Suspension medium Extractant | Yield |
|---|---|---|---|---|
| Ir(L74)$_3$ | L74 | 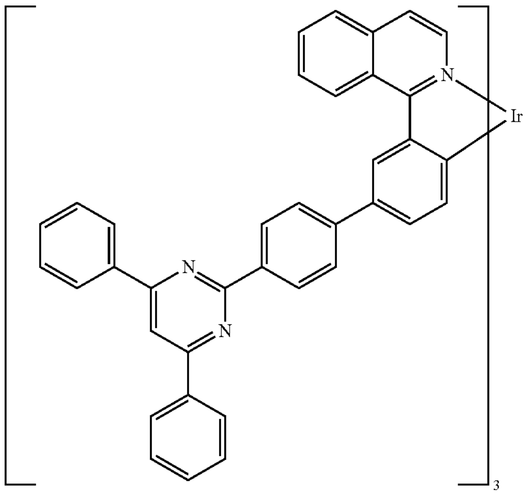 | A<br>—<br>—<br>250° C.<br>48 h<br>ethanol<br>toluene | 14% |
| Ir(L75)$_3$ | L75 | 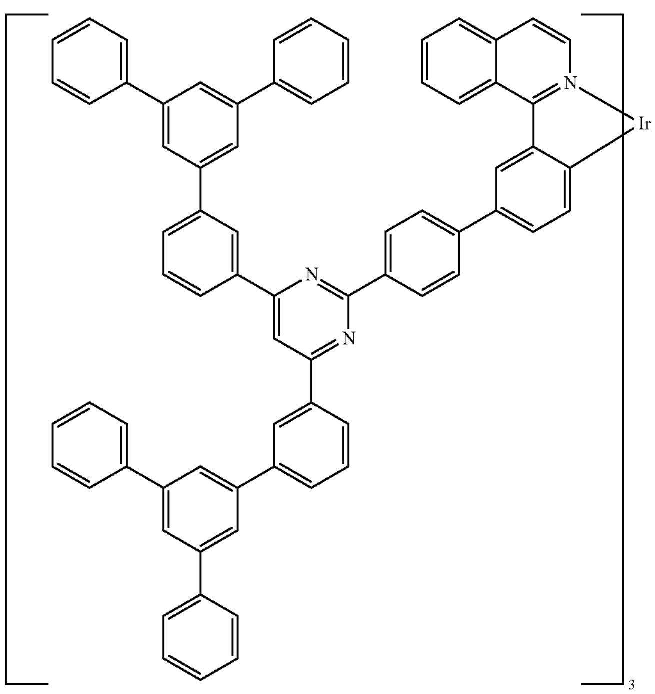 | A<br>—<br>—<br>250° C.<br>48 h<br>ethyl acetate<br>toluene | 18% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L76)_3$ | L76 | 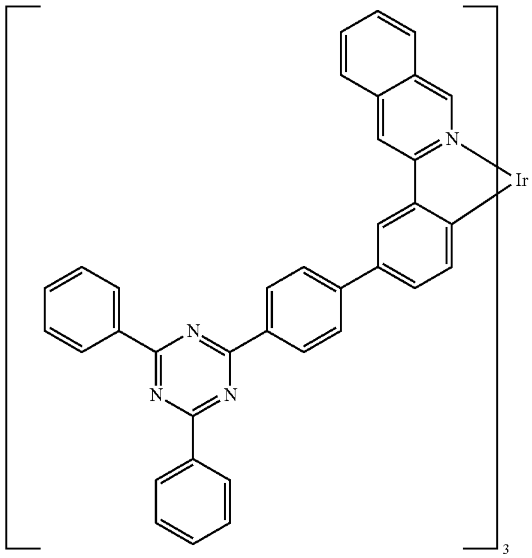 | A<br>—<br>—<br>260° C.<br>48 h<br>ethanol<br>o-xylene | 10% |
| $Ir(L77)_3$ | L77 | 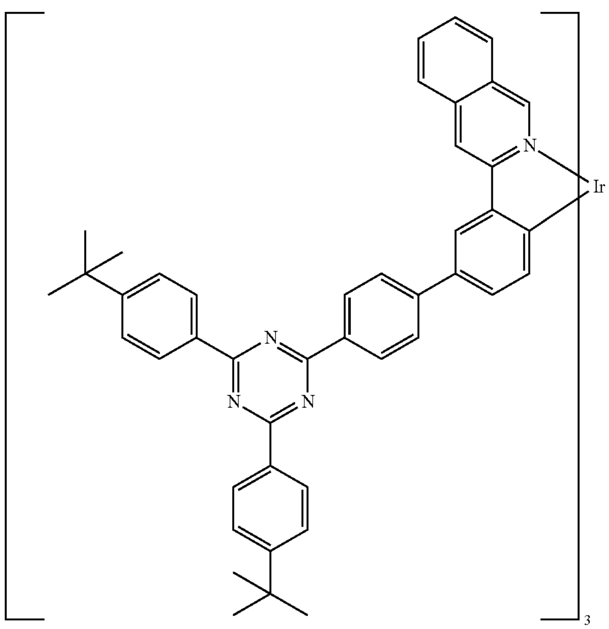 | A<br>—<br>—<br>255° C.<br>48 h<br>methanol<br>toluene | 14% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L78)_3$ | L78 | 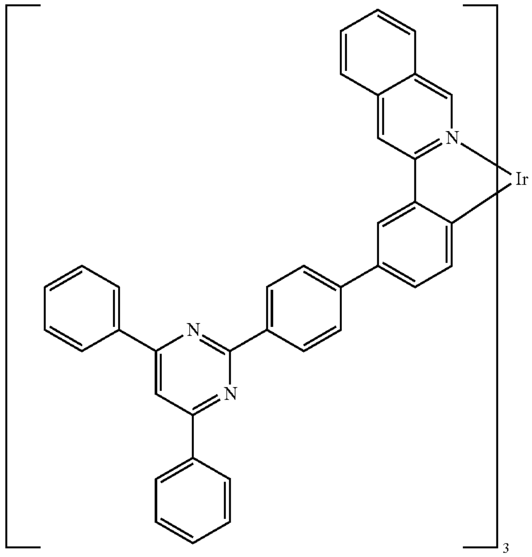 | A<br>—<br>—<br>255° C.<br>48 h<br>ethanol<br>p-xylene | 7% |
| $Ir(L79)_3$ | L79 | 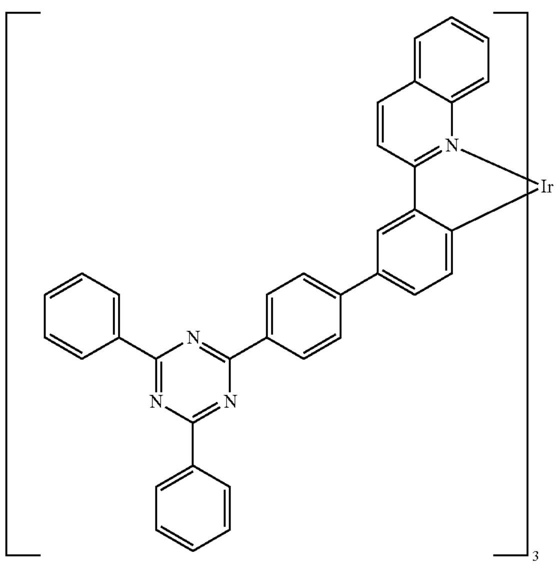 | A<br>—<br>—<br>260° C.<br>48 h<br>propanol<br>o-xylene | 2% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L80)_3$ | L80 | 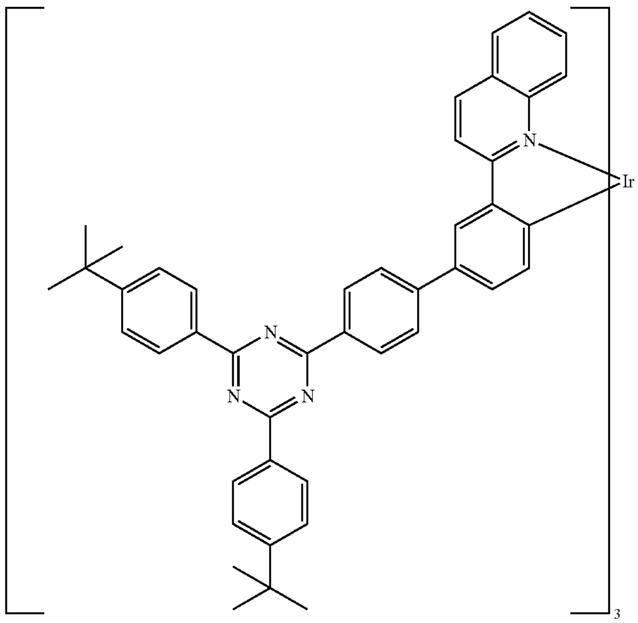 | A<br>—<br>—<br>260° C.<br>48 h<br>methanol<br>toluene | 5% |
| $Ir(L81)_3$ | L81 | 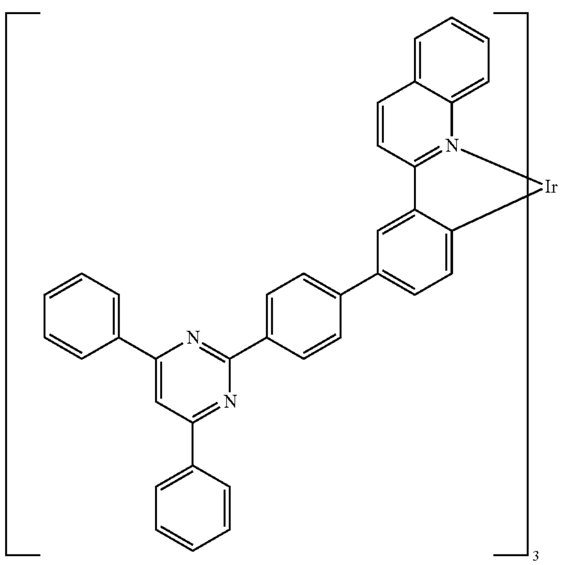 | A<br>—<br>—<br>260° C.<br>48 h<br>methanol<br>toluene | 6% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L82)_3$ | L82 | 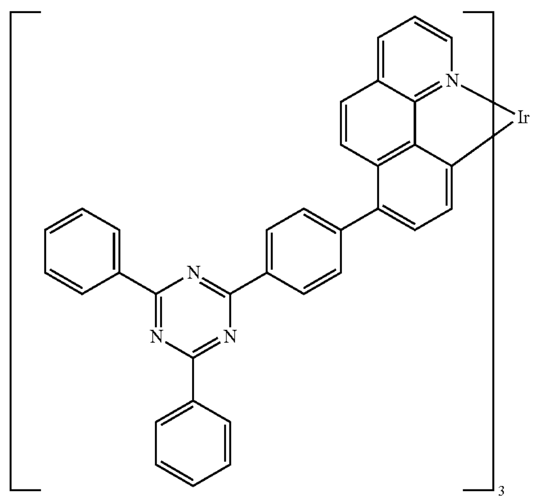 | A<br>—<br>—<br>260° C.<br>48 h<br>butanol<br>chlorobenzene | 19% |
| $Ir(L83)_3$ | L83 | 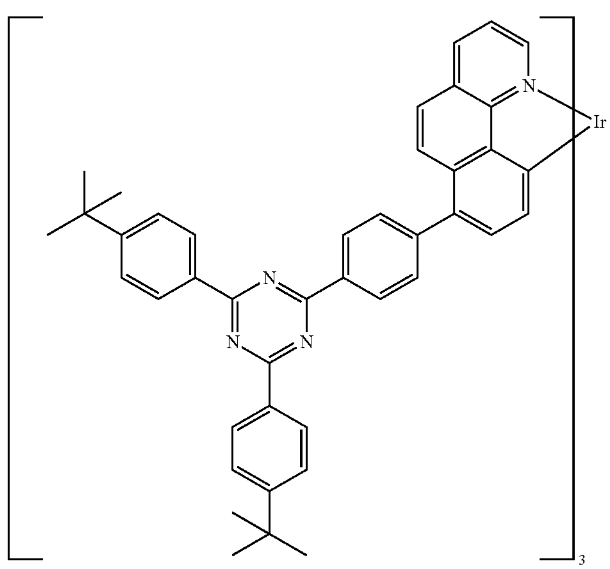 | A<br>—<br>—<br>260° C.<br>48 h<br>methanol<br>toluene | 21% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L84)_3$ | L84 | 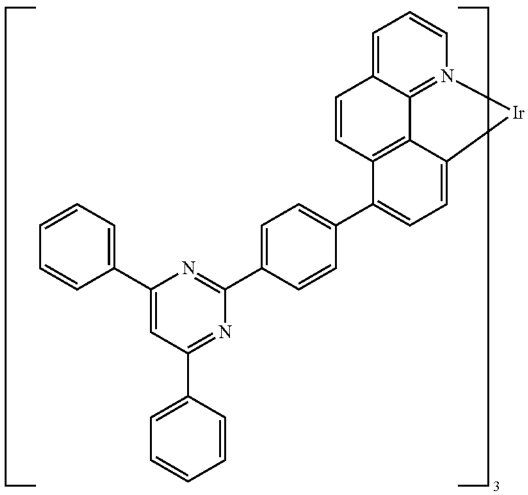 | A<br>—<br>—<br>260° C.<br>48 h<br>ethyl acetate<br>toluene | 23% |
| $Ir(L85)_3$ | L85 | 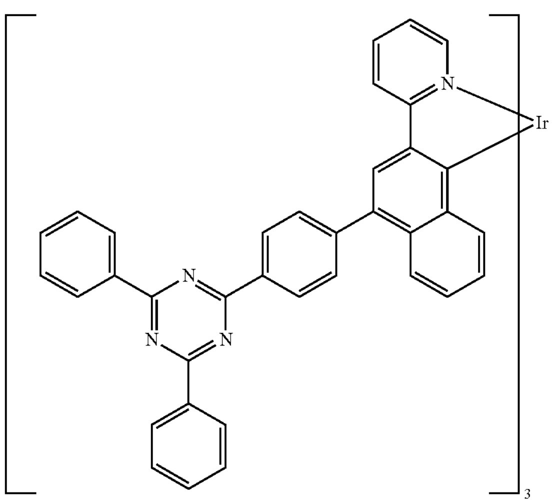 | A<br>—<br>—<br>260° C.<br>48 h<br>ethanol<br>toluene | 8% |

-continued
| Ex. | Ligand L | Ir complex Diastereomer | Variant Reaction medium Melting aid Reaction temp. Reaction time Suspension medium Extractant | Yield |
|---|---|---|---|---|
| $Ir(L86)_3$ | L86 | 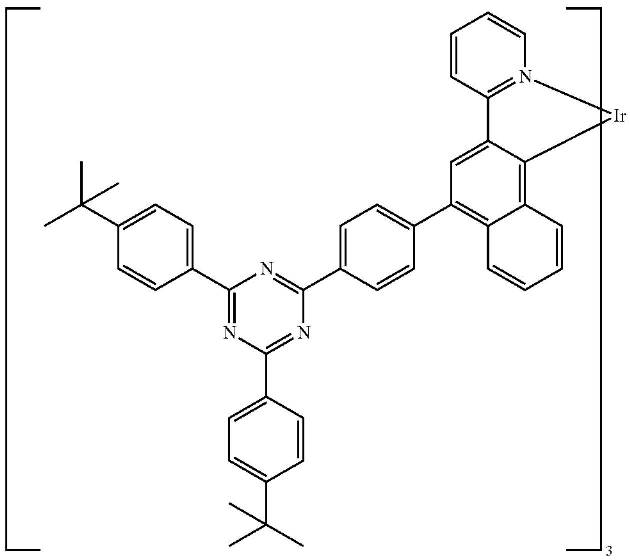 | A<br>—<br>—<br>260° C.<br>48 h<br>methanol<br>toluene | 6% |
| $Ir(L87)_3$ | L87 | 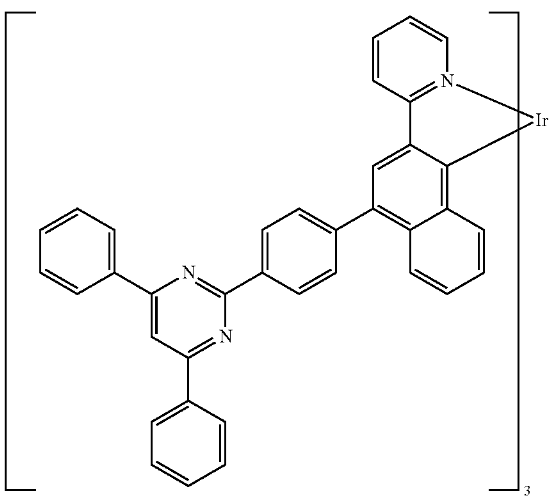 | A<br>—<br>—<br>260° C.<br>48 h<br>ethyl acetate<br>toluene | 7% |
| V5 | L-V5 | 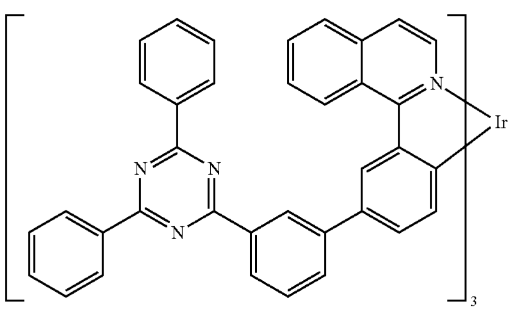 | A<br>—<br>—<br>260° C.<br>48 h<br>methanol<br>o-xylene | 17% |

2) Heteroleptic Iridium Complexes

Variant A

Step 1:

A mixture of 10 mmol of sodium bisacetylacetonatodichloroiridate(III) [770720-50-8] and 24 mmol of the ligand L and a glass-ensheathed magnetic stirrer bar are sealed by melting under reduced pressure ($10^{-5}$ mbar) into a thick-wall 50 mL glass ampoule. The ampoule is heated at the temperature specified for the time specified, in the course of which the molten mixture is stirred with the aid of a magnetic stirrer. After cooling—CAUTION: the ampoules are usually under pressure!—the ampoule is opened, the sinter cake is stirred with 100 g of glass beads (diameter 3 mm) in 100 mL of the suspension medium specified (the suspension medium is chosen such that the ligand has good solubility but the chloro dimer of the formula $[Ir(L)_2Cl]_2$ has sparing solubility therein; typical suspension media are DCM, acetone, ethyl acetate, toluene, etc.) for 3 h and mechanically digested in the process. The fine suspension is decanted off from the glass beads, and the solid $[Ir(L)_2Cl]_2$ which still contains about 2 eq of NaCl, referred to hereinafter as the crude chloro dimer) is filtered off with suction and dried under reduced pressure.

Step 2:

The crude chloro dimer of the formula $[Ir(L)_2Cl]_2$ thus obtained is suspended in a mixture of 75 mL of 2-ethoxyethanol and 25 mL of water, and 13 mmol of the coligand CL or of the coligand compound CL and 15 mmol of sodium carbonate are added thereto. After 20 h under reflux, a further 75 mL of water are added dropwise, the mixture is cooled and then the solids are filtered off with suction, and these are washed three times with 50 mL each time of water and three times with 50 mL each time of methanol, and dried under reduced pressure. The dry solid is placed in a continuous hot extractor on an Alox bed of height 3-5 cm (Alox, basic, activity level 1) and then extracted with the extractant specified (initial charge of about 500 mL; the extractant is chosen such that the complex has good solubility in the hot extractant and sparing solubility in the cold extractant; particularly suitable extractants are hydrocarbons such as toluene, xylenes, mesitylene, naphthalene, o-dichlorobenzene, tetrahydrofuran, dichloromethane, 1,2-dichloroethane, 1,1,2,2-tetrachloroethane, chloroform, carbon tetrachloride). After the extraction has ended, the extractant is concentrated under reduced pressure to about 100 mL. Metal complexes having too good a solubility in the extractant are made to crystallize by dropwise addition of 200 mL of methanol. The solid from the suspensions thus obtained is filtered off with suction, washed once with about 50 mL of methanol and dried. After drying, the purity of the metal complex is determined by means of NMR and/or HPLC. If the purity is below 99.5%, the hot extraction step is repeated; once a purity of 99.5%-99.9% has been attained, the metal complex is subjected to heat treatment or sublimation. As well as the hot extraction process for purification, purification can also be effected by chromatography on silica gel or Alox. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

| Ex. | Ligand L | Co-ligand CL | Ir complex Step 1: Reaction temp./ Reaction time/ Suspension medium Step 2: Extractant | Yield |
|---|---|---|---|---|
| $Ir(L1)_2(CL1)$ | L1 | 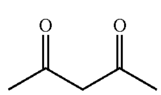 123-54-6 CL1 | 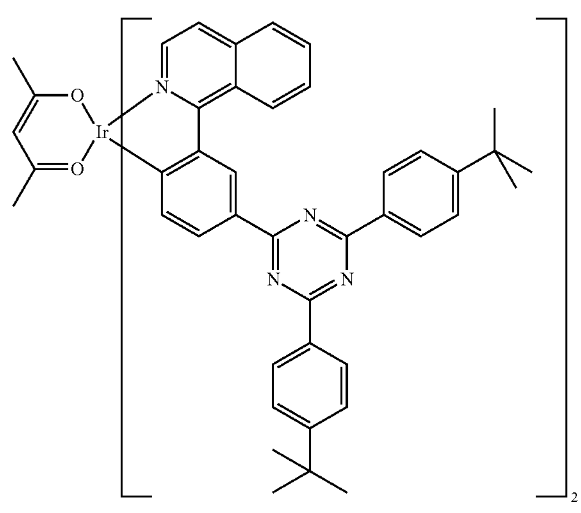 260° C./60 h/acetone toluene | 28% |

-continued
| Ex. | Ligand L | Co-ligand CL | Ir complex Step 1: Reaction temp./ Reaction time/ Suspension medium Step 2: Extractant | Yield |
|---|---|---|---|---|
| $Ir(L5)_2(CL1)$ | L5 | CL1 | 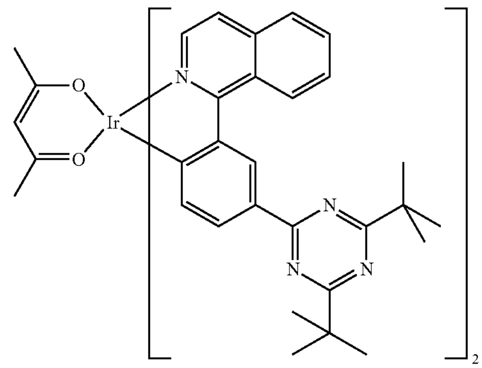 260° C./48 h/ethyl acetate o-xylene | 22% |
| $Ir(L6)_2(CL1)$ | L6 | CL1 | 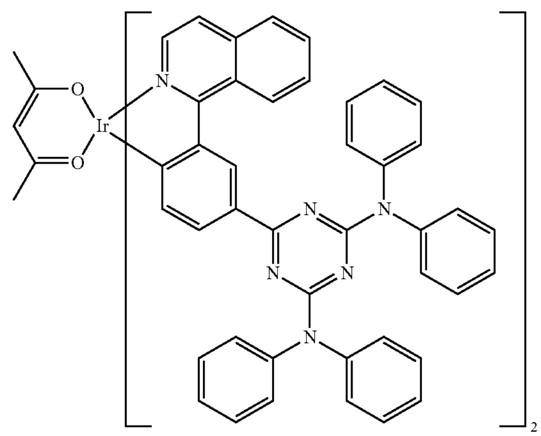 260° C./60 h/ethyl acetate toluene | 31% |
| $Ir(L10)_2(CL1)$ | L10 | CL1 | 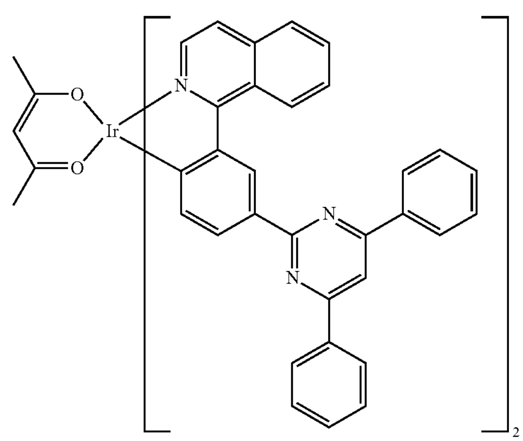 260° C./60 h/acetone toluene | 26% |

-continued
| Ex. | Ligand L | Co-ligand CL | Ir complex Step 1: Reaction temp./ Reaction time/ Suspension medium Step 2: Extractant | Yield |
|---|---|---|---|---|
| $Ir(L32)_2(CL1)$ | L32 | CL1 | 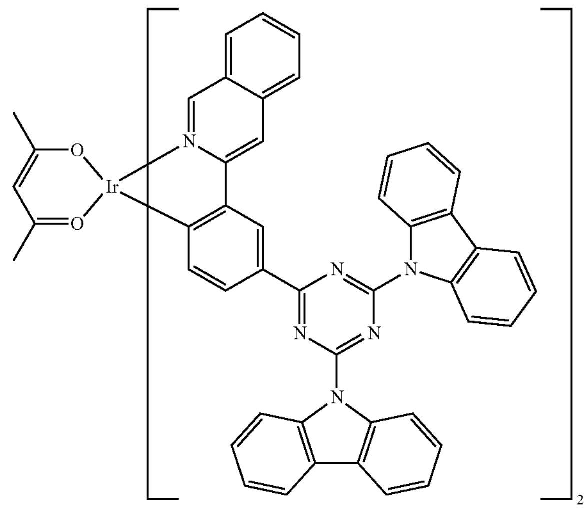 270° C./60 h/ethyl acetate toluene | 28% |
| $Ir(L37)_2(CL1)$ | L37 | CL1 | 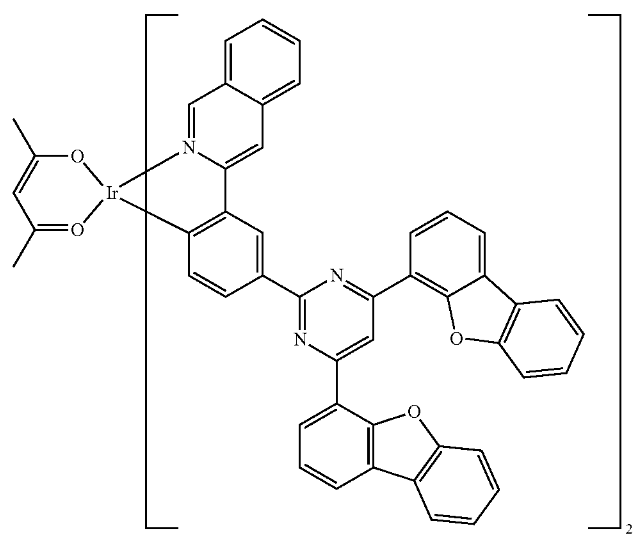 270° C./60 h/ethyl acetate toluene | 24% |

-continued
| Ex. | Ligand L | Co-ligand CL | Ir complex Step 1: Reaction temp./ Reaction time/ Suspension medium Step 2: Extractant | Yield |
|---|---|---|---|---|
| $Ir(L56)_2(CL1)$ | L56 | CL1 | 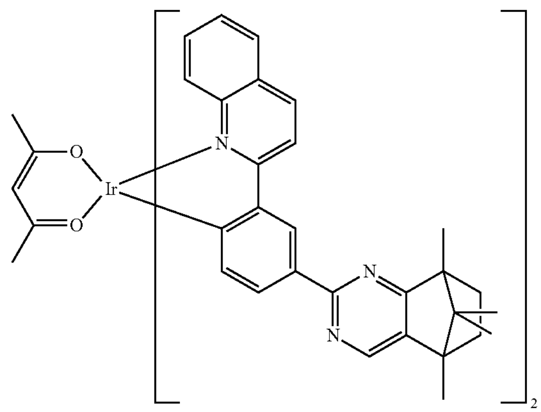 280° C./60 h/ethyl acetate xylene | 22% |
| $Ir(L51)_2(CL1)$ | L51 | CL2 | 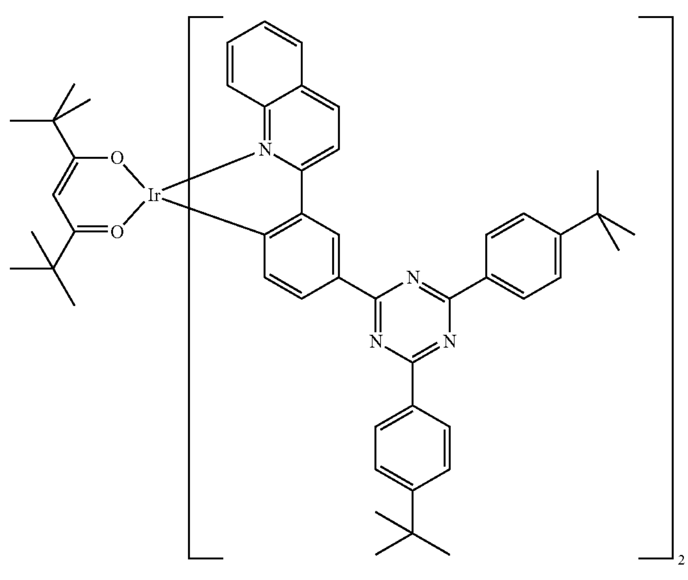 290° C./60 h/ethyl acetate xylene | 27% |

-continued
| Ex. | Ligand L | Co-ligand CL | Ir complex Step 1: Reaction temp./ Reaction time/ Suspension medium Step 2: Extractant | Yield |
| --- | --- | --- | --- | --- |
| $Ir(L52)_2(CL2)$ | L52 | CL2 | 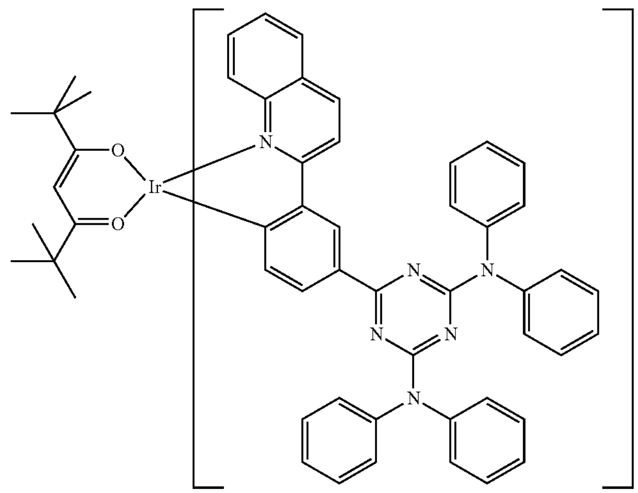 290° C./72 h/acetone xylene | 23% % |
| $Ir(L54)_2(CL2)$ | L54 | CL2 | 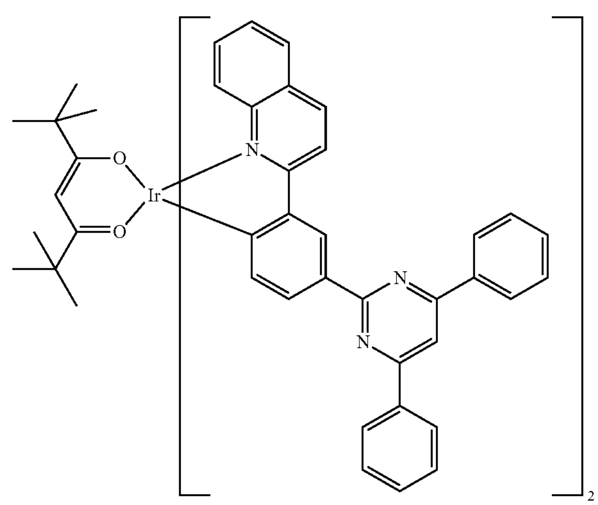 290° C./60 h/ethyl acetate THF | 26% |

-continued
| Ex. | Ligand L | Co-ligand CL | Ir complex Step 1: Reaction temp./Reaction time/Suspension medium Step 2: Extractant | Yield |
|---|---|---|---|---|
| $Ir(L55)_2(CL2)$ | L55 | CL2 | 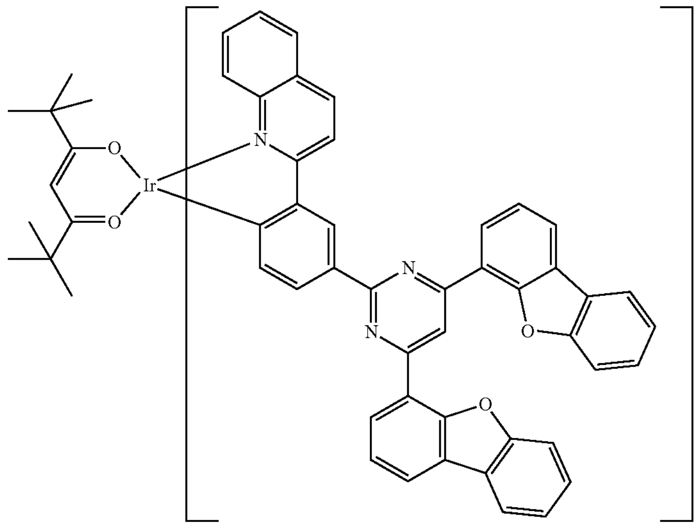 300° C./72 h/ethyl acetate toluene | 30% |
| $Ir(L67)_2(CL2)$ | L67 | CL2 | 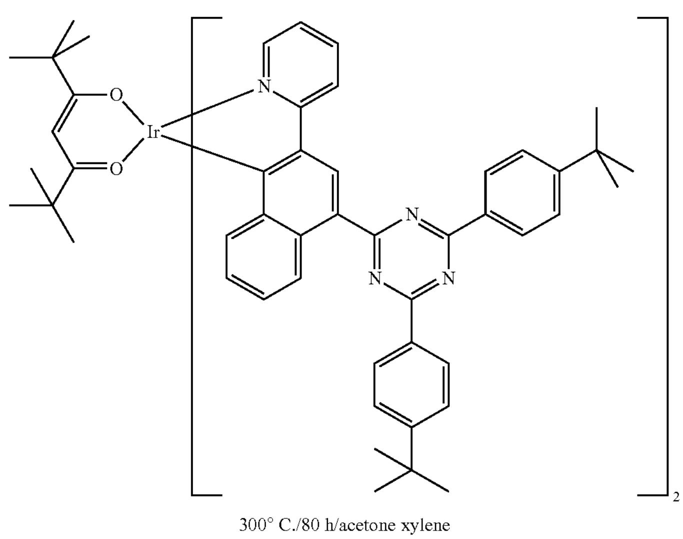 300° C./80 h/acetone xylene | 29% |

-continued
| Ex. | Ligand L | Co-ligand CL | Ir complex Step 1: Reaction temp./ Reaction time/ Suspension medium Step 2: Extractant | Yield |
|---|---|---|---|---|
| $Ir(L68)_2(CL2)$ | L68 | CL2 | 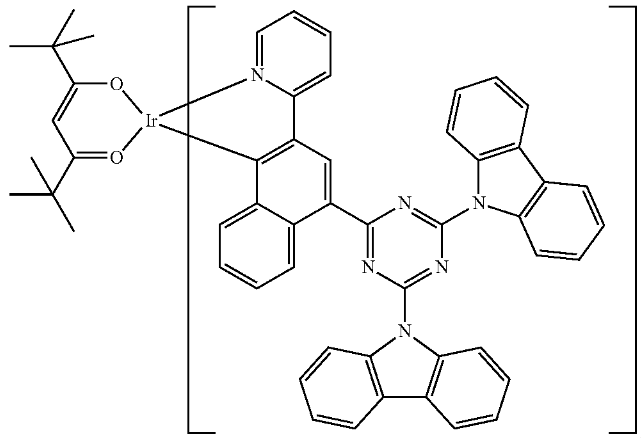 300° C./60 h/acetone xylene | 26% |
| $Ir(L80)_2(CL2)$ | L80 | CL2 | 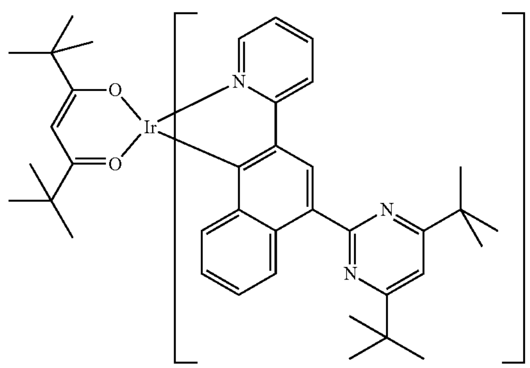 300° C./60 h/ethyl acetate mesitylene | 21% |
| $Ir(L80)_2(CL3)$ | L80 | 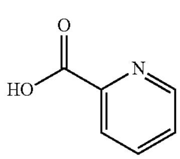 98-98-6 CL3 | 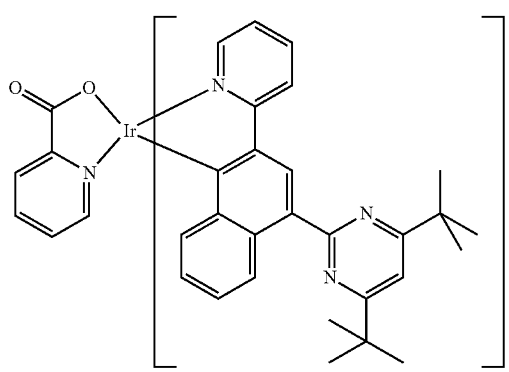 290° C./60 h/ethyl acetate mesitylene | 19% |

-continued
| Ex. | Ligand L | Co-ligand CL | Ir complex Step 1: Reaction temp./Reaction time/Suspension medium Step 2: Extractant | Yield |
|---|---|---|---|---|
| $Ir(L1)_2(CL3)$ | L1 | CL3 | 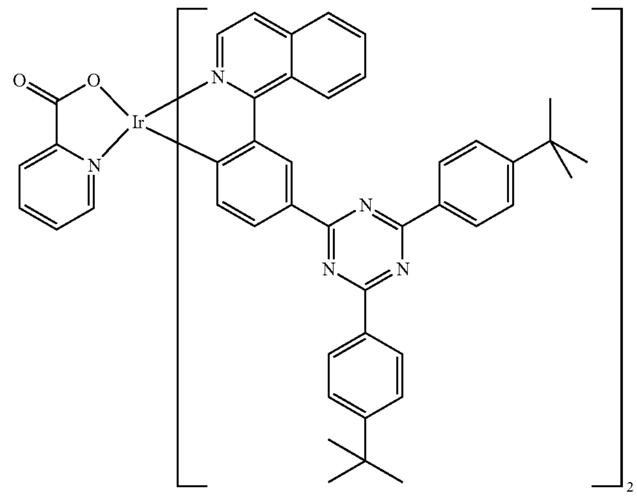 260° C./60 h/acetone toluene | 27% |
| $Ir(L10)_2(CL3)$ | L10 | CL3 | 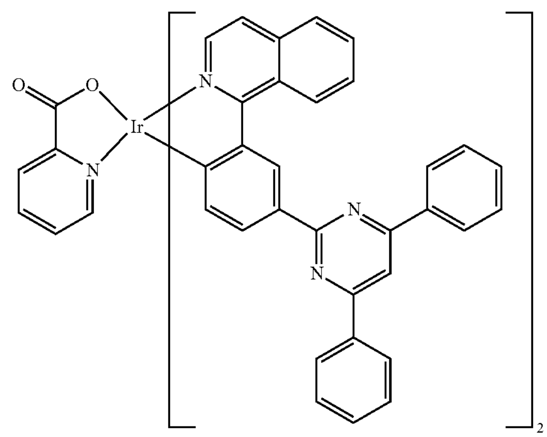 260° C./60 h/acetone xylene | 29% |
| $Ir(L39)_2(CL3)$ | L39 | CL3 | 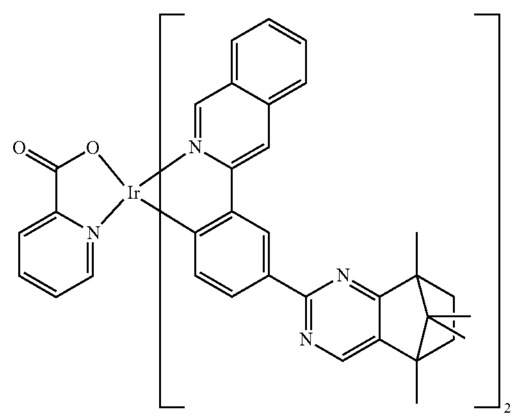 260° C./80 h/ethyl acetate xylene | 26% |

-continued
| Ex. | Ligand L | Co-ligand CL | Ir complex Step 1: Reaction temp./ Reaction time/ Suspension medium Step 2: Extractant | Yield |
| --- | --- | --- | --- | --- |
| $Ir(L52)_2(CL3)$ | L52 | CL3 | 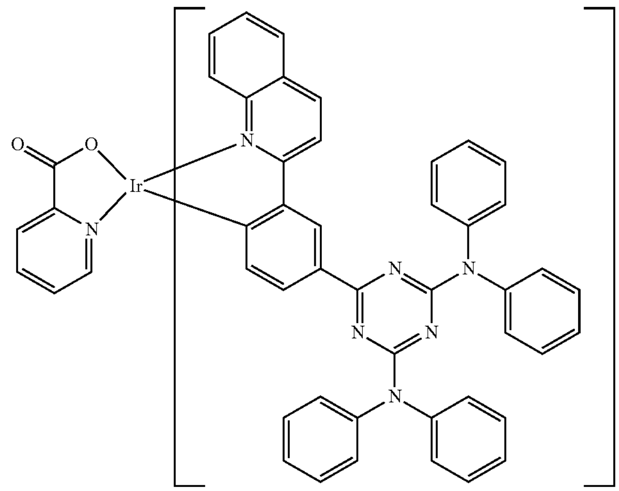 3000° C./80 h/acetone xylene | 23% |
| $Ir(L55)_2(CL4)$ | L55 | 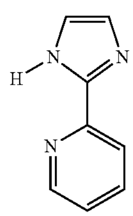 18653-75-3 CL4 | 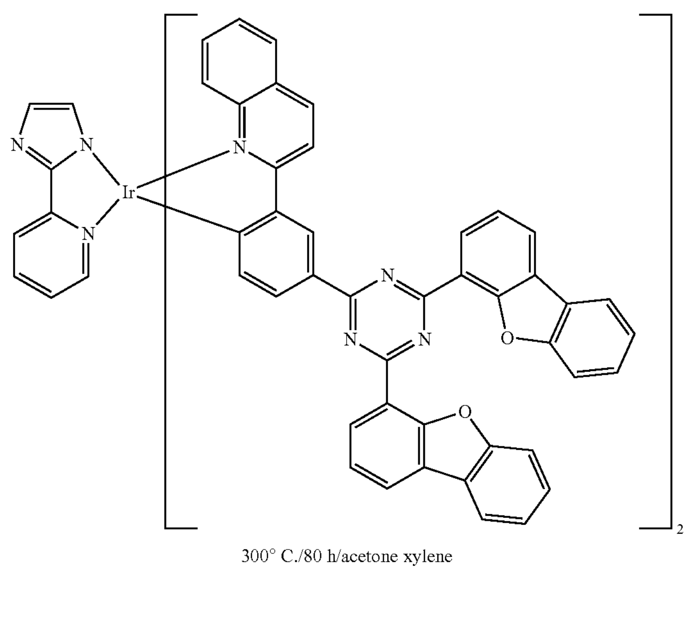 300° C./80 h/acetone xylene | 27% |

-continued

| Ex. | Ligand L | Co-ligand CL | Ir complex Step 1: Reaction temp./ Reaction time/ Suspension medium Step 2: Extractant | Yield |
|---|---|---|---|---|
| $Ir(L61)_2(CL4)$ | L61 | CL4 | 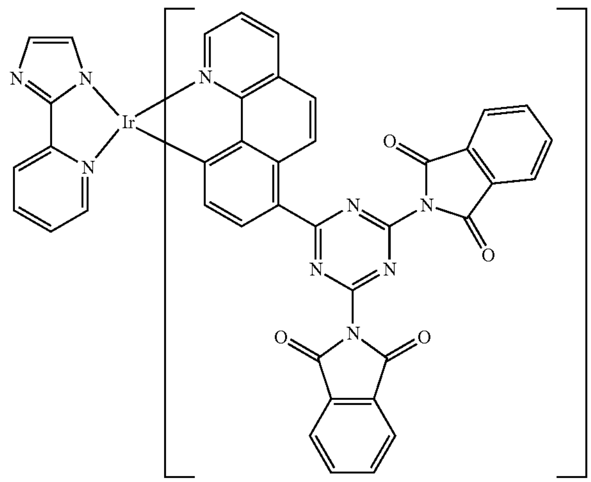 260° C./80 h/ethyl acetate mesitylene | 21% |

Variant B

Step 1:

See variant A, step 1.

Step 2:

The crude chloro dimer of the formula $[Ir(L)_2Cl]_2$ is suspended in 200 mL of THF, and to the suspension are added 20 mmol of the coligand CL, 20 mmol of silver(I) trifluoroacetate and 30 mmol of potassium carbonate, and the mixture is heated under reflux for 24 h. After cooling, the THF is removed under reduced pressure. The residue is taken up in 200 mL of a mixture of ethanol and conc. ammonia solution (1:1, v:v). The suspension is stirred at room temperature for 1 h, and the solids are filtered off with suction, washed twice with 50 mL each time of a mixture of ethanol and conc. ammonia solution (1:1, v:v) and twice with 50 mL each time of ethanol, and then dried under reduced pressure. Hot extraction and sublimation as in variant A.

| Ex. | Ligand L | Co-ligand CL | Ir complex Step 1: Reaction temp./ Reaction time/ Suspension medium Step 2: Extractant | Yield |
|---|---|---|---|---|
| $Ir(L4)_2(CL7)$ | L4 | 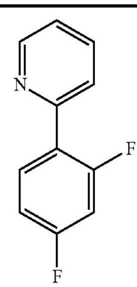 391604-55-0 CL7 | 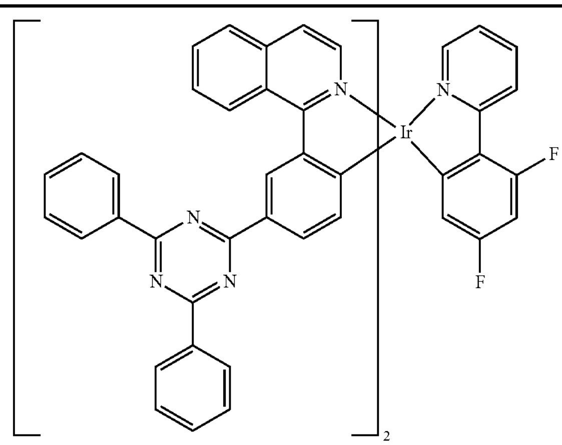 280° C./60 h/ethyl acetate toluene | 39% |

-continued

| Ex. | Ligand L | Co-ligand CL | Ir complex Step 1: Reaction temp./ Reaction time/ Suspension medium Step 2: Extractant | Yield |
|---|---|---|---|---|
| $Ir(L4)_2(CL8)$ | L4 | 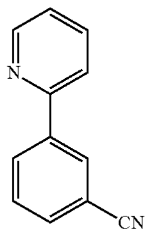 4350-51-0 CL8 | 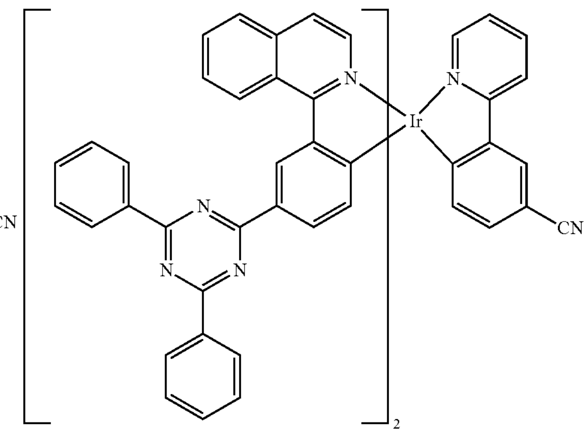 270° C./48 h/acetone xylene | 21% |

Variant C

Step 1:

See variant A, step 1.

Step 2:

The crude chloro dimer of the formula $[Ir(L)_2Cl]_2$ is suspended in 1000 mL of dichloromethane and 150 mL of ethanol, to the suspension are added 20 mmol of silver(I) trifluoromethanesulfonate, and the mixture is stirred at room temperature for 24 h. The precipitated solids (AgCl) are filtered off with suction using a short Celite bed and the filtrate is concentrated to dryness under reduced pressure. The solids thus obtained are taken up in 100 mL of ethylene glycol, 20 mmol of the coligand CL added thereto and then the mixture is stirred at 130° C. for 30 h. After cooling, the solids are filtered off with suction, washed twice with 50 mL each time of ethanol and dried under reduced pressure. Hot extraction and sublimation as in variant A.

| Ex. | Ligand L | Co-ligand CL | Ir complex Step 1: Reaction temp./ Reaction time/ Suspension medium Step 2: Extractant | Yield |
|---|---|---|---|---|
| $Ir(L47)_2(CL11)$ | L47 | 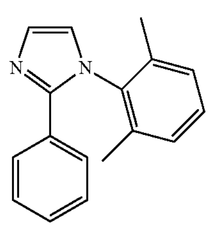 914306-48-2 CL11 | 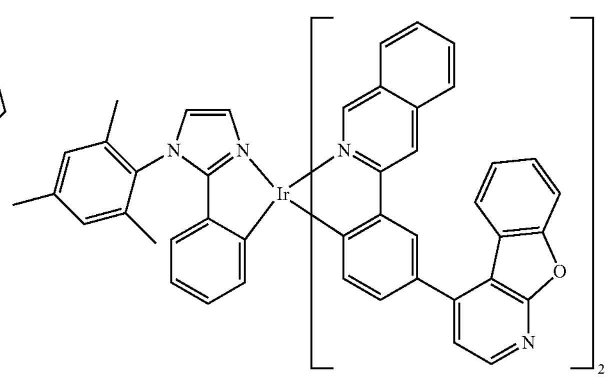 300° C./80 h/acetone xylene | 46% |

Variant E

A mixture of 10 mmol of the Ir complex $Ir(L)_2$(CL1 or CL2) and 20 mmol of the ligand L' and a glass-ensheathed magnetic stirrer bar are sealed by melting under reduced pressure ($10^{-5}$ mbar) into a 50 mL glass ampoule. The ampoule is heated at the temperature specified for the time specified, in the course of which the molten mixture is stirred with the aid of a magnetic stirrer. Further workup, purification and sublimation as described in 1) Homoleptic tris-facial iridium complexes.

| Ex. | Ir complex Ir(L)2(CL) | Ligand L' | Ir complex Step 1: Reaction temp./Reaction time/Suspension medium Step 2: Extractant | Yield |
|---|---|---|---|---|
| $Ir(L4)_2(L31)$ | $Ir(L4)_2(CL2)$ | L31 | 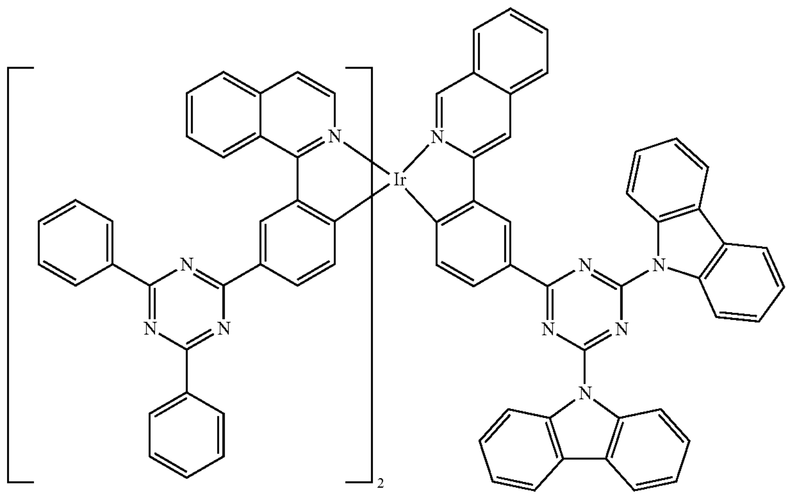 280° C./80 h/DCM mesitylene | 39% |
| $Ir(L8)_2(L30)$ | $Ir(L8)_2(CL3)$ | L30 | 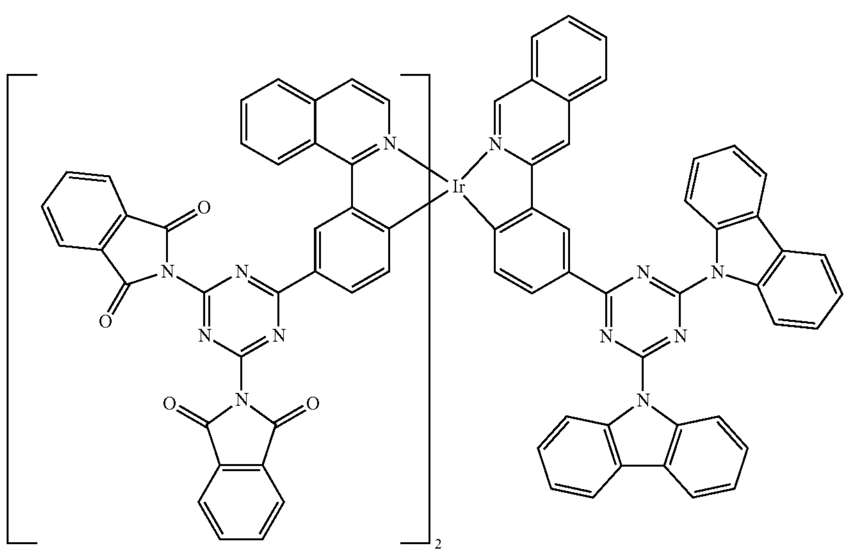 300° C./70 h/DCM mesitylene | 43% |

Physical Properties of the Compounds and Organic Electroluminescent Devices

Example 1: Photoluminescence in Solution

The complexes of the invention can be dissolved in toluene. The characteristic data of photoluminescence spectra of toluenic solutions of the complexes from table 1 are listed in table 2. This involves using solutions having a concentration of about 1 mg/mL and conducting the optical excitation in the local absorption maximum (at about 450 nm).

TABLE 1

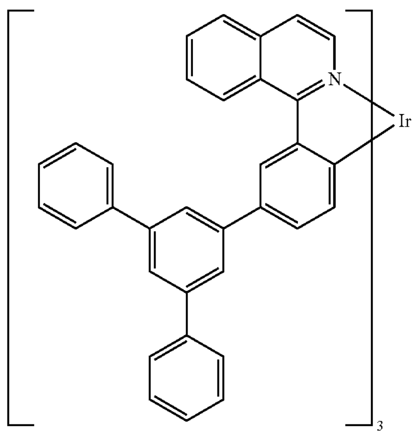

V1

WO 2011/032626

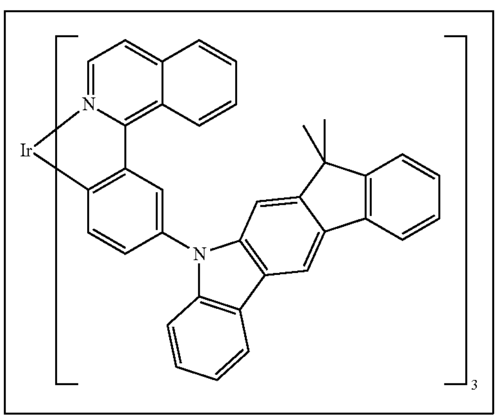

V2

[1346011-00-4]

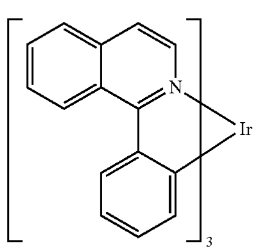

V3

[435293-93-9]

TABLE 1-continued
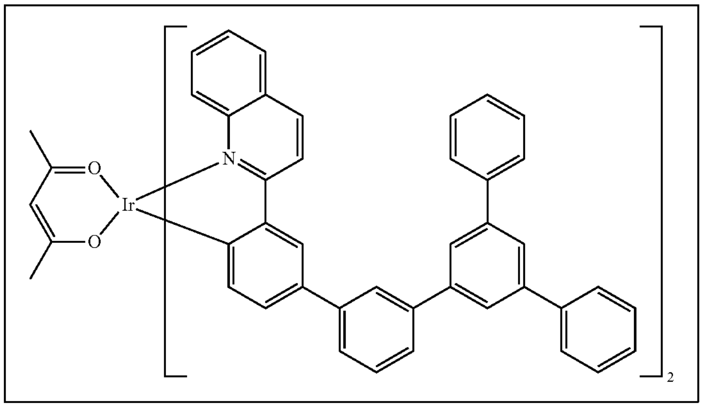
V4
WO 2011/032626
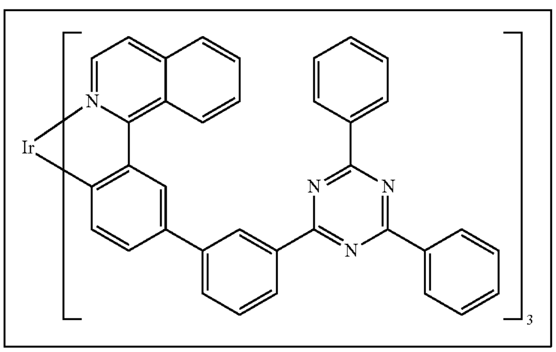
V5
WO 2011/032626
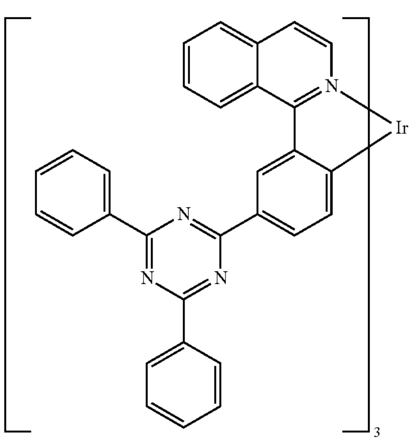
$Ir(L3)_3$ TABLE 1-continued
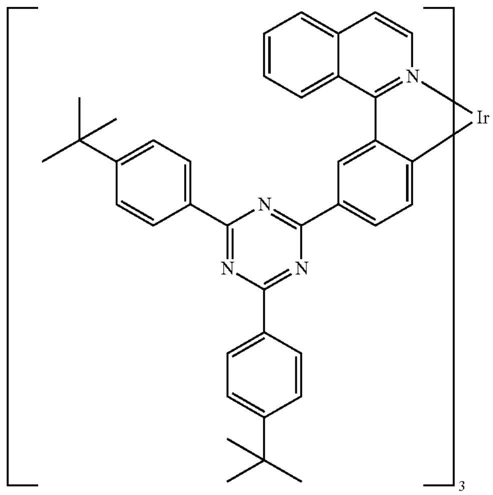
Ir(L1)$_3$
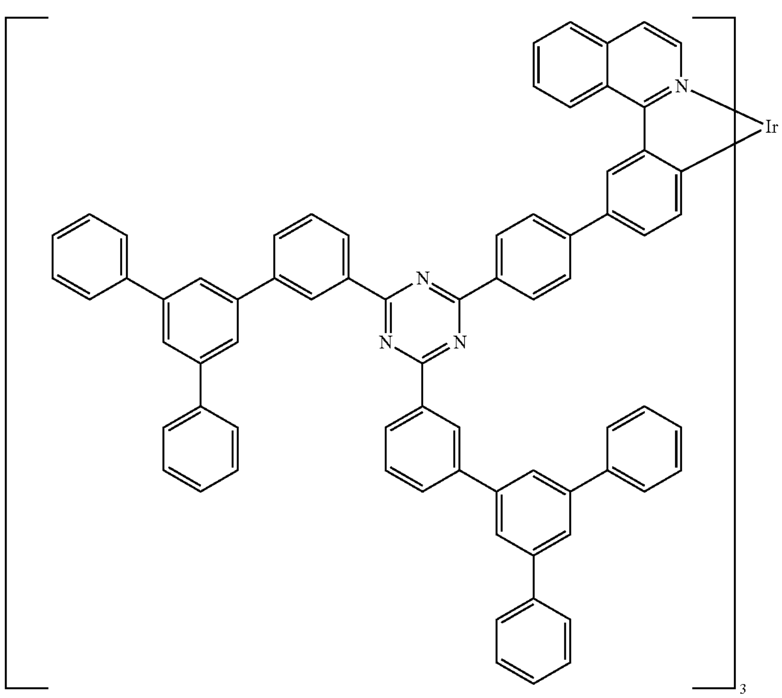
Ir(L74)$_3$ TABLE 1-continued Ir(L27)$_3$

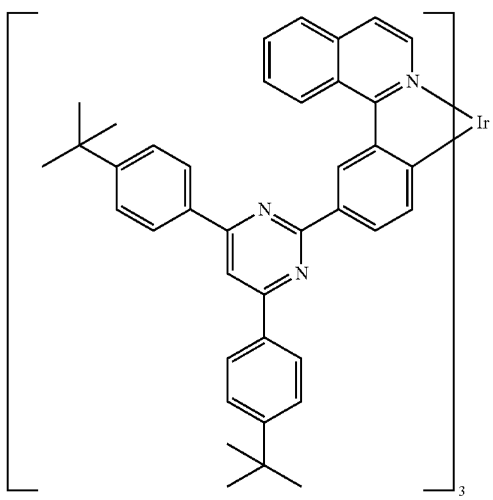

Structures of complexes of the invention and of corresponding comparative complexes in a photoluminescence study. The numbers in square brackets indicate the corresponding CAS number. The synthesis of complexes having no CAS number is described in the patent applications cited.

TABLE 2

Characteristic photoluminescence data

| | Emission max. (nm) |
|---|---|
| V1 | 621 |
| V2 | 618 |
| V3 | 618 |
| V4 | 598 |
| V5 | 619 |
| Ir(L3)$_3$ | 596 |
| Ir(L1)$_3$ | 600 |
| Ir(L74)$_3$ | 617 |
| Ir(L27)$_3$ | 612 |

The complexes of the invention can be processed from solution. By contrast, the unsubstituted comparative complex V3 is so insoluble in standard solvents for OLED production that it is not possible to produce any comparative components therewith.

Example 2: Production of the OLEDs

The complexes of the invention can be processed from solution and lead, compared to vacuum-processed OLEDs, to much more easily producible OLEDs having properties that are nevertheless good. There are already many descriptions of the production of completely solution-based OLEDs in the literature, for example in WO 2004/037887. There have likewise been many previous descriptions of the production of vacuum-based OLEDs, including in WO 2004/058911. In the examples discussed hereinafter, layers applied in a solution-based and vacuum-based manner are combined within an OLED, and so the processing up to and including the emission layer is effected from solution and in the subsequent layers (hole blocker layer and electron transport layer) from vacuum. For this purpose, the previously described general methods are matched to the circumstances described here (layer thickness variation, materials) and combined as follows:

The structure is as follows:

substrate,

ITO (50 nm),

PEDOT:PSS (60 nm), hole transport layer (HTL) (20 nm), emission layer (EML) (60 nm), hole blocker layer (HBL) (10 nm)

electron transport layer (ETL) (40 nm), cathode.

Substrates used are glass plates coated with structured ITO (indium tin oxide) of thickness 50 nm. For better processing, they are coated with PEDOT:PSS (poly(3,4-ethylenedioxy-2,5-thiophene) polystyrenesulfonate, purchased from Heraeus Precious Metals GmbH & Co. KG, Germany). PEDOT:PSS is spun on from water under air and subsequently baked under air at 180° C. for 10 minutes in order to remove residual water. The interlayer and the emission layer are applied to these coated glass plates. The hole transport layer used is crosslinkable. A polymer of the structure shown below is used, which can be synthesized according to WO 2010/097155.

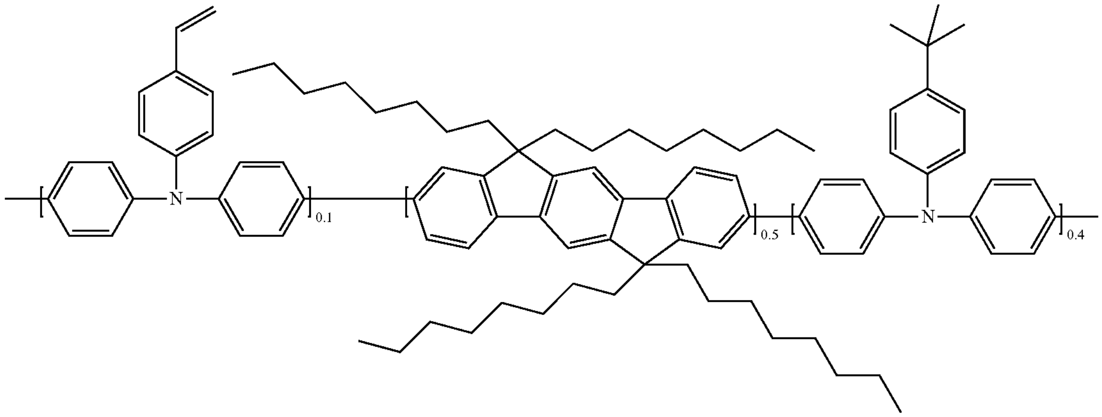

The hole transport polymer is dissolved in toluene. The typical solids content of such solutions is about 5 g/L when, as here, the layer thickness of 20 nm which is typical of a device is to be achieved by means of spin-coating. The layers are spun on in an inert gas atmosphere, argon in the present case, and baked at 180° C. for 60 minutes.

The emission layer is always composed of at least one matrix material (host material) and an emitting dopant (emitter). In addition, mixtures of a plurality of matrix materials and co-dopants may occur. Details given in such a form as TMM-A (92%):dopant (8%) mean here that the material TMM-A is present in the emission layer in a proportion by weight of 92% and dopant in a proportion by weight of 8%. The mixture for the emission layer is dissolved in toluene or optionally chlorobenzene. The typical solids content of such solutions is about 18 g/L when, as here, the layer thickness of 60 nm which is typical of a device is to be achieved by means of spin-coating. The layers are spun on in an inert gas atmosphere, argon in the present case, and baked at 160° C. for 10 minutes. The materials used in the present case are shown in Table 3.

TABLE 3

| EML materials used |
|---|
| TMM-A 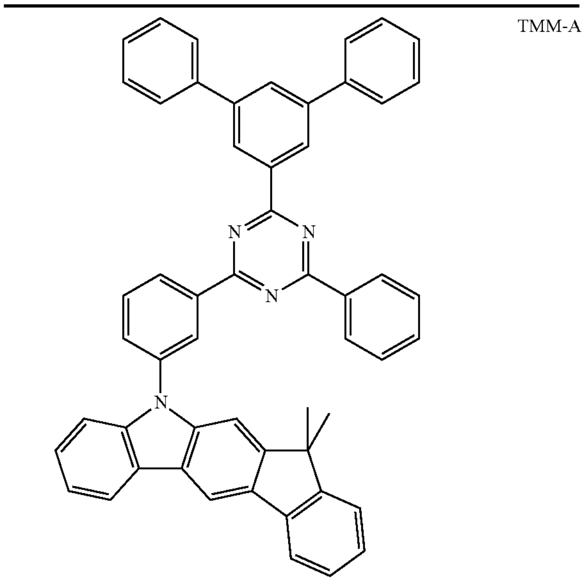 |

TABLE 3-continued

| EML materials used |
|---|
| TMM-B 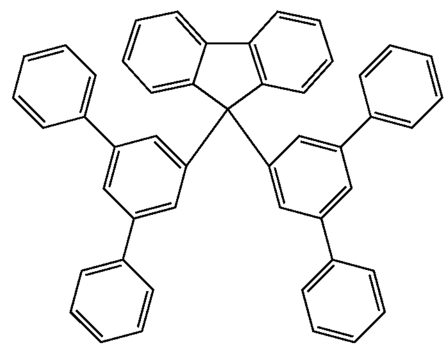 |
| Co-dopant C 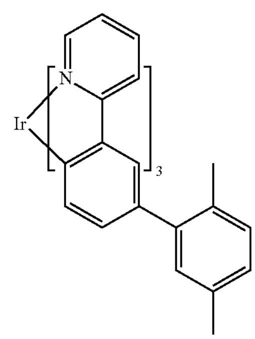 |

The materials for the hole blocker layer and electron transport layer are applied by thermal vapor deposition in a vacuum chamber. The electron transport layer, for example, may consist of more than one material, the materials being added to one another by co-evaporation in a particular proportion by volume. Details given in such a form as ETM1:ETM2 (50%:50%) mean here that the ETM1 and ETM2 materials are present in the layer in a proportion by volume of 50% each. The materials used in the present case are shown in Table 4.

TABLE 4

| HBL and ETL materials used | |
|---|---|
| 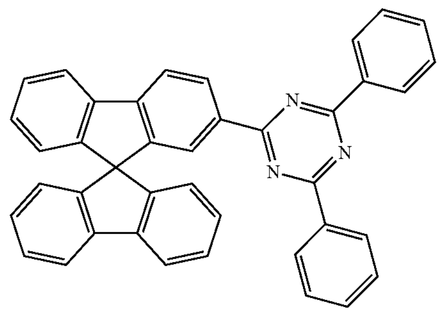 [SMILES: c1ccc(-c2nc(-c3ccccc3)nc(-c3ccc4c(c3)C3(c5ccccc5-c5ccccc53)c3ccccc3-4)n2)cc1] | ETM1 |
| 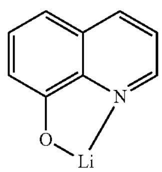 | ETM2 |

The cathode is formed by the thermal evaporation of a 100 nm aluminum layer. The OLEDs are characterized in a standard manner. For this purpose, the electroluminescence spectra, current-voltage-luminance characteristics (IUL characteristics) assuming Lambertian radiation characteristics and the (operating) lifetime are determined. The IUL characteristics are used to determine parameters such as the operating voltage (in V) and the efficiency (cd/A) at a particular brightness. The electroluminescence spectra are measured at a luminance of 1000 cd/m$^2$, and the CIE 1931 x and y color coordinates are calculated therefrom. LD80 @ 8000 cd/m2 is the lifetime until the OLED, given a starting brightness of 8000 cd/m$^2$, has dropped to 80% of the starting intensity, i.e. to 6400 cd/m$^2$.

The data for OLEDs having an EML composed of TMM-A, TMM-B and dopant D (according to table 1) are shown in table 5. In this case, ETM-1 is used as HBL and ETM1: ETM2 (50%:50%) as ETL.

TABLE 5

Results for solution-processed OLEDs with EML mixtures of the x % TMM-A, (100 − x − y)% TMM-B, y % dopant D type

| Dopant | | % | Efficiency at 1000 cd/m$^2$ | Voltage at 1000 cd/m$^2$ | CIE x/y at 1000 cd/m$^2$ | | LD80 at 8000 cd/m$^2$ |
|---|---|---|---|---|---|---|---|
| D | % D | TMM-A | cd/A | [V] | x | y | [h] |
| V2 | 6 | 40 | 6.9 | 9.8 | 0.67 | 0.33 | 2 |
| Ir(L3)$_3$ | 6 | 40 | 10.9 | 8.1 | 0.63 | 0.37 | 2 |

The data for OLEDs having an EML composed of 30% TMM-A, 34% TMM-B, 30% co-dopant C and 6% dopant D (according to table 1) are shown in table 6. In this case, ETM-1 was used as HBL and ETM1:ETM2 (50%:50%) as ETL.

TABLE 6

Results for solution-processed OLEDs with EML mixtures of the 30% TMM-A, 34% TMM-B, 30% co-dopant C, 6% dopant D type

| Dopant | Efficiency at 1000 cd/m$^2$ | Voltage at 1000 cd/m$^2$ | CIE x/y at 1000 cd/m$^2$ | | LD80 at 8000 cd/m$^2$ |
|---|---|---|---|---|---|
| D | cd/A | [V] | x | y | [h] |
| V1 | 13.1 | 5.7 | 0.66 | 0.34 | 382 |
| V2 | 14.0 | 6.7 | 0.65 | 0.35 | 467 |
| V4 | 21.2 | 7.4 | 0.62 | 0.38 | 24 |
| V5 | 13.7 | 6.1 | 0.65 | 0.35 | 311 |
| Ir(L3)$_3$ | 25.3 | 6.0 | 0.61 | 0.39 | 704 |

The invention claimed is:

1. A compound of formula (1)

$$Ir(L)_n(L')_m \tag{1}$$

comprising a substructure M(L)$_n$ of one of formula (8) or (9):

Formula (8)

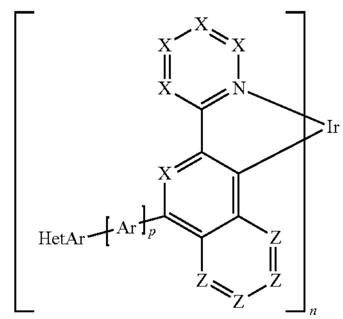

Formula (9)

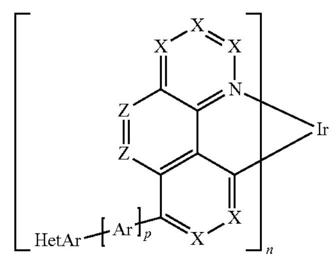

wherein

HetAr is a group of formula (HetAr):

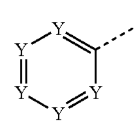

(HetAr)

wherein the dotted bond indicates the bond of this group to the ligand or to Ar;

Y is the same or different in each instance and is CR$^2$ or N, with the proviso that at least two and at most three Y groups are N and that not more than two nitrogen atoms are bonded directly to one another;

X in each instance is CR$^1$ or N, with the proviso that not more than two X groups per cycle are N or two X groups bonded directly to one another are a group of formula (3) or two adjacent X groups on the two different cycles are a group of formula (4):

Formula (3)

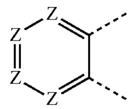

Formula (4)

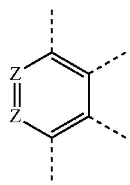

wherein the dotted bonds indicate the linkage of this group in the ligand;

Z in each instance is $CR^1$ or N, with the proviso that not more than two Z groups are N;

Ar is a para-phenylene group optionally substituted by one or more $R^1$ radicals;

$R^1$ in the substructure comprising formula (8) or (9) is the same or different in each instance and is H, D, Cl, Br, I, $N(R^3)_2$, CN, $NO_2$, OH, COOH, $C(=O)N(R^3)_2$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy, or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which is optionally substituted by one or more $R^3$ radicals, wherein one or more nonadjacent $CH_2$ groups are optionally replaced by $R^3C{=}CR^3$, C≡C, $Si(R^3)_2$, C=O, $NR^3$, O, S, or $CONR^3$ and wherein one or more hydrogen atoms are optionally replaced by D, Cl, Br, I, or CN, an aromatic or heteroaromatic ring system having 5 to 60 aromatic ring atoms and is optionally substituted by one or more $R^3$ radicals, an aryloxy or heteroaryloxy group having 5 to 40 aromatic ring atoms and is optionally substituted by one or more $R^3$ radicals, an aralkyl or heteroaralkyl group having 5 to 40 aromatic ring atoms and is optionally substituted by one or more $R^3$ radicals, or a diarylamino group, diheteroarylamino group, or arylheteroarylamino group having 10 to 40 aromatic ring atoms and is optionally substituted by one or more $R^3$ radicals; and wherein, two adjacent $R^1$ radicals or two adjacent $R^2$ radicals together optionally define a mono- or polycyclic, aliphatic, aromatic, or heteroaromatic ring system;

$R^2$ is the same or different in each instance and is H, D, F, Cl, Br, I, $N(R^3)_2$, CN, $NO_2$, OH, COOH, $C(=O)N(R^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy, or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which is optionally substituted by one or more $R^3$ radicals, wherein one or more nonadjacent $CH_2$ groups are optionally replaced by $R^3C{=}CR^3$, $Si(R^3)_2$, C=O, $NR^3$, O, S, or $CONR^3$ and wherein one or more hydrogen atoms are optionally replaced by D, F, Cl, Br, I, or CN, an aromatic or heteroaromatic ring system having 5 to 60 aromatic ring atoms and is optionally substituted by one or more $R^3$ radicals, an aryloxy or heteroaryloxy group having 5 to 40 aromatic ring atoms and is optionally substituted by one or more $R^3$ radicals, an aralkyl or heteroaralkyl group having 5 to 40 aromatic ring atoms and is optionally substituted by one or more $R^3$ radicals, or a diarylamino group, diheteroarylamino group, or arylheteroarylamino group having 10 to 40 aromatic ring atoms and is optionally substituted by one or more $R^3$ radicals; and wherein, two adjacent $R^1$ radicals or two adjacent $R^2$ radicals together optionally define a mono- or polycyclic, aliphatic, aromatic, or heteroaromatic ring system;

$R^3$ is the same or different in each instance and is H, D, F, or an aliphatic, aromatic, and/or heteroaromatic group having 1 to 20 carbon atoms, wherein one or more hydrogen atoms is optionally replaced by F; and wherein two or more $R^3$ substituents together optionally define a mono- or polycyclic aliphatic ring system;

L' is the same or different in each instance and is a bidentate, monoanionic ligand, wherein L' in a compound comprising formula (8) or (9) is a monoanionic bidentate ligand bonded to the iridium via one nitrogen atom and one carbon atom or via two oxygen atoms or via two nitrogen atoms or via one nitrogen atom and one oxygen atom;

n is 1, 2, or 3;

m is (3−n);

p is 0 or 1.

2. The compound of claim 1, wherein not more than one X group per cycle is N and not more than one Z group is N.

3. The compound of claim 1, wherein the substructure $M(L)_n$ is selected from the group consisting of formulae (8a) and (9a):

Formula (8a)

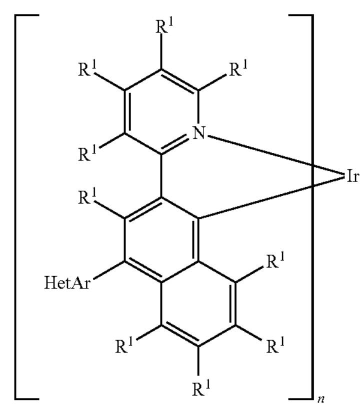

Formula (9a)

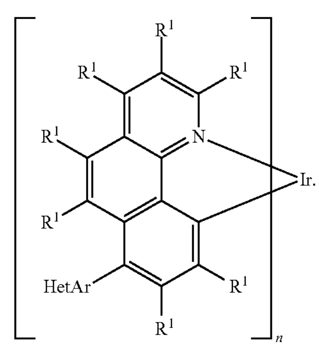

4. The compound of claim 1, wherein, in compounds containing a substructure of formula (8), n=2 and L' is a non-ortho-metalated ligand and, in compounds containing a substructure of formula (9), n=3 or n=2 and L' is an ortho-metalated ligand.

5. The compound of claim 4, wherein L' is a diketonate.

6. The compound of claim 3, wherein, in compounds containing a substructure of (8a), n=2 and L' is a non-ortho-metalated ligand and, in compounds containing a substructure of formula (9a), n=3 or n=2 and L' is an ortho-metalated ligand.

7. The compound of claim 6, wherein L' is a diketonate.

8. The compound of claim 1, wherein (HetAr) is selected from the group consisting of groups of formulae (HetAr-1) through (HetAr-4):

(HetAr-1)

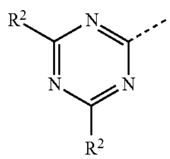

(HetAr-2)

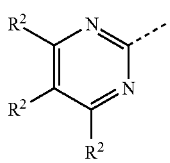

(HetAr-3)

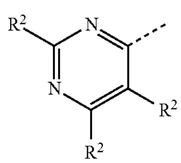

(HetAr-4)

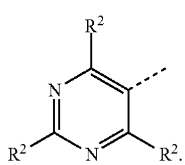

9. The compound of claim 1, wherein the $R^2$ radicals are the same or different in each instance and are selected from the group consisting of H, D, or an aromatic or heteroaromatic ring system having 6 to 24 aromatic ring atoms, which are optionally substituted by one or more $R^3$ radicals.

10. The compound of claim 1, wherein (HetAr) is selected from the group consisting of groups of formulae (HetAr-1a) through (HetAr-4a):

(HetAr-1a)

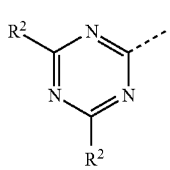

(HetAr-2a)

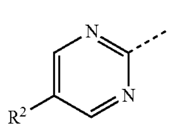

-continued (HetAr-2b)

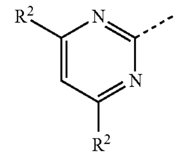

(HetAr-3a)

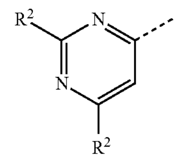

(HetAr-4a)

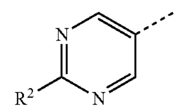

wherein $R^2$ is the same or different in each instance and is an aromatic or heteroaromatic ring system having 6 to 24 aromatic ring atoms, which are optionally substituted by one or more $R^3$ radicals.

11. The compound of claim 1, wherein the $R^1$ radicals are the same or different in each instance and are selected from the group consisting of H, D, F, $N(R^3)_2$, CN, $B(OR^3)_2$, $C(=O)R^3$, a straight-chain alkyl group having 1 to 10 carbon atoms or an alkenyl group having 2 to 10 carbon atoms or a branched or cyclic alkyl group having 3 to 10 carbon atoms, each of which is optionally substituted by one or more $R^3$ radicals, wherein one or more hydrogen atoms are optionally replaced by D or F, or an aromatic or heteroaromatic ring system having 5 to 30 aromatic ring atoms, which are optionally substituted by one or more $R^3$ radicals; and wherein two adjacent $R^1$ radicals together optionally define a mono- or polycyclic, aliphatic or aromatic ring system.

12. A process for preparing the compound of claim 1 comprising (1) reacting said compound with a HetAr-Hal group, wherein said compound has a reactive leaving group rather than the HetAr group and wherein Hal is F, Cl, Br, or I or (2) reacting the free ligands 1 and optionally L' with an iridium alkoxide of formula (40), an iridium ketoketonate of formula (41), an iridium halide of formula (42), a dimeric iridium complex of formula (43), an iridium complex of formula (44), or an iridium compound bearing both alkoxide and/or halide and/or hydroxyl radicals and ketoketonate radicals:

Formula (40)

$$Ir(OR^1)_n$$

Formula (41)

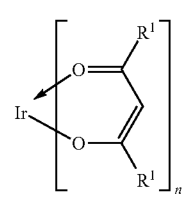

Formula (42)

$$IrHal_n$$

Formula (43)

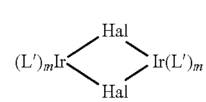

-continued

Formula (44)

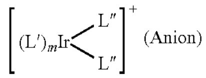

wherein Hal=F, Cl, Br, or I, L" is an alcohol or a nitrile, and (Anion) is a non-coordinating anion.

13. A formulation comprising at least one compound of claim 1 and at least one solvent and/or a further organic or inorganic compound.

14. An electronic device comprising at least one compound of claim 1.

15. The electronic device of claim 14, wherein the electronic device is an organic electroluminescent device and the compound is used as emitting compound in one or more emitting layers.

16. A compound of formula (1)

$$Ir(L)_n(L')_m \quad (1)$$

comprising a substructure $M(L)_n$ of one of formula (5), (6), (7a)':

Formula (5)

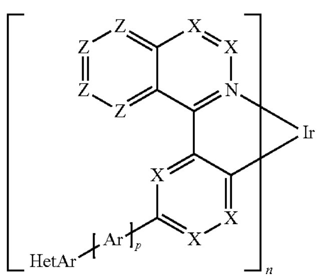

Formula (6)

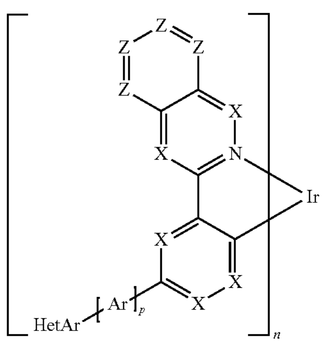

Formula (7a)'

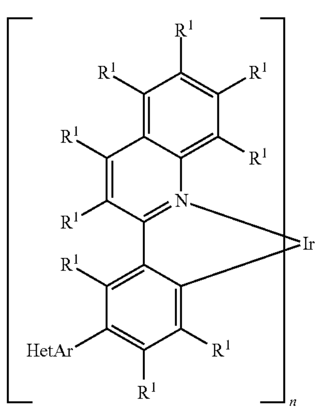

wherein

HetAr is a group of formula (HetAr):

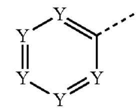

(HetAr)

wherein the dotted bond indicates the bond of this group to the ligand or to Ar;

Y is the same or different in each instance and is $CR^2$ or N, with the proviso that at least two and at most three Y groups are N and that not more than two nitrogen atoms are bonded directly to one another;

X in each instance is $CR^1$ or N, with the proviso that not more than two X groups per cycle are N or two X groups bonded directly to one another are a group of formula (3) or two adjacent X groups on the two different cycles are a group of formula (4):

Formula (3)

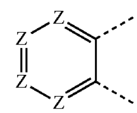

Formula (4)

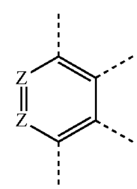

wherein the dotted bonds indicate the linkage of this group in the ligand;

Z in each instance is $CR^1$ or N, with the proviso that not more than two Z groups are N;

Ar is a para-phenylene group optionally substituted by one or more $R^1$ radicals;

$R^1$ in the substructure comprising formula (5), (6) is the same or different in each instance and is H, D, Cl, Br, I, $N(R^3)_2$, CN, $NO_2$, OH, COOH, $C(=O)N(R^3)_2$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy, or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which is optionally substituted by one or more $R^3$ radicals, wherein one or more nonadjacent $CH_2$ groups are optionally replaced by $R^3C{=}CR^3$, C≡C, $Si(R^3)_2$, C=O, $NR^3$, O, S, or $CONR^3$ and wherein one or more hydrogen atoms are optionally replaced by D, F, Cl, Br, I, or CN, an aromatic or heteroaromatic ring system having 5 to 60 aromatic ring atoms and is optionally substituted by one or more $R^3$ radicals, an aryloxy or heteroaryloxy group having 5 to 40 aromatic ring atoms and is optionally substituted by one or more $R^3$ radicals, an aralkyl or heteroaralkyl group having 5 to 40 aromatic ring atoms and is optionally substituted by one or more $R^3$ radicals, or a diarylamino group, diheteroarylamino group, or arylheteroarylamino group having 10 to 40 aromatic ring atoms and is optionally substituted by one or more $R^3$ radicals; and wherein, two adjacent $R^1$ radicals or two adjacent $R^2$ radicals together optionally define a mono- or polycyclic, aliphatic, aromatic, or heteroaromatic ring system;

$R^1$ in the substructure comprising formula (7a)' is the same or different in each instance and is H, D, Cl, Br, I, $N(R^3)_2$, CN, $NO_2$, OH, COOH, $C(=O)N(R^3)_2$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy, or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which is optionally substituted by one or more $R^3$ radicals, wherein one or more nonadjacent $CH_2$ groups are optionally replaced by $R^3C{=}CR^3$, C≡C, $Si(R^3)_2$, C=O, $NR^3$, O, S, or $CONR^3$ and wherein one or more hydrogen atoms are optionally replaced by D, F, Cl, Br, I, or CN, an aromatic or heteroaromatic ring system having 5 to 60 aromatic ring atoms and is optionally substituted by one or more $R^3$ radicals, an aryloxy or heteroaryloxy group having 5 to 40 aromatic ring atoms and is optionally substituted by one or more $R^3$ radicals, an aralkyl or heteroaralkyl group having 5 to 40 aromatic ring atoms and is optionally substituted by one or more $R^3$ radicals, or a diarylamino group, diheteroarylamino group, or arylheteroarylamino group having 10 to 40 aromatic ring atoms and is optionally substituted by one or more $R^3$ radicals;

$R^2$ is the same or different in each instance and is H, D, F, Cl, Br, I, $N(R^3)_2$, CN, $NO_2$, OH, COOH, $C(=O)N(R^3)_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy, or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, each of which is optionally substituted by one or more $R^3$ radicals, wherein one or more nonadjacent $CH_2$ groups are optionally replaced by $R^3C{=}CR^3$, C≡C, $Si(R^3)_2$, C=O, $NR^3$, O, S, or $CONR^3$ and wherein one or more hydrogen atoms are optionally replaced by D, F, Cl, Br, I, or CN, an aromatic ring system having 5 to 60 aromatic ring atoms consisting of 6 to 60 carbon atoms in the ring system and is optionally substituted by one or more $R^3$ radicals, an aryloxy or heteroaryloxy group having 5 to 40 aromatic ring atoms and is optionally substituted by one or more $R^3$ radicals, or an aralkyl group having 5 to 40 aromatic ring atoms and is optionally substituted by one or more $R^3$ radicals; and wherein, two adjacent $R^2$ radicals together optionally define a mono- or polycyclic, aliphatic, or aromatic, ring system;

$R^3$ is the same or different in each instance and is H, D, F, or an aliphatic, and/or aromatic group having 1 to 20 carbon atoms, wherein one or more hydrogen atoms is optionally replaced by F; and wherein two or more $R^3$ substituents together optionally define a mono- or polycyclic aliphatic ring system;

L' is the same or different in each instance and is a bidentate, monoanionic ligand, wherein L' in a compound comprising formula (5) is a bidentate, monoanionic ligand bonded to the iridium via two oxygen atoms or via two nitrogen atoms or via one nitrogen atom and one oxygen atom, and wherein L' in a compound comprising formula (6), or (7a)' is a monoanionic bidentate ligand bonded to the iridium via one nitrogen atom and one carbon atom or via two oxygen atoms or via two nitrogen atoms or via one nitrogen atom and one oxygen atom;

n is 1, 2, or 3;

m is (3−n);

p is 0 or 1 in formula (6), (7a)', and p is 1 in formula (5).

17. The compound of claim 16, wherein the $R^2$ radicals are the same or different in each instance and are selected from the group consisting of H, D, or an aromatic ring system having 6 to 24 aromatic ring atoms, which are optionally substituted by one or more $R^3$ radicals.

18. The compound of claim 16, wherein (HetAr) is selected from the group consisting of groups of formulae (HetAr-1a) through (HetAr-4a):

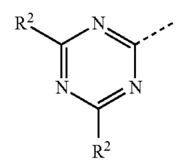

(HetAr-1a)

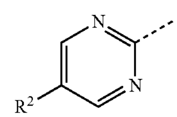

(HetAr-2a)

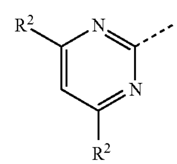

(HetAr-2b)

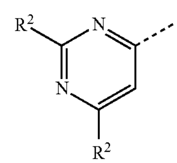

(HetAr-3a)

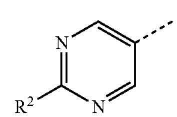

(HetAr-4a)

wherein $R^1$ is the same or different in each instance and is an aromatic ring system having 6 to 24 aromatic ring atoms, which are optionally substituted by one or more $R^3$ radicals.

* * * * *